(12) United States Patent
Hong et al.

(10) Patent No.: US 11,974,461 B2
(45) Date of Patent: Apr. 30, 2024

(54) DISPLAY APPARATUS

(71) Applicant: Samsung Display Co., Ltd., Yongin-si (KR)

(72) Inventors: Sungjin Hong, Yongin-si (KR); Yoomin Ko, Yongin-si (KR); Joohee Jeon, Yongin-si (KR); Sunho Kim, Yongin-si (KR); Cheaeun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 464 days.

(21) Appl. No.: 17/380,991

(22) Filed: Jul. 20, 2021

(65) Prior Publication Data

US 2022/0093697 A1 Mar. 24, 2022

(30) Foreign Application Priority Data

Sep. 24, 2020 (KR) .................. 10-2020-0123993

(51) Int. Cl.
*H10K 59/121* (2023.01)
*H10K 50/86* (2023.01)
*H10K 59/131* (2023.01)
*H10K 59/38* (2023.01)
*H10K 59/65* (2023.01)

(52) U.S. Cl.
CPC ......... *H10K 59/121* (2023.02); *H10K 50/865* (2023.02); *H10K 59/131* (2023.02); *H10K 59/38* (2023.02); *H10K 59/65* (2023.02)

(58) Field of Classification Search
CPC .. H10K 59/121; H10K 50/865; H10K 59/131; H10K 59/38; H10K 59/65; H10K 59/00; H10K 77/10; H10K 50/86
See application file for complete search history.

(56) References Cited

U.S. PATENT DOCUMENTS

| | | | | |
|---|---|---|---|---|
| 11,844,237 B2* | 12/2023 | Jung | .................. | H10K 50/822 |
| 2017/0256747 A1 | 9/2017 | Lee et al. | | |
| 2021/0036090 A1 | 2/2021 | Hong et al. | | |
| 2021/0265431 A1* | 8/2021 | Yun | ..................... | H10K 59/121 |
| 2021/0367020 A1* | 11/2021 | Bok | ..................... | H10K 59/126 |
| 2022/0199720 A1* | 6/2022 | Kim | ..................... | H01L 27/1225 |

FOREIGN PATENT DOCUMENTS

| | | |
|---|---|---|
| CN | 110767709 | 2/2020 |
| CN | 110783390 | 2/2020 |
| CN | 112310170 A | 2/2021 |
| KR | 10-2017-0104097 | 9/2017 |

* cited by examiner

*Primary Examiner* — Thanh Y. Tran

(74) *Attorney, Agent, or Firm* — Lewis Roca Rothgerber Christie LLP

(57) ABSTRACT

A display apparatus includes a substrate, a component area arranged over the substrate, the component area and including a first component area and a second component area, the first component area including a plurality of first pixel groups and a first transmission area arranged between the first pixel groups, the second component area including a plurality of second pixel groups and a second transmission area arranged between the second pixel groups, a main display area arranged over the substrate, the main display area including main display elements and main pixel circuits respectively connected to the main display elements, and a component arranged in the component area. A planar shape of the first transmission area may be different from a planar shape of the second transmission area.

20 Claims, 34 Drawing Sheets

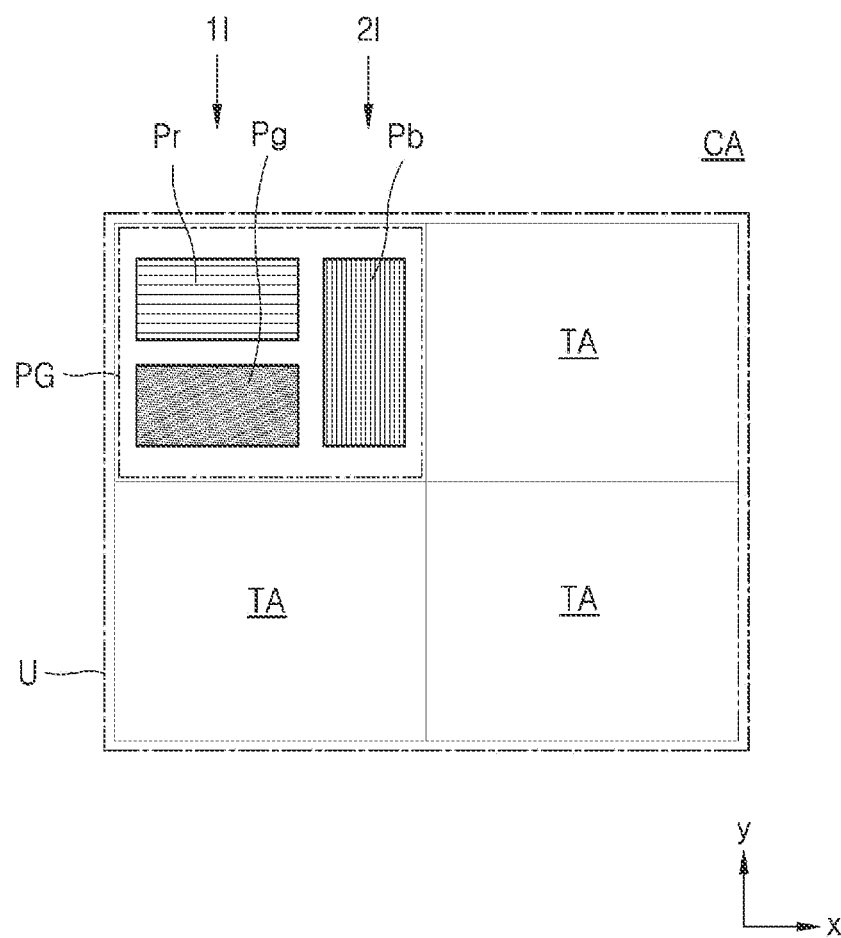

DISPLAY APPARATUS

CROSS-REFERENCE TO RELATED APPLICATION

This application claims priority to and the benefit of Korean Patent Application No. 10-2020-0123993, filed on Sep. 24, 2020, in the Korean Intellectual Property Office (KIPO), the entire disclosure of which is incorporated by reference herein.

BACKGROUND

1. Field

One or more embodiments relate to an apparatus, and more particularly, to a display apparatus.

2. Description of Related Art

Mobile electronic apparatuses are widely used. For example, small electronic apparatuses (e.g., mobile phones) and larger electronic apparatuses (e.g., tablet personal computers (PCs)) have been widely used recently.

To support various functions, a mobile electronic apparatus includes a display apparatus to provide a user with visual information such as an image. Recently, because parts for driving a display apparatus have been miniaturized, the proportion of the display apparatus in an electronic apparatus has been gradually increased. Further, a structure that may be bent by a set or predetermined angle with respect to a flat state is also under development.

SUMMARY

Generally, a display apparatus may include various components. A component may be arranged below a display panel such that an image may be displayed on a region of the display panel corresponding to the component, and thus, an image may be displayed on the entire display panel. In this case, data received by the component may be incident on or received by the component through a region between pixels of the display panel. In this case, distortion may occur. Aspects of one or more embodiments are directed towards a display apparatus in which data (e.g., accurate data) may be secured with reduced distortion of data sensed or received by a component.

Additional aspects will be set forth in part in the description which follows and, in part, will be apparent from the description, or may be learned by practice of the presented embodiments of the disclosure.

According to one or more embodiments, a display apparatus includes a substrate, a component area arranged over the substrate, the component area including a first component area and a second component area, the first component area including a plurality of first pixel groups and a first transmission area arranged between the first pixel groups, the second component area including a plurality of second pixel groups and a second transmission area arranged between the second pixel groups, wherein the plurality of first pixel groups include first auxiliary display elements and first auxiliary pixel circuits respectively connected to the first auxiliary display elements, and wherein the plurality of second pixel groups include second auxiliary display elements and second auxiliary pixel circuits respectively connected to the second auxiliary display elements, a main display area arranged over the substrate, the main display area including main display elements and main pixel circuits respectively connected to the main display elements, and a component arranged in the component area, wherein a planar shape of the first transmission area is different from a planar shape of the second transmission area.

The planar shape of the first transmission area may include a corner.

The planar shape of the second transmission area may be circular or elliptical.

The display apparatus may further include a bottom metal layer arranged over the substrate, the bottom metal layer defining the first transmission area and the second transmission area.

The bottom metal layer may include holes corresponding to the first transmission area and the second transmission area.

The first component area may be arranged inside the second component area.

The display apparatus may further include a wiring electrically connected to at least one of the first auxiliary pixel circuit or the second auxiliary pixel circuit.

The wiring may be arranged to avoid the first transmission area and the second transmission area.

The display apparatus may further include an optical functional layer arranged over the substrate, the optical functional layer defining the plurality of first pixel groups, the plurality of second pixel groups, the first transmission area, and the second transmission area.

According to one or more embodiments, a display apparatus includes a substrate, a component area arranged over the substrate, the component area including a plurality of pixel groups and a plurality of areas, the plurality of pixel groups including auxiliary display elements and auxiliary pixel circuits respectively connected to the auxiliary display elements, wherein the plurality of areas include a plurality of transmission areas arranged between the pixel groups, a main display area arranged over the substrate, the main display area including main display elements and main pixel circuits respectively connected to the main display elements, and a component arranged in the component area, wherein a shape of a transmission area from among the plurality of transmission areas is different from a shape of another transmission area from among the plurality of transmission areas.

A planar shape of each transmission area from among the plurality of transmission areas may be different depending on a distance from a center of the component.

A planar shape of a transmission area arranged at the center of the component from among the plurality of transmission areas may include a corner.

A planar shape of a transmission area from among the plurality of transmission areas may be polygonal, and a planar shape of a transmission area arranged at an outermost portion of the component area from among the plurality of transmission areas may be circular or elliptical.

An edge of a planar shape of each transmission area may increase toward an outermost portion of the component area from the center of the component.

The display apparatus may further include a wiring electrically connected to the auxiliary pixel circuits.

The wiring may be arranged to avoid the plurality of transmission areas.

The display apparatus may further include an optical functional layer arranged over the substrate, the optical functional layer defining the plurality of pixel groups and the plurality of transmission areas.

The optical functional layer may include a base layer, a color filter arranged on the base layer, and a black matrix arranged in the color filter, the black matrix corresponding to a region between the plurality of pixel groups and the plurality of transmission areas.

The plurality of transmission areas may be different in area from each other at respective positions of the component area.

The component may include a camera.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 11A-11D are arrangement views of a pixel arrangement structure in a component area of a display panel according to embodiments;

DETAILED DESCRIPTION

Figure 1:
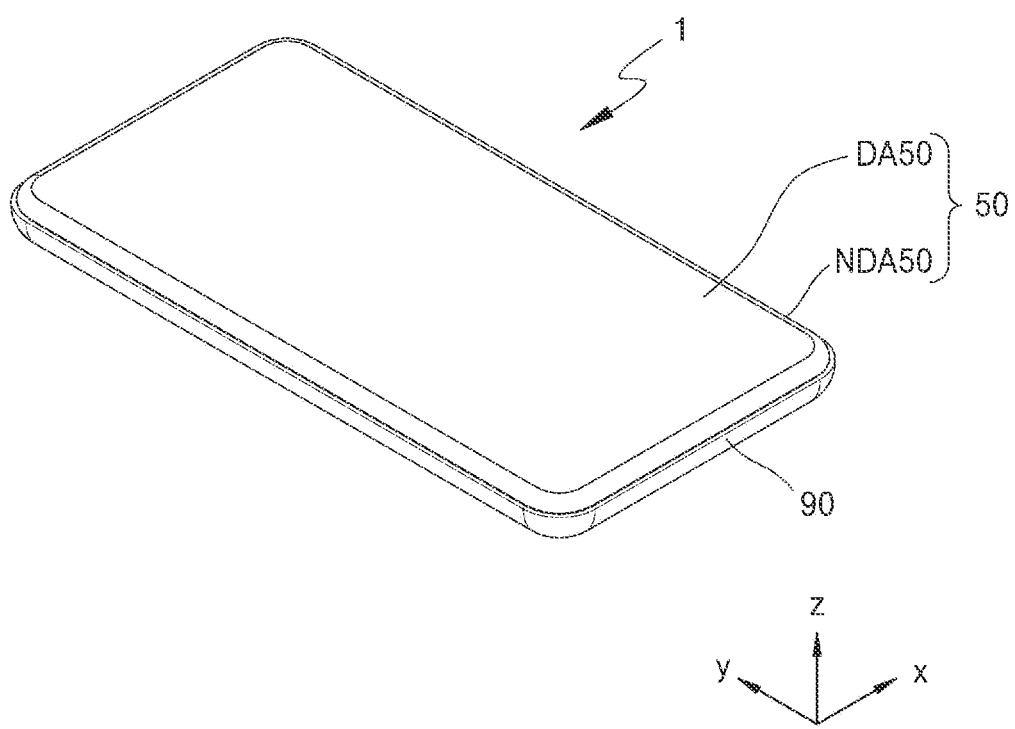
FIG. 1 is a perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

Further, the use of "may" when describing embodiments of the present disclosure refers to "one or more embodiments of the present disclosure".

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on," "connected to," or "coupled to" another layer, region, or component, it can be directly or indirectly on, connected, or coupled to the other layer, region, or component. That is, for example, intervening layers, regions, or components may be present. When an element is referred to as being "directly on," "directly connected to," or "directly coupled to" another element, there are no intervening elements present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

Figure 2:
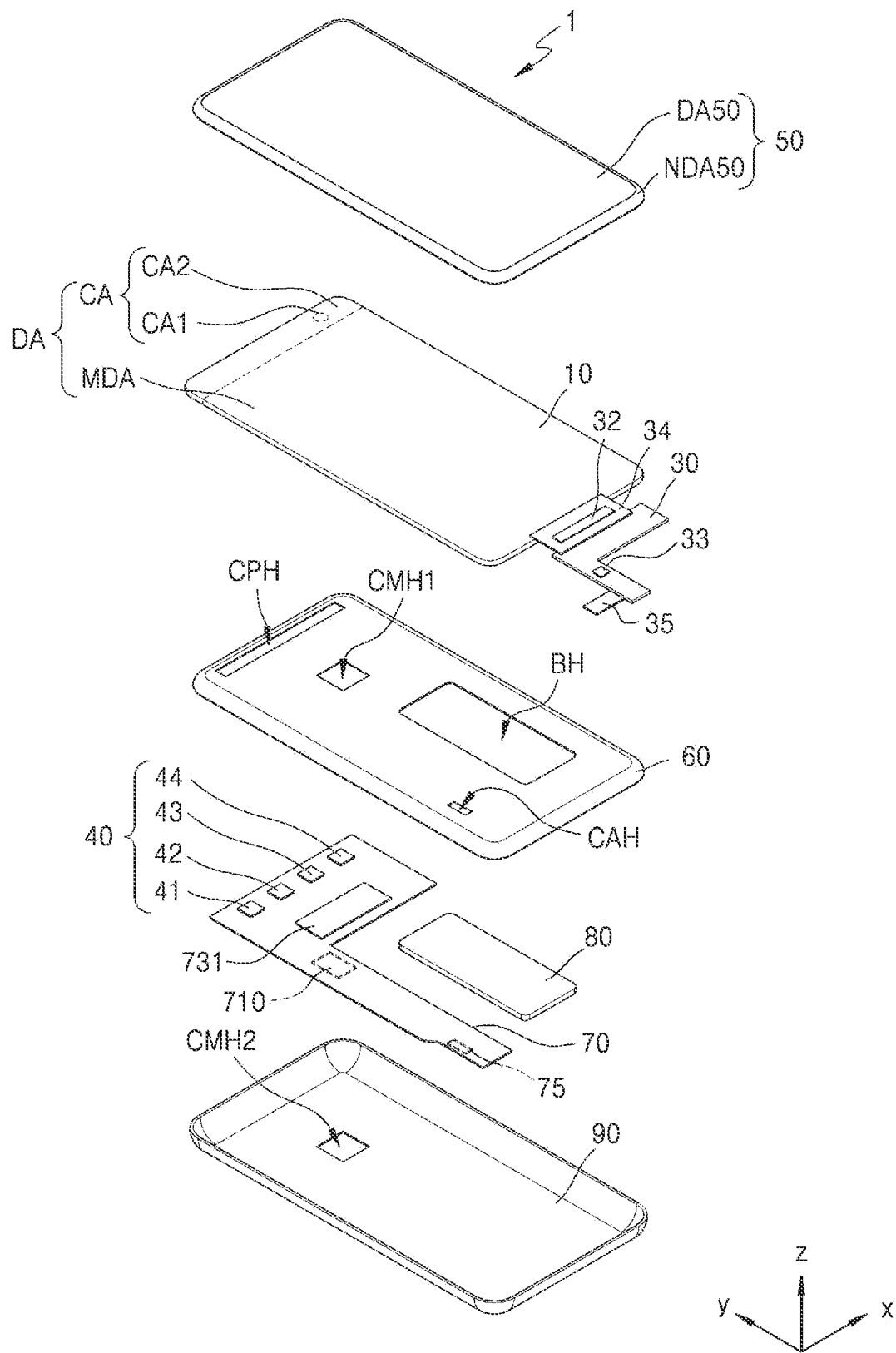
FIG. 2 is an exploded perspective view of the display apparatus shown in FIG. 1.

FIG. 1 is a perspective view of a display apparatus 1 according to an embodiment. FIG. 2 is an exploded perspective view of the display apparatus 1 shown in FIG. 1.

Referring to FIGS. 1 and 2, the display apparatus 1 may include an apparatus for displaying moving images or still images and may be used as a display screen of various suitable products including televisions, notebook computers, monitors, advertisement boards, Internet of things (IOT) as well as portable electronic apparatuses including mobile phones, smart phones, tablet personal computers (PCs), mobile communication terminals, electronic organizers, electronic books, portable multimedia players (PMPs), navigations, and/or ultra mobile personal computers (UMPCs). In addition, the display apparatus 1 may be used in wearable devices including smartwatches, watchphones, glasses-type displays, and/or head-mounted displays (HMDs). In addition, the display apparatus 1 may be used as instrument panels for automobiles, center fascias for automobiles, or center information displays (CIDs) arranged on a dashboard, room mirror displays that replace side mirrors of automobiles, and displays arranged on the backside of front seats as an entertainment for back seats of automobiles.

For convenience of description, FIGS. 1 and 2 show the display apparatus 1 according to an embodiment as a smartphone as an example. The display apparatus 1 according to an embodiment includes a cover window 50, a display panel 10, a display circuit board 30, a display driver 32, a touch sensor driver 33, a bracket 60, a main circuit board 70, a battery 80, and a bottom cover 90.

In the specification, "top" denotes a direction (e.g., a (+) z-direction) in which the cover window 50 is arranged with respect to the display panel 10, and "bottom" denotes a direction (e.g., a (−) z-direction) in which the bottom cover 90 is arranged with respect to the display panel 10. In addition, "left", "right", "up", and "down" respectively denote directions in a plan view of the display panel 10. As an example, "left" denotes a (−) x-direction, "right" denotes a (+) x-direction, "up" denotes a (+) y-direction, and "down" denotes a (−) y-direction.

The display apparatus 1 may have a rectangular shape in a plan view. As an example, the display apparatus 1 may have a rectangular planar shape having short sides in a first direction (e.g., an x-direction) and long sides in a second direction (e.g., a y-direction) as in FIG. 1. An edge where the short side in the first direction (e.g., the x-direction) meets the long side in the second direction (e.g., the y-direction) may be round at a set or preset curvature or formed at a right angle. The planar shape of the display apparatus 1 is not limited to a rectangle and may be other suitable polygonal shapes, an elliptical shape, or an irregular shape.

The cover window 50 may be arranged on the display panel 10 to cover the display panel 10. With this configuration, the cover window 50 may protect a top surface of the display panel 10.

The cover window 50 may include a transmissive cover portion DA50 and a light-blocking cover portion NDA50, the transmissive cover portion DA50 corresponding to the display panel 10, and the light-blocking cover portion NDA50 corresponding to a region other than the display panel 10. The light-blocking cover portion NDA50 may include an opaque material that blocks light. The light-blocking cover portion NDA50 may include a pattern that a user may view in the case where an image is not displayed.

The display panel 10 may be arranged under the cover window 50. The display panel 10 may overlap the transmissive cover portion DA50 of the cover window 50.

The display panel 10 may include a main display area MDA and a component area CA. Both the main display area MDA and the component area CA are regions on which an image is displayed. The component area CA may be a region below which a component 40 is arranged. The component 40 may be a sensor or a camera that uses a visible ray, an infrared ray, and/or sound. In an embodiment, the component area CA may be a region having a higher light transmittance and/or a higher sound transmittance than the main display area MDA. In an embodiment, in the case where light passes through the component area CA, a light transmittance may be 25% or more, 30% or more, more preferably, 50% or more, 75% or more, 80% or more, 85% or more, or 90% or more.

The component area CA may include a first component area CA1 and a second component area CA2. The first component area CA1 and the second component area CA2 may have various suitable shapes. As an example, the planar shape of the first component area CA1 may be circular, elliptical, polygonal, etc. In addition, the planar shape of the second component area CA2 may be circular, elliptical, polygonal, and/or a bar. In this case, the second component area CA2 may be arranged in at least a portion of the periphery of the first component area CA1. Hereinafter, for convenience of description, the case where the first component area CA1 is arranged inside the second component area CA2 is described in more detail below.

At least one of the first component area CA1 or the second component area CA2 may be provided in a plurality. In other words, one or more embodiments of the present disclosure may include at least one of a plurality of first component areas CA1 or a plurality of second component areas CA2. As an example, a plurality of first component areas CA1 may include the first component area CA1, and each first component area CA1 of the plurality of first component areas CA1 may be arranged to correspond to a component 40. In this case, only one second component area CA2 may be provided, and the respective first component areas CA1 may be spaced from (e.g., spaced apart from) each other in the second component area CA2. In another embodiment, the first component area CA1 and the second component area CA2 may each be provided in a plurality. In this case, each first component area CA1 and each second component area CA2 may be arranged to correspond to the position of a corresponding component 40. The second component areas CA2 may be spaced from (e.g., spaced apart from) each other. Hereinafter, for convenience of description, the case where one first component area CA1 and one second component area CA2 are provided is described in more detail below.

The display panel 10 may be a light-emitting display panel including a light-emitting element. As an example, the display panel 10 may include an organic light-emitting display panel that uses an organic light-emitting diode including an organic emission layer, an ultra miniaturized light-emitting diode display panel that uses a micro light-emitting diode, a quantum-dot light-emitting display panel that uses a quantum-dot light-emitting diode including a quantum-dot emission layer, and an inorganic light-emitting display panel that uses an inorganic light-emitting element including an inorganic semiconductor.

The display panel 10 may be a rigid display panel that has strength and thus is not easily bent, and/or the display panel 10 may be a flexible display panel and thus is easily bendable, foldable, and/or rolled. As an example, the display panel 10 may include a foldable display panel that may be folded or unfolded, a curved display panel in which a display surface is bent, a bendable display panel in which a region excluding a display surface may be bent, a rollable display panel that may be rolled or unrolled, and/or a stretchable display panel that is stretchable.

The display panel 10 may be a transparent display panel that is transparent to allow an object or a background arranged below the display panel 10 to be viewed from the top surface of the display panel 10. Alternatively, the display panel 10 may be a reflective display panel that may reflect an object or a background over or facing the top surface of the display panel 10.

A first soft film 34 may be attached to an edge at one side of the display panel 10. One side of the first soft film 34 may be attached to an edge at one side of the display panel 10 by using an anisotropic conductive film. The first soft film 34 may be a flexible film that is bendable.

A display driver 32 may be arranged on the first soft film 34. The display driver 32 may receive control signals and power voltages and generate and output signals and voltages for driving the display panel 10. The display driver 32 may include an integrated circuit (IC).

A display circuit board 30 may be attached to another side (e.g., a side different from the side of the first soft film 34 that may be attached to an edge at one side of the display panel 10) of the first soft film 34. The other side of the first soft film 34 may be attached to the top surface of the display circuit board 30 by using an anisotropic conductive film. The display circuit board 30 may be a flexible printed circuit board (FPCB) that is bendable, a rigid printed circuit board (PCB) (e.g., a strong, rigid printed circuit board) that is not easily bent, or a composite printed circuit board including both a rigid PCB and a FPCB.

A touch sensor driver 33 may be arranged on the display circuit board 30. The touch sensor driver 33 may include an IC. The touch sensor driver 33 may be attached to the display circuit board 30. The touch sensor driver 33 may be connected (e.g., electrically connected) to touch electrodes of a touchscreen layer of the display panel 10 through the display circuit board 30.

The touchscreen layer of the display panel 10 may sense a user's touch input by using at least one of a resistance layer method or a capacitive method. As an example, in the case where the touchscreen layer of the display panel 10 senses a user's touch by using a capacitive method, the touch sensor driver 33 may determine whether a user touches the display panel 10 by applying driving signals to driving electrodes of the touch electrodes and sensing, through sensing electrodes of the touch electrodes, voltages charged in a mutual capacitance between the driving electrodes and the sensing electrodes. A user's touch may include a contact touch and a proximity touch. A contact touch denotes that a user's finger or an object such as a pen contacts (e.g., directly contacts) the cover window 50 arranged on the touchscreen layer. A proximity touch denotes that a user's finger or an object such as a pen is positioned closely over but spaced from the cover window 50 (e.g., a user's finger or an object such as a pen hovering over the cover window 50). The touch sensor driver 33 transmits sensor data to a main processor 710 according to sensed voltages, and the main processor 710 may calculate a touch coordinate where a touch input occurs by analyzing the sensor data.

A power supply unit may be additionally arranged on the display circuit board 30. The power supply unit may be configured to supply driving voltages for driving pixels of the display panel 10, a scan driver, and the display driver 32. Alternatively, the power supply unit may be integrated with the display driver 32. In this case, the display driver 32 and the power supply unit may be formed as one IC.

A bracket 60 for supporting the display panel 10 may be arranged below the display panel 10. The bracket 60 may include plastic, metal, or both plastic and metal. A first camera hole CMH1, a battery hole BH, and a cable hole CAH may be formed in the bracket 60, a camera apparatus 731 may be inserted into the first camera hole CMH1, a battery 80 may be arranged in the battery hole BH, and a cable 35 may be connected to the display circuit board 30 and pass through the cable hole CAH. In addition, a component hole CPH may be arranged in the bracket 60, the component hole CPH overlapping the component area CA of the display panel 10. The component hole CPH may overlap the components 40 of the main circuit board 70 in a third direction (e.g., a z-direction or a thickness direction). Accordingly, the component area CA of the display panel 10 may overlap the components 40 of the main circuit board 70 in the third direction (e.g., the z-direction or the thickness direction). In an embodiment, the component hole CPH may not be formed in the bracket 60. In this case, the bracket 60 may be arranged not to overlap the component area CA of the display panel 10 in the third direction (e.g., the z-direction or the thickness direction).

In an embodiment, a plurality of components including the component 40 may overlap the component area CA of the display panel 10. As an example, first to fourth components (i.e., a first component 41, a second component 42, a third component 43, and a fourth component 44) may be arranged to overlap the component area CA. The first to fourth components 41, 42, 43, and 44 may be respectively a proximity sensor, an illuminance sensor, an iris sensor, and a camera (or an image sensor). The component area CA of the display panel 10 may have a set or preset light transmittance. Accordingly, a proximity sensor that uses an infrared ray may detect an object arranged close to the top surface of the display apparatus 1, and the illuminance sensor may sense the brightness of light incident on the top surface of the display apparatus 1. In addition, the iris sensor may photograph an iris of a person arranged over or facing the top surface of the display apparatus 1, and the camera may photograph an object arranged on or facing the top surface of the display apparatus 1. The component 40 overlapping the component area CA of the display panel 10 is not limited to a proximity sensor, an illuminance sensor, an iris sensor, and/or a camera. Various suitable sensors may be arranged in the component area CA.

One of the first to fourth components 41, 42, 43, and 44 may correspond to the first component area CA1. The rest of the first to fourth components 41, 42, 43, and 44 may correspond to the second component area CA2. In this case, the one of the first to fourth components 41, 42, 43, and 44 corresponding to the first component area CA1 may be a camera. In another embodiment, a plurality of first component areas CA1 are provided and each of the first to fourth components 41, 42, 43, and 44 may correspond to respective ones of the plurality of first component areas CA1.

The main circuit board 70 and the battery 80 may be arranged below the bracket 60. The main circuit board 70 may be a printed circuit board or a flexible printed circuit board.

The main circuit board 70 may include the main processor 710, a camera apparatus 731, a main connector 75, and the components 40. The main processor 710 may include an IC. The camera apparatus 731 may be arranged on both the top surface and the bottom surface of the main circuit board 70. The main processor 710 and the main connector 75 may be arranged on one of the top surface and the bottom surface of the main circuit board 70. For example, as shown in FIG. 1, the main processor 710 and the main connector 75 may be arranged on the bottom surface of the main circuit board 70.

The main processor 710 may control all functions of the display apparatus 1. As an example, the main processor 710 may output digital video data to the display driver 32 through the display circuit board 30 to allow the display panel 10 to display an image. In addition, the main processor 710 receives sensing data from the touch sensor driver 33. The main processor 710 may determine whether a user touches the display panel 10 depending on sensing data and execute an operation corresponding to a user's direct touch or proximity touch. As an example, the main processor 710 may analyze sensing data to calculate a user's touch coordinates, and then execute an application indicated by an icon touched by a user or perform a corresponding operation. The main processor 710 may be an application processor including an IC, a central processing unit, or a system chip.

The camera apparatus 731 processes an image frame such as a still image or a moving image obtained by an image sensor during a camera mode and outputs the image frame to the main processor 710. The camera apparatus 731 may include at least one of a camera sensor (e.g., a charge-coupled device (CCD), a complementary metal oxide semiconductor (CMOS), etc.), a photo sensor (or an image sensor), or a laser sensor. The camera apparatus 731 may be connected to an image sensor from among the components 40 overlapping the component area CA to process an image input to the image sensor.

The cable 35 passing through the cable hole CAH of the bracket 60 may be connected to the main connector 75, and thus, the main circuit board 70 may be connected (e.g., electrically connected) to the display circuit board 30.

The battery 80 may receive power from an external wireless power transmitter using at least one of inductive coupling-based magnetic induction or resonance coupling-based on electromagnetic resonance. The battery 80 may not overlap the main circuit board 70 in the third direction (e.g., the z-direction or the thickness direction). The battery 80 may overlap the battery hole BH of the bracket 60.

The bottom cover 90 may be arranged below the main circuit board 70 and the battery 80. The bottom cover 90 may be coupled and fixed to the bracket 60. The bottom cover 90 may constitute a bottom of the display apparatus 1. The bottom cover 90 may include plastic, metal, or both plastic and metal.

A second camera hole CMH2 through which the bottom surface of the camera apparatus 731 is exposed may be formed in the bottom cover 90. The position of the camera apparatus 731, and the positions of the first and second camera holes CMH1 and CMH2 corresponding to the camera apparatus 731 are not limited to the embodiments shown in FIGS. 1 and 2.

Figure 3:
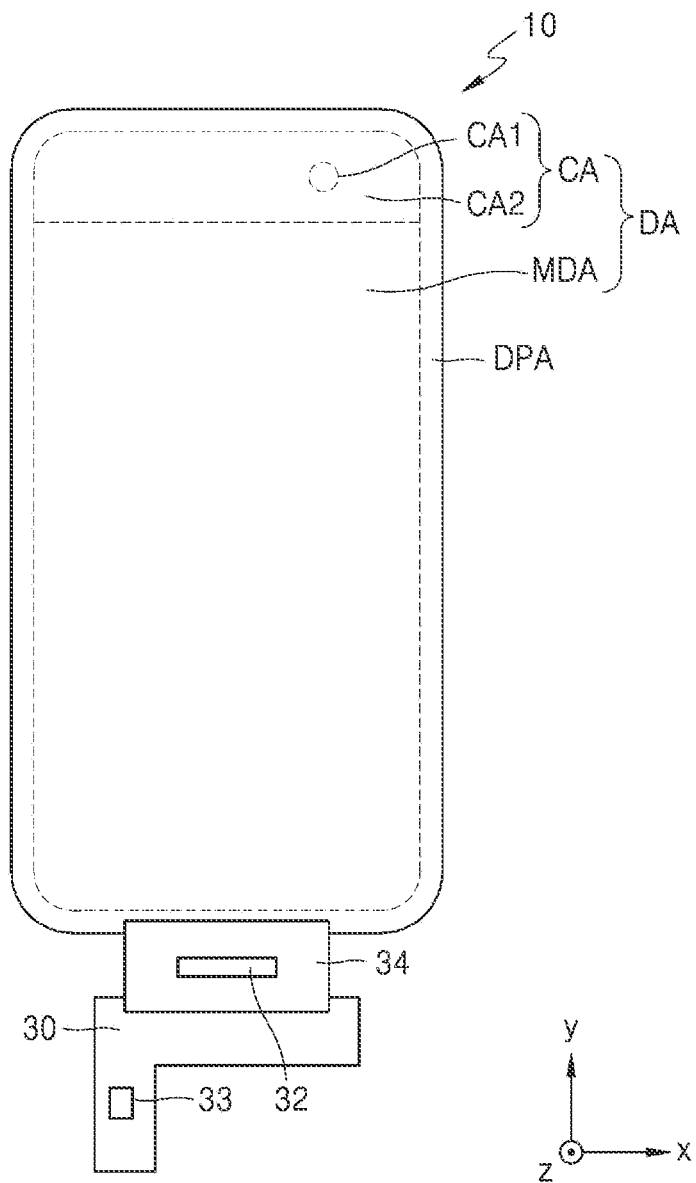
FIG. 3 is a plan view of a display panel according to an embodiment.
Figure 4:
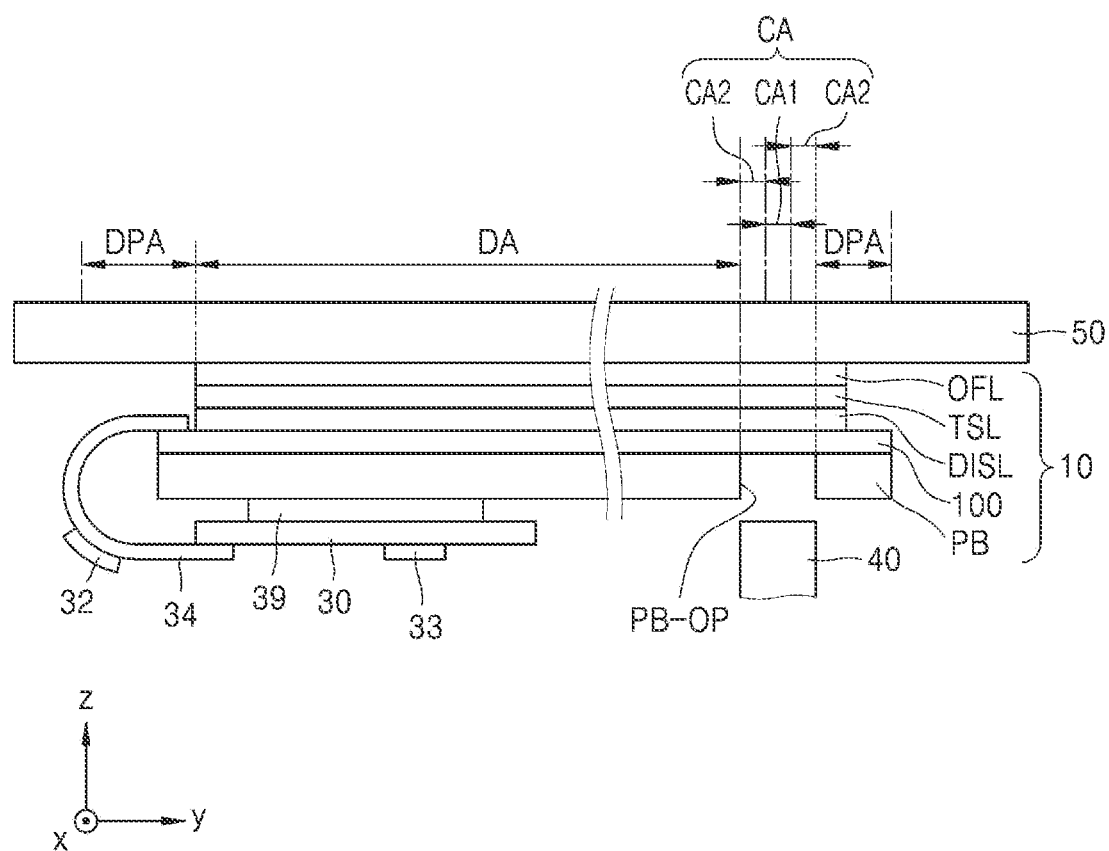
FIG. 4 is a cross-sectional view of the display panel shown in FIG. 3.

FIG. 3 is a plan view of the display panel 10 according to an embodiment. FIG. 4 is a cross-sectional view of the display panel 10 shown in FIG. 3.

Referring to FIGS. 3 and 4, the display panel 10 may include a substrate 100, a display layer DISL, a touchscreen layer TSL, an optical functional layer OFL, and a panel-protecting member PB.

The substrate 100 may include an insulating material such as glass, quartz, and/or a polymer resin. The substrate 100 may be a rigid substrate and/or a flexible substrate that is bendable, foldable, and/or rollable. As an example, the substrate may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 may have a multi-layer structure including a layer including the polymer resin and an inorganic layer. As an example, the substrate 100 may include two layers including the polymer resin and an inorganic barrier layer therebetween.

The display layer DISL may be arranged on the substrate 100. The display layer DISL may include pixels and be a layer configured to display an image. The display layer DISL may include a circuit layer, a display element layer, and an encapsulation member. The circuit layer may include thin-film transistors. In an embodiment, display elements may be arranged in the display element layer, and the encapsulation member may encapsulate the display element layer.

The display layer DISL may be divided into a display area DA and a peripheral area DPA. The display area DA may be a region in which pixels are arranged to display an image. The peripheral area DPA may be a region arranged outside or around the display area DA and in which an image is not displayed. The peripheral area DPA may surround the display area DA. The peripheral area DPA may be a region from the outside of the display area DA to the edge of the display panel 10. Not only pixels but also pixel circuits, scan lines, data lines, power lines, etc. may be arranged in the display area DA. The pixel circuits may drive the pixels, and the scan lines, the data lines, and the power lines may be connected to the pixel circuits. A scan driver, fan-out lines, etc. may be arranged in the peripheral area DPA. The scan driver may be configured to apply scan signals to the scan lines, and the fan-out lines may connect the data lines to the display driver 32.

The touchscreen layer TSL may be arranged on the display layer DISL. The touchscreen layer TSL may include touch electrodes and be a layer configured to sense whether a user touches the display panel 10. The touchscreen layer TSL may be formed (e.g., directly formed) on the encapsulation member of the display layer DISL. Alternatively, the touchscreen layer TSL may be separately formed and then coupled to the encapsulation member of the display layer DISL through an adhesive layer such as an optically clear adhesive (OCA).

An optical functional layer OFL may be arranged on the touchscreen layer TSL. The optical functional layer OFL may include an anti-reflection layer. The anti-reflection layer may reduce the reflectivity of light (e.g., external light) incident on the display apparatus 1 from the outside.

In an embodiment, the anti-reflection layer may include a polarizing film. The polarizing film may include a phase-delay film such as a quarter-wave plate (λ/4). The phase-delay film may be arranged on the touchscreen layer TSL. A linear-polarizing plate may be arranged on the phase-delay film.

In an embodiment, the anti-reflection layer may include a filter layer including a black matrix and color filters. The color filters may be arranged by taking into account a color of light emitted from the pixels of the display apparatus 1. As an example, the filter layer may include a red color filter, a green color filter, or a blue color filter.

In an embodiment, the anti-reflection layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere with each other, and thus, the reflectivity of external light may be reduced.

The cover window 50 may be arranged on the optical functional layer OFL. The cover window 50 may be attached on the optical functional layer OFL through a transparent adhesive member such as an OCA.

A panel-protecting member PB may be arranged under the display panel 10. The panel-protecting member PB may be attached on the bottom surface of the display panel 10 through an adhesive member. The adhesive member may be a pressure sensitive adhesive (PSA). The panel-protecting member PB may include at least one of a light-absorbing layer for absorbing light incident from the outside, a cushion layer for absorbing an impact from the outside, or a heat-dissipating layer for efficiently dissipating heat of the display panel 10.

The light-absorbing layer may be arranged under the display panel 10. The light-absorbing layer blocks light transmission and prevents or substantially prevents elements under the light-absorbing layer, for example, the display circuit board 30, etc. from being viewed from above the display panel 10. The light-absorbing layer may include a light-absorbing material such as black pigment or black dye.

The cushion layer may be arranged under the light-absorbing layer. The cushion layer absorbs an external impact to prevent or substantially prevent the display panel 10 from being destroyed. The cushion layer may include a single layer or multiple layers. As an example, the cushion layer may include a polymer resin such as polyurethane, polycarbonate, polypropylene, and polyethylene, and/or include a material having elasticity such as a sponge formed by foaming rubber, a urethane-based material, and/or an acryl-based material.

The heat-dissipating layer may be arranged under the cushion layer. The heat-dissipating layer may include a first heat-dissipating layer and a second heat-dissipating layer. The first heat-dissipating layer may include graphite and/or carbon nanotubes. The second heat-dissipating layer may shield electromagnetic waves and include a metal thin film including any suitable material such as copper, nickel, ferrite, and/or silver.

The panel-protecting member PB may include an opening PB_OP corresponding to the component area CA. The opening PB_OP of the panel-protecting member PB may improve a light transmittance of the component area CA.

The area of the component area CA may be greater than the area in which the component 40 is arranged. Accordingly, the area of the opening PB_OP of the panel-protecting member PB may not coincide with the area of the component area CA. The component 40 may overlap (e.g., overlap in the z-direction or the thickness direction) the opening PB_OP of the panel-protecting member PB. In an embodiment, the component 40 may be inserted into the opening PB_OP.

The first soft film 34 may be arranged in the peripheral area DPA at the edge at one side of the display panel 10. The first soft film 34 may be bent below the display panel 10. The display circuit board 30 may be arranged over the bottom surface of the panel-protecting member PB. The display circuit board 30 may be attached and fixed to the bottom surface of the panel-protecting member PB through a first adhesive member 39. The first adhesive member 39 may be a PSA.

The display area DA of the display panel 10 includes the component area CA and the main display area MDA. The component 40 may be arranged below the component area CA. The component area CA may be arranged at one side of the main display area MDA. In an embodiment, as shown in FIG. 3, the component area CA is arranged in a bar type having the same width as the width of the main display area MDA in the x-direction. The component area CA may be arranged between the peripheral area DPA and the main display area MDA such that the upper side, the right side, and the left side of the component area CA contact the peripheral area DPA, and the bottom side of the component area CA contacts the main display area MDA.

In this case, the component area CA may include a first component area CA1 and a second component area CA2 having different shapes from each other. The second component area CA2 may surround the first component area CA1. That is, the first component area CA1 may be arranged inside the second component area CA2. The periphery of the first component area CA1 may contact the second component area CA2.

In this case, in a plan view, the first component area CA1 may overlap (e.g., overlap in the z-direction or the thickness direction) the component 40. For example, in a plan view, the center of the first component area CA1 may coincide or be close to the center of the component 40. In this case, the region of the component 40 except for the center thereof may correspond to the second component area CA2.

Figure 5:
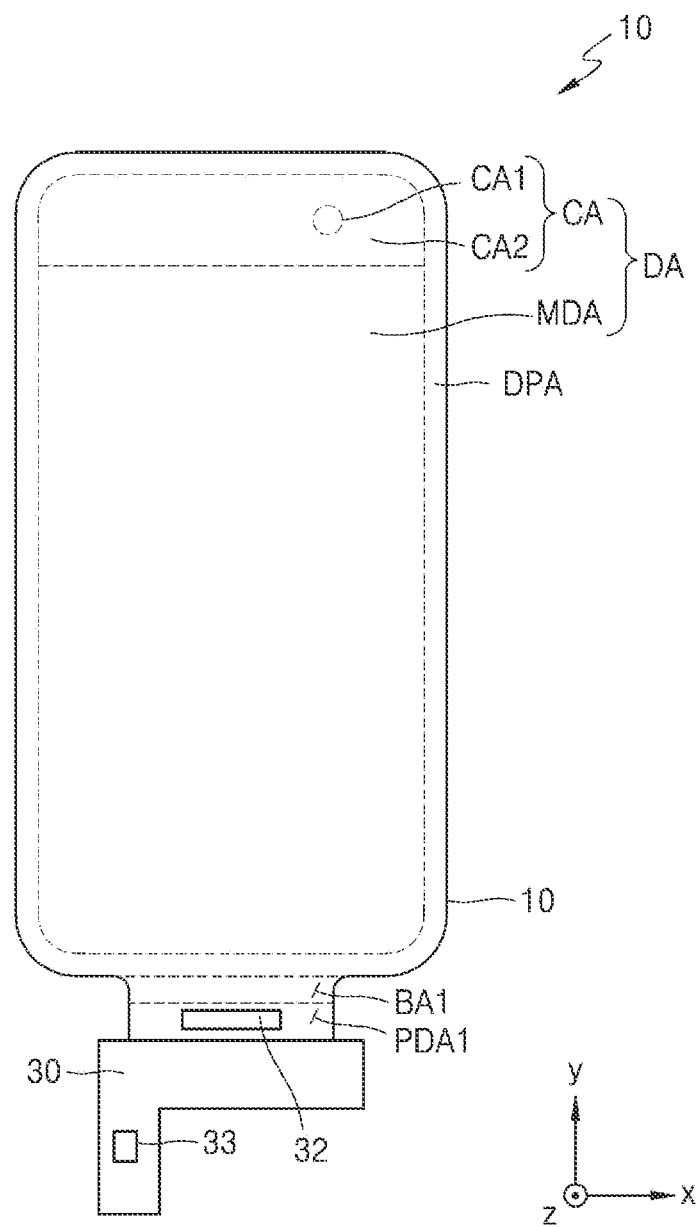
FIG. 5 is a plan view of a display panel according to another embodiment.
Figure 6:
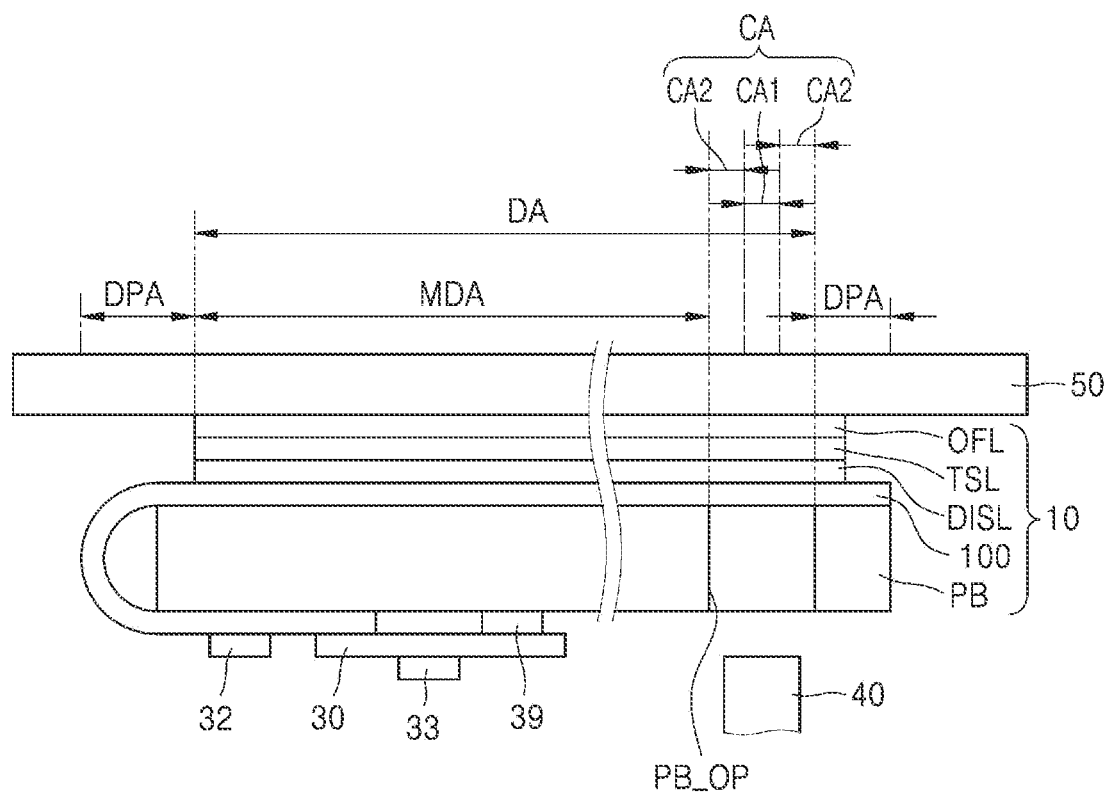
FIG. 6 is a cross-sectional view of the display panel shown in FIG. 5.

FIG. 5 is a plan view of the display panel 10 according to another embodiment. FIG. 6 is a cross-sectional view of the display panel 10 shown in FIG. 5.

The embodiment of FIGS. 5 and 6 is different from the embodiment of FIGS. 3 and 4 in that a first bent area BA1 on one side of the display panel 10 is bent and thus a first pad area PDA1 is arranged on the bottom surface of the panel-protecting member PB. That is, the display panel 10 may be a bent display panel in which one side thereof is bent.

Referring to FIGS. 5 and 6, the first bent area BA1 and the first pad area PDA1 may protrude in a (−) y-direction from the peripheral area DPA on one side of the display panel 10. As in FIG. 6, the lengths of the first bent area BA1 and the first pad area PDA in an x-direction may be less than the length of the display area DA in the x-direction.

The display panel 10 may be bent in the first bent area BA1, and the first pad area PDA1 may be arranged on the bottom surface of the panel-protecting member PB. The first pad area PDA1 may overlap the display area DA in a thickness direction (e.g., a z-direction or a thickness direction) of the display panel 10. The display driver 32 and the display circuit board 30 may be arranged in the first pad area PDA1.

Though it is shown in FIGS. 3 and 5 that the component area CA of the display area DA is provided as a bar-type (e.g., in a bar shape), the present disclosure is not limited thereto. As an example, the shape of the component area CA may be a circle, an ellipse, or a polygon such as a triangle or a pentagon. The position of the component area CA may be variously modified in a suitable manner. In addition, the display apparatus 1 may include two or more component areas CA, and the shapes and the sizes of the plurality of component areas CA may be different from each other.

The component area CA may include the first component area CA1 and the second component area CA2. In this case, the first component area CA1 and the second component area CA2 are the same as or similar to those described above, and thus, detailed descriptions thereof may not be repeated.

Figure 7A:
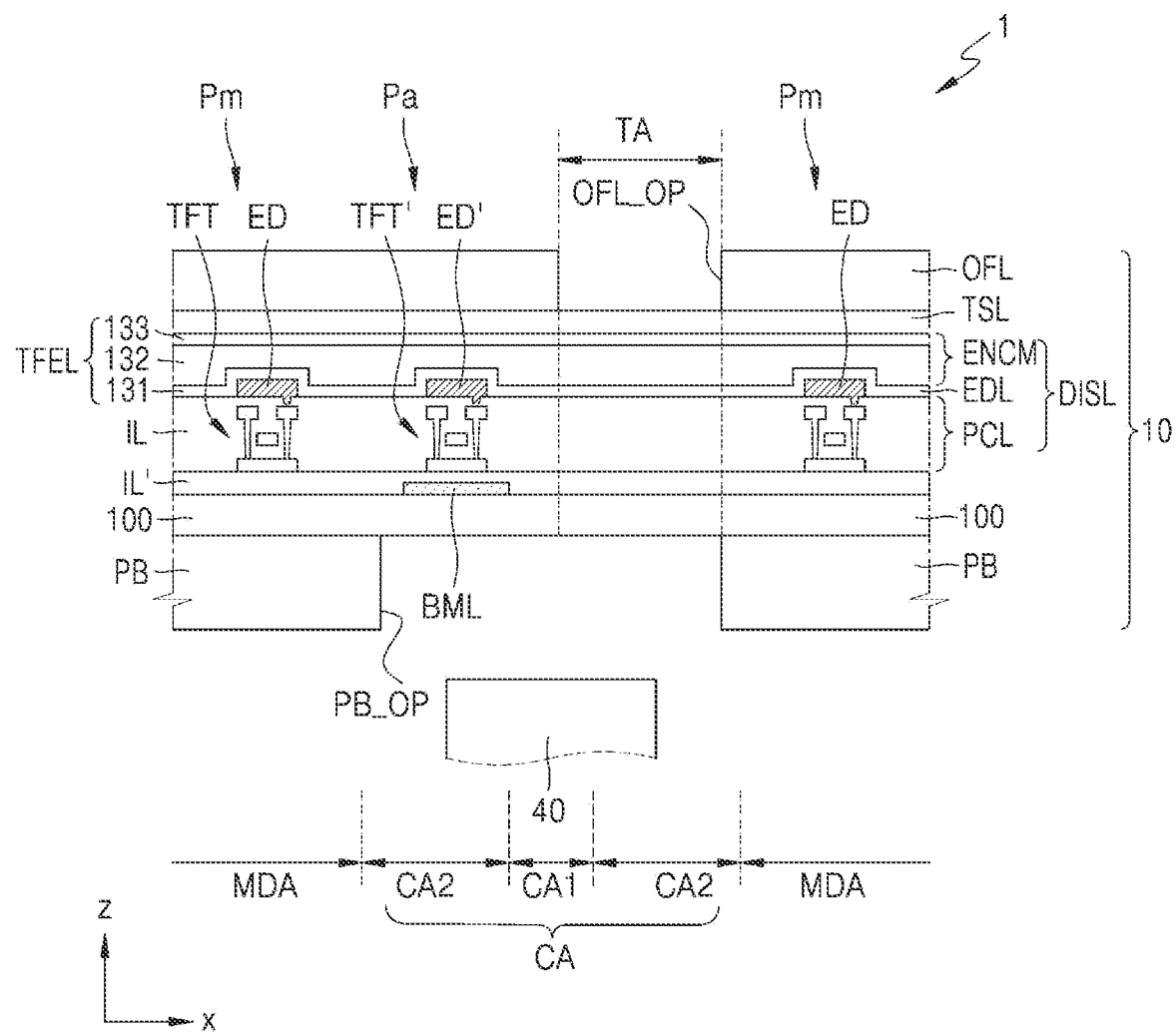
FIGS. 7A-7C are cross-sectional views of a display apparatus according to embodiments.
Figure 7B:
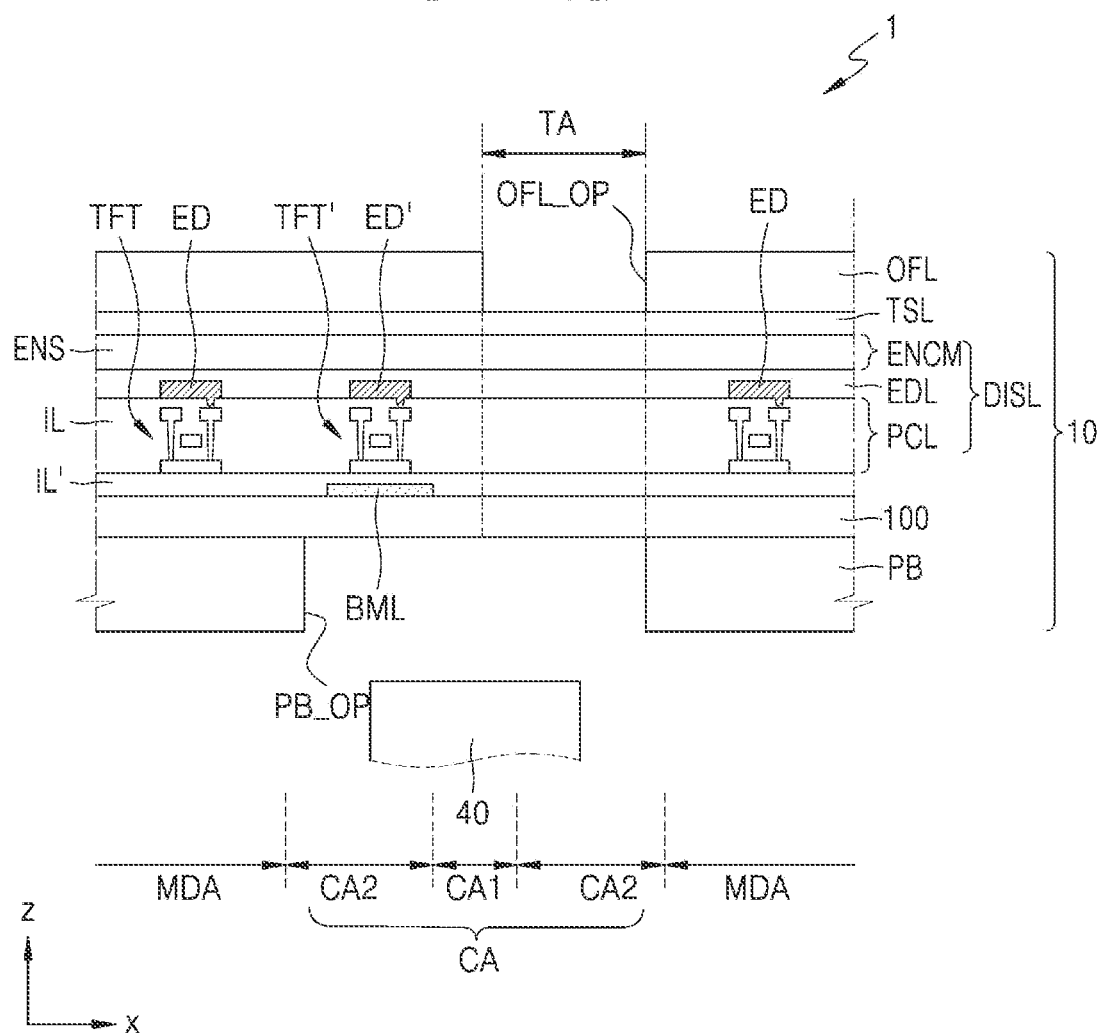
Figure 7C:
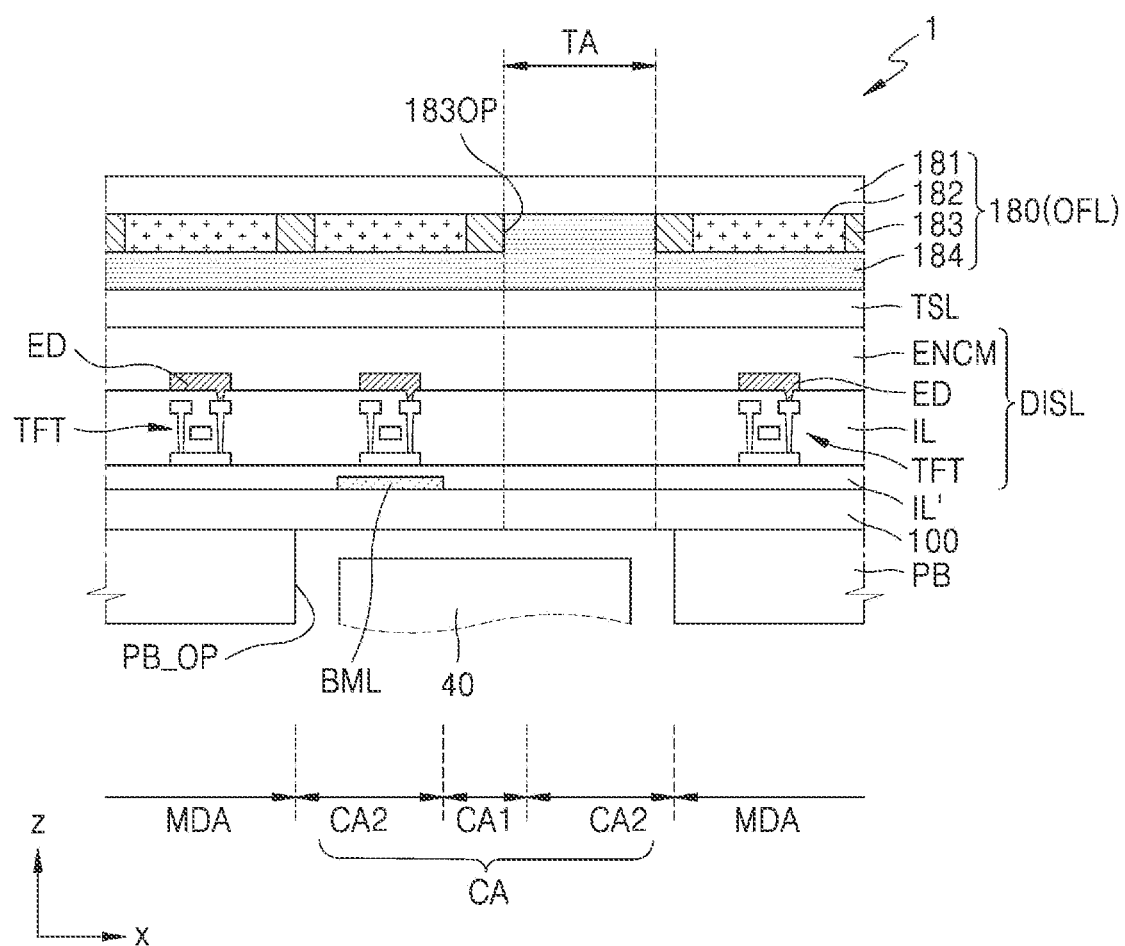

FIGS. 7A-7C are cross-sectional views of the display apparatus 1 according to embodiments.

Referring to FIGS. 7A-7C, the display apparatus 1 may include the display panel 10 and the component 40 overlapping (e.g., overlapping in the z-direction or the thickness direction) the display panel 10. The display panel 10 includes the component area CA and the main display area MDA. The component area CA may overlap the component 40. In an embodiment, an image may be displayed in the main display area MDA.

The display panel 10 may include the substrate 100, the display layer DISL, the touchscreen layer TSL, the optical functional layer OFL, and the panel-protecting member PB. The display layer DISL may be on the substrate 100, and the panel-protecting member PB may be arranged under the substrate 100. The display layer DISL may include a circuit layer PCL, a display element layer EDL, and an encapsulation member ENCM. The circuit layer PCL may include main and auxiliary thin-film transistors TFT and TFT'. The display element layer may include main and auxiliary light-emitting elements ED and ED'. The encapsulation member ENCM may be a thin-film encapsulation layer TFEL or an encapsulation substrate ENS. Insulating layers IL and IL' may be arranged between the substrate 100 and the display layer DISL and inside the display layer DISL.

As described above, the substrate 100 may include an insulating material such as glass, quartz, and/or a polymer resin. The substrate 100 may be a rigid substrate and/or a flexible substrate that is bendable, foldable, and/or rollable.

The main thin-film transistor TFT and the main light-emitting element ED connected thereto may be arranged in the main display area MDA of the display panel 10 to implement a main sub-pixel Pm. The auxiliary thin-film transistor TFT' and the auxiliary light-emitting element ED' connected thereto may be arranged in the component area CA to implement an auxiliary sub-pixel Pa.

In addition, the transmission area TA may be arranged in the component area CA, a display element not being arranged in the transmission area TA. The transmission area TA may be a region through which light and/or a signal emitted from the component 40 corresponding to the component area CA, and/or light and/or a signal incident on the component 40 may pass.

A bottom metal layer BML may be arranged in the component area CA. The bottom metal layer BML may be arranged to correspond to below the auxiliary thin-film transistor TFT'. As an example, the bottom metal layer BML may be arranged between the auxiliary thin-film transistor TFT' and the substrate 100. The bottom metal layer BML may block or substantially block external light reaching the auxiliary thin-film transistor TFT'. In an embodiment, a constant voltage or a signal may be applied to the bottom metal layer BML, and thus, damage to a pixel circuit due to electrostatic discharge may be prevented or reduced. In an embodiment, a plurality of bottom metal layers BML including the bottom metal layer BML may be arranged inside the component area CA. Depending on the case, different voltages may be applied to the bottom metal layers BML. One bottom metal layer BML including a hole corresponding to the transmission area TA may be arranged inside the component area CA.

In this case, the shape of the hole formed in the bottom metal layer BML may be changed according to the position thereof in the component area CA. As an example, the hole formed in the bottom metal layer BML may define a planar shape of the transmission area TA. In this case, the planar shape of the hole formed in the bottom metal layer BML arranged in the first component area CA1 may be different from the planar shape of the hole formed in the bottom metal layer BML arranged in the second component area CA2.

As described above, the bottom metal layer BML may be arranged below the auxiliary sub-pixel Pa, or arranged in a space between an opposite electrode 123 of the auxiliary sub-pixel Pa and the transmission area TA. In this case, the bottom metal layer BML may be arranged to form the periphery of the transmission area TA.

The display element layer EDL may be covered by the thin-film encapsulation layer TFEL or the encapsulation substrate ENS. In an embodiment, as shown in FIG. 7A, the thin-film encapsulation layer TFEL may include at least one inorganic encapsulation layer and at least one organic encapsulation layer. In an embodiment, the thin-film encapsulation layer TFEL may include first and second inorganic encapsulation layers 131 and 133, and an organic encapsulation layer 132 therebetween.

In an embodiment, as shown in FIG. 7B, the encapsulation substrate ENS may face the substrate 100 with the display element layer EDL therebetween. There may be a gap between the encapsulation substrate ENS and the display element layer EDL. The encapsulation substrate ENS may include glass. Sealant may be arranged between the substrate 100 and the encapsulation substrate ENS, the sealant including frit. The sealant may be arranged in the peripheral area DPA. Sealant arranged in the peripheral area DPA may be around or surround the display area DA and may prevent or substantially prevent moisture from penetrating into the display area DA through the lateral surface of the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input through a self-capacitance method or a mutual-capacitance method.

The touchscreen layer TSL may be formed (e.g., directly formed) on the thin-film encapsulation layer TFEL. Alternatively, the touchscreen layer TSL may be separately formed on a touchscreen and then coupled to the thin-film encapsulation layer TFEL through an adhesive layer such as an OCA. In an embodiment, as shown in FIG. 7A, the touchscreen layer TSL may be formed (e.g., directly formed) on the thin-film encapsulation layer TFEL. In this case, the adhesive layer may not be arranged between the touchscreen layer TSL and the thin-film encapsulation layer TFEL.

The optical functional layer OFL may include an anti-reflection layer. The anti-reflection layer may reduce the reflectivity of light (e.g., external light) incident on the display apparatus 1 from the outside.

In an embodiment, the optical functional layer OFL may include a polarizing film. The optical functional layer OFL may include an opening OFL_OP corresponding to the transmission area TA. Accordingly, a light transmittance of the transmission area TA may be improved (e.g., remarkably improved). A transparent material such as an optically clear resin (OCR) may fill the opening OFL_OP.

In an embodiment, as shown in FIG. 7C, the optical functional layer OFL may include a filter plate 180 including a black matrix and color filters. The filter plate 180 may include a base layer 181, color filters 182, a black matrix 183, and an overcoat layer 184 on the base layer 181.

The color filters 182 may be arranged by taking into account a color of light emitted from the pixels of the display panel 10. As an example, the color filters 182 may have a red color, a green color, or a blue color depending on a color of light emitted from the main and auxiliary light-emitting diodes ED and ED'. In an embodiment, there is no color filter 182 and no black matrix 183 in the transmission area TA. As an example, the layer including the color filters 182 and the black matrix 183 may include a hole 1830P corresponding to the transmission area TA. The overcoat layer 184 may fill at least a portion of the hole 1830P. The overcoat layer 184 may include an organic material such as a resin, and the organic material may be transparent.

The hole 1830P may define the periphery of the transmission area TA. In this case, the relationship between the hole 1830P and the periphery of the transmission area TA is the same as or similar to the relationship between the hole of the bottom metal layer BML and the periphery of the transmission area TA described above, and thus, a detailed description thereof may not be repeated.

In this case, though it is shown in FIG. 7C that both the bottom metal layer BML and the black matrix 183 are provided, only the black matrix 183 may be provided.

Figure 8:
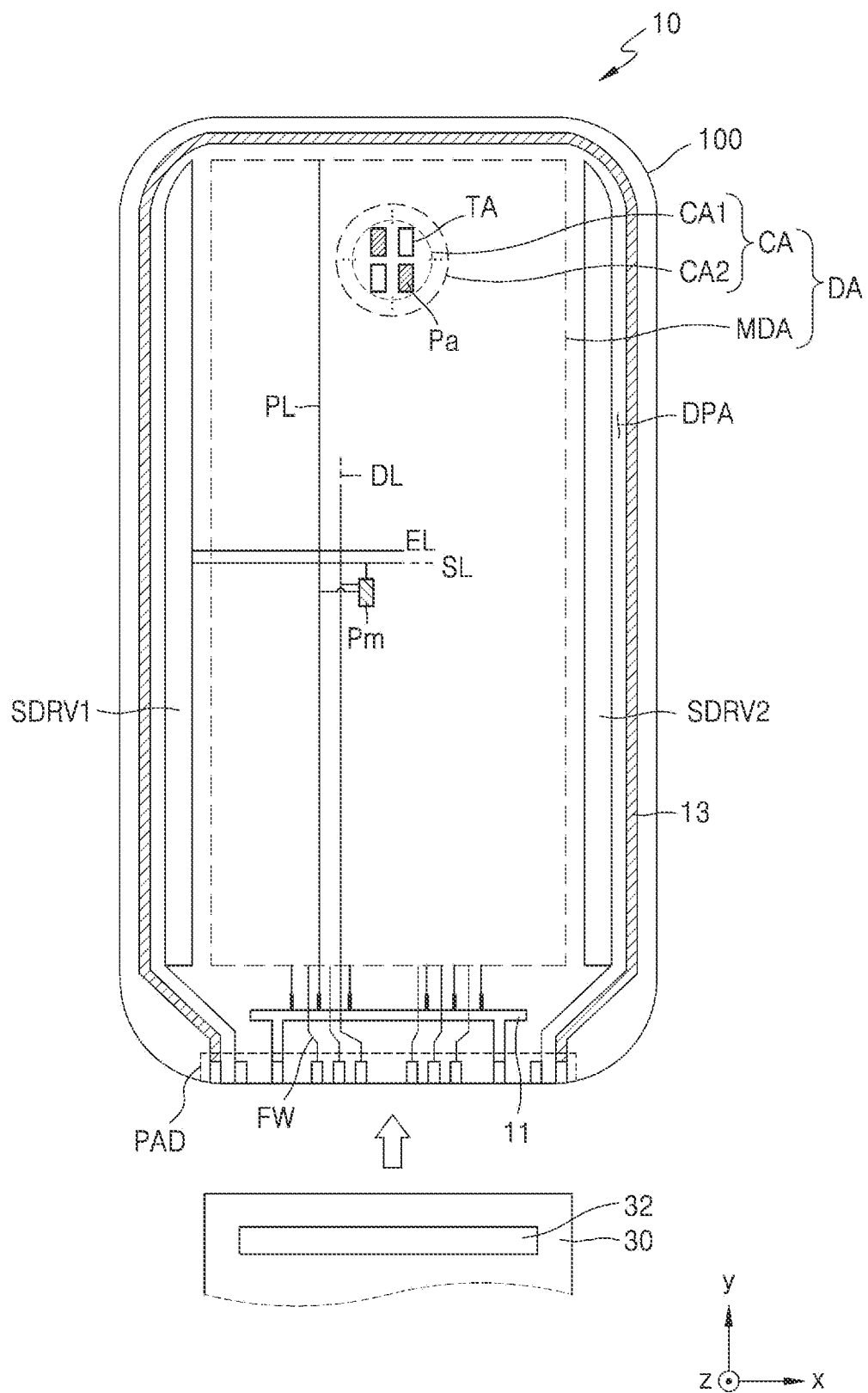
FIG. 8 is a plan view of a display panel according to another embodiment.

FIG. 8 is a plan view of the display panel 10 according to another embodiment.

Referring to FIG. 8, various suitable kinds of elements constituting the display panel 10 are arranged on the substrate 100. The substrate 100 includes the display area DA and the peripheral area DPA surrounding the display area DA. The display area DA includes the main display area MDA and the component area CA. In an embodiment, a main image may be displayed in the main display area MDA, and an auxiliary image may be displayed in the component area CA including the transmission area TA. The auxiliary image may constitute an entire image in cooperation with the main image, or may be an image independent of the main image.

A plurality of main sub-pixels Pm are arranged in the main display area MDA. The main sub-pixels Pm may each be implemented through a display element such as an organic light-emitting diode OLED. Each main sub-pixel Pm may emit, for example, red light, green light, blue light, or white light. The main display area MDA may be protected from external air or moisture by being covered by an encapsulation member.

As described above, the component area CA may be arranged at one side of the main display area MDA, or arranged inside the display area DA and surrounded by the main display area MDA. A plurality of auxiliary sub-pixels Pa are arranged in the component area CA. The plurality of auxiliary sub-pixels Pa may each be implemented through a display element such as an organic light-emitting diode OLED. Each auxiliary sub-pixel Pa may emit, for example, red light, green light, blue light, or white light. The component area CA may be protected from external air or moisture by being covered by an encapsulation member.

The component area CA may include the transmission area TA. The transmission areas TA may be arranged to surround the plurality of auxiliary sub-pixels Pa. Alternatively, the transmission areas TA may be arranged in a lattice configuration with the plurality of auxiliary sub-pixels Pa.

The component area CA includes the transmission area TA, and thus, the resolution of the component area CA may be less than the resolution of the main display area MDA. As an example, the resolution of the component area CA may be about ½, about ⅜, about ⅓, about ¼, about ⅖, about ⅛, about ⅑, and about 1/16 of the resolution of the main display area MDA. As an example, the resolution of the main display area MDA may be 400 ppi or more, and the resolution of the component area CA may be about 200 ppi or about 100 ppi.

The component area CA may include a first component area CA1 and a second component area CA2 that neighbor each other. In this case, the first component area CA1 may be arranged inside the second component area CA2. In this case, the first component area CA1 and the second component area CA2 may have various suitable shapes. As an example, the first component area CA1 or the second component area CA2 may be circular, polygonal, elliptical, or bar-shaped. Hereinafter, for convenience of description, the case where both the first component area CA1 and the second component area CA2 are circular is described in more detail below.

The center of the first component area CA1 may not coincide with the center of the second component area CA2.

As an example, in the case where the center of the first component area CA1 coincides with the center of the second component area CA2, the first component area CA1 may be arranged at the center of the second component area CA2. In contrast, in the case where the center of the first component area CA1 does not coincide with the center of the second component area CA2, the first component area CA1 may be biased on one side inside the second component area CA2. In this case, the first component area CA1 may correspond to the center of the component 40. As an example, the center of the first component area CA1 may coincide with the center of the component 40.

The resolution of the first component area CA1 may be the same as or equal to the resolution of the second component area CA2. That is, the number of first pixel groups in the first component area CA1 in the same area may be the same as or equal to the number of second pixel groups in the second component area CA2 in the same area. In other words, the number of first pixel groups per unit area in the first component area CA1 may be the same as or equal to the number of second pixel groups per unit area in the second component area CA2.

Pixel circuits driving the sub-pixels (e.g., the main sub-pixels Pm and the auxiliary sub-pixels Pa) may be connected (e.g., electrically connected) to circuits (e.g., outer circuits) arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to pixel circuits driving the sub-pixels (e.g., each of the main sub-pixels Pm and the auxiliary sub-pixels Pa through a scan line SL). The first scan driving circuit SDRV1 may apply an emission control signal to each pixel circuit through an emission control line EL. The second scan driving circuit SDRV2 may be arranged opposite to the first scan driving circuit SDRV1 around the main display area MDA and approximately parallel to the first scan driving circuit SDRV1. Some of the pixel circuits of the main sub-pixels Pm in the main display area MDA may be connected (e.g., electrically connected) to the first scan driving circuit SDRV1, and the rest of the pixel circuits may be connected (e.g., electrically connected) to the second scan driving circuit SDRV2. Some of the pixel circuits of the auxiliary sub-pixels Pa in the component area CA may be connected (e.g., electrically connected) to the first scan driving circuit SDRV1, and the rest of the pixel circuits may be connected (e.g., electrically connected) to the second scan driving circuit SDRV2. In an embodiment, the second scan driving circuit SDRV2 may be omitted.

The terminal portion PAD may be arranged at one side of the substrate 100. The terminal portion PAD may be exposed by not being covered by an insulating layer, and thus, connected to the display circuit board 30. The display driver 32 may be arranged on the display circuit board 30. The display driver 32 may generate a control signal transferred to the first scan driving circuit SDRV1 and the second scan driving circuit SDRV2. In addition, the display driver 32 may supply a driving voltage ELVDD to the driving voltage supply line 11 and supply a common voltage ELVSS to the common voltage supply line 13. The driving voltage ELVDD may be applied to the pixel circuits of the sub-pixels (e.g., each of the main sub-pixels Pm and the auxiliary sub-pixels Pa) through a driving voltage line PL connected to the driving voltage supply line 11. The common voltage ELVSS may be connected to the common voltage supply line 13 and applied to an opposite electrode of a display element. The display driver 32 generates a data signal. The generated data signal may be transferred to the pixel circuits of the sub-pixels (e.g., each of the main sub-pixels Pm and the auxiliary sub-pixels Pa) through a fan-out wiring FW and a data line DL connected to the fan-out wiring FW.

The driving voltage supply line 11 may extend in the x-direction below the main display area MDA. The common voltage supply line 13 may partially surround the main display area MDA by having a loop shape having one open side.

Figure 9A:
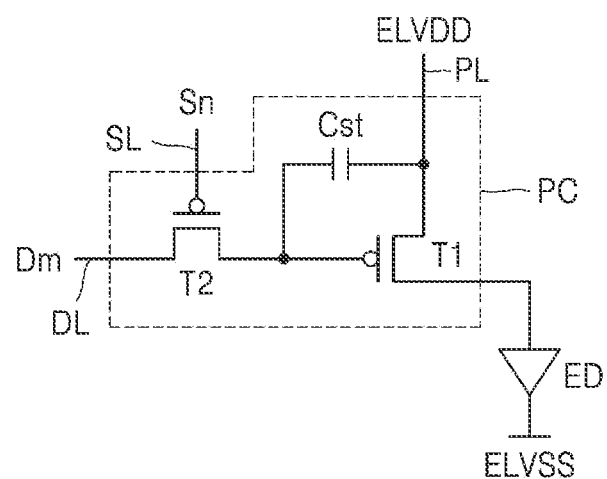
FIGS. 9A and 9B are equivalent circuit diagrams of a pixel circuit driving a sub-pixel according to embodiments.
Figure 9B:
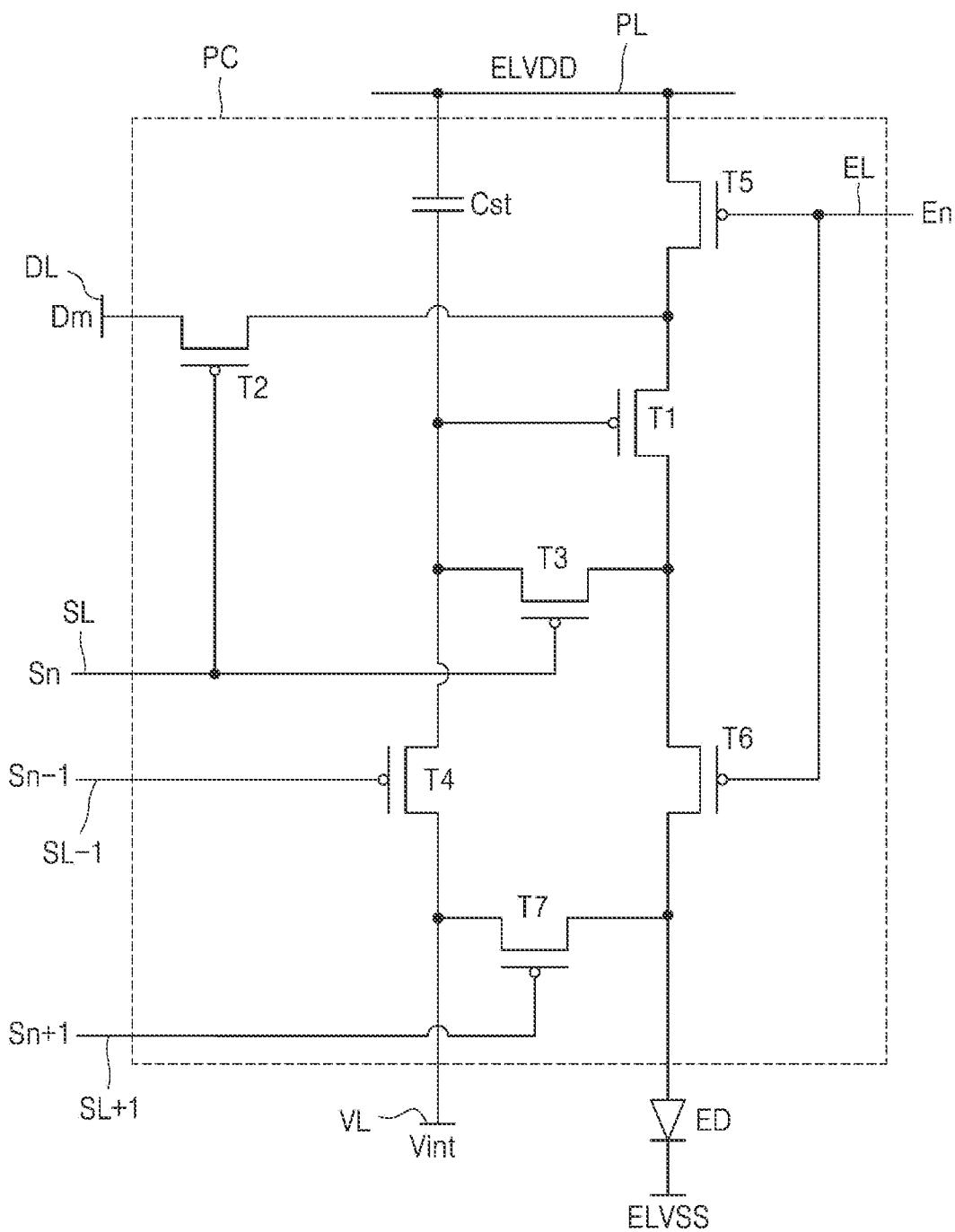

FIGS. 9A and 9B are equivalent circuit diagrams of a pixel circuit driving a sub-pixel according to embodiments.

Referring to FIG. 9A, a pixel circuit PC may be connected to a light-emitting element ED to implement light emission of the sub-pixels. The pixel circuit PC includes a driving thin-film transistor T1, a switching thin-film transistor T2, and a storage capacitor Cst. The switching thin-film transistor T2 is connected to the scan line SL and the data line DL, and transfers a data signal Dm to the driving thin-film transistor T1 according to a scan signal Sn input through the scan line SL. The data signal Dm may be input through the data line DL.

The storage capacitor Cst is connected to the switching thin-film transistor T2 and a driving voltage line PL, and may store a voltage corresponding to a difference between a voltage transferred from the switching thin-film transistor T2 and the driving voltage ELVDD supplied through the driving voltage line PL.

The driving thin-film transistor T1 is connected to the driving voltage line PL and the storage capacitor Cst, and may control a driving current flowing through the light-emitting element ED from the driving voltage line PL according to the voltage stored in the storage capacitor Cst. The light-emitting element ED may emit light having set or preset brightness according to the driving current.

Though FIG. 9A shows the case where the pixel circuit PC includes two thin-film transistors and one storage capacitor, the present disclosure is not limited thereto.

Referring to FIG. 9B, the pixel circuit PC may include the driving thin-film transistors T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

Though FIG. 9B shows the case where signal lines (e.g., a scan line SL, a previous scan line SL−1, a next scan line SL+1, an emission control line EL, a data line DL, an initialization voltage line VL, and the driving voltage line PL) are provided for each pixel circuit PC, the present disclosure is not limited thereto. In another embodiment, at least one of signal lines (e.g., at least one of the scan line SL, the previous scan line SL−1, the next scan line SL+1, the emission control line EL, the data line DL, and/or the initialization voltage line VL) may be shared by neighboring pixel circuits.

A drain electrode of the driving thin-film transistor T1 may be connected (e.g., electrically connected) to the light-emitting element ED through the emission control thin-film transistor T6. The driving thin-film transistor T1 may receive a data signal Dm according to a switching operation of the switching thin-film transistor T2 and supply a driving current to the light-emitting element ED.

A gate electrode of the switching thin-film transistor T2 is connected to the scan line SL, and a source electrode is connected to the data line DL. A drain electrode of the switching thin-film transistor T2 may be connected to a source electrode of the driving thin-film transistor T1 and connected to the driving voltage line PL through the operation control thin-film transistor T5.

The switching thin-film transistor T2 is turned on according to a scan signal Sn transferred through the scan line SL and performs a switching operation of transferring a data signal Dm transferred through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and connected to a pixel electrode of the light-emitting element ED through the emission control thin-film transistor T6. A drain electrode of the compensation thin-film transistor T3 may be connected to one of the electrodes of the storage capacitor Cst, connected to a source electrode of the first initialization thin-film transistor T4, and connected to the gate electrode of the driving thin-film transistor T1. The compensation thin-film transistor T3 is turned on according to a scan signal Sn transferred through the scan line SL and diode-connects the driving thin-film transistor T1 by connecting the gate electrode of the driving thin-film transistor T1 to the drain electrode of the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. A source electrode of the first initialization thin-film transistor T4 may be connected to one of the electrodes of the storage capacitor Cst, connected to the drain electrode of the compensation thin-film transistor T3, and connected to the gate electrode of the driving thin-film transistor T1. The first initialization thin-film transistor T4 is turned on according to a previous scan signal Sn−1 transferred through the previous scan line SL−1 and may perform an initialization operation of initializing the voltage of the gate electrode of the driving thin-film transistor T1 by transferring an initialization voltage Vint to the gate electrode of the driving thin-film transistor T1.

A control gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be connected (e.g., electrically connected) to the pixel electrode of the light-emitting element ED. The operation control thin-film transistor T5 and the emission control thin-film transistor T6 are concurrently (e.g., simultaneously) turned on according to an emission control signal En transferred through the emission control line EL, the driving voltage ELVDD is transferred to the light-emitting element ED, and the driving current flows through the light-emitting element ED.

A gate electrode of the second initialization thin-film transistor T7 may be connected to the previous scan line SL−1. A source electrode of the second initialization thin-film transistor T7 may be connected to the pixel electrode of the light-emitting element ED. A drain electrode of the second initialization thin-film transistor T7 may be connected to the initialization voltage line VL. The second initialization thin-film transistor T7 may be turned on according to a next scan signal Sn+1 transferred through the next scan line SL+1 and may initialize the pixel electrode of the light-emitting element ED.

Though FIG. 9B shows the case where both the first initialization thin-film transistor T4 (e.g., the gate electrode of the first initialization thin-film transistor T4) and the second initialization thin-film transistor T7 (e.g., the gate electrode of the second initialization thin-film transistor T7) are respectively connected to the previous scan line SL−1 and the next scan line SL+1, the present disclosure is not limited thereto. In another embodiment, both the first initialization thin-film transistor T4 (e.g., the gate electrode of the first initialization thin-film transistor T4) and the second initialization thin-film transistor T7 (e.g., the gate electrode of the second initialization thin-film transistor T7) may be connected to the previous scan line SL−1 and driven according to a previous scan signal Sn−1.

The other one of the electrodes of the storage capacitor Cst may be connected to the driving voltage line PL. One of the electrodes of the storage capacitor Cst may be connected to the gate electrode of the driving thin-film transistor T1, connected to the drain electrode of the compensation thin-film transistor T3, and connected to the source electrode of the first initialization thin-film transistor T4.

The opposite electrode (e.g., a cathode) of the light-emitting element ED may receive the common voltage ELVSS. The light-emitting element ED may emit light by receiving the driving current from the driving thin-film transistor T1.

The pixel circuit PC is not limited to the number of thin-film transistors and the number of storage capacitors described with reference to FIGS. 9A and 9B, the number of thin-film transistors, the number of storage capacitors, and the circuit design may be variously changed in a suitable manner.

The pixel circuit PC driving the main sub-pixel Pm may be the same as or different from the pixel circuit PC driving the auxiliary sub-pixel Pa. As an example, the pixel circuit PC driving the main sub-pixel Pm and the auxiliary sub-pixel Pa may be the pixel circuit PC shown in FIG. 9B. In another embodiment, the pixel circuit PC driving the main sub-pixel Pm may employ the pixel circuit PC shown in FIG. 9B, and the pixel circuit PC driving the auxiliary sub-pixel Pa may employ the pixel circuit PC shown in FIG. 9A.

Figure 10:
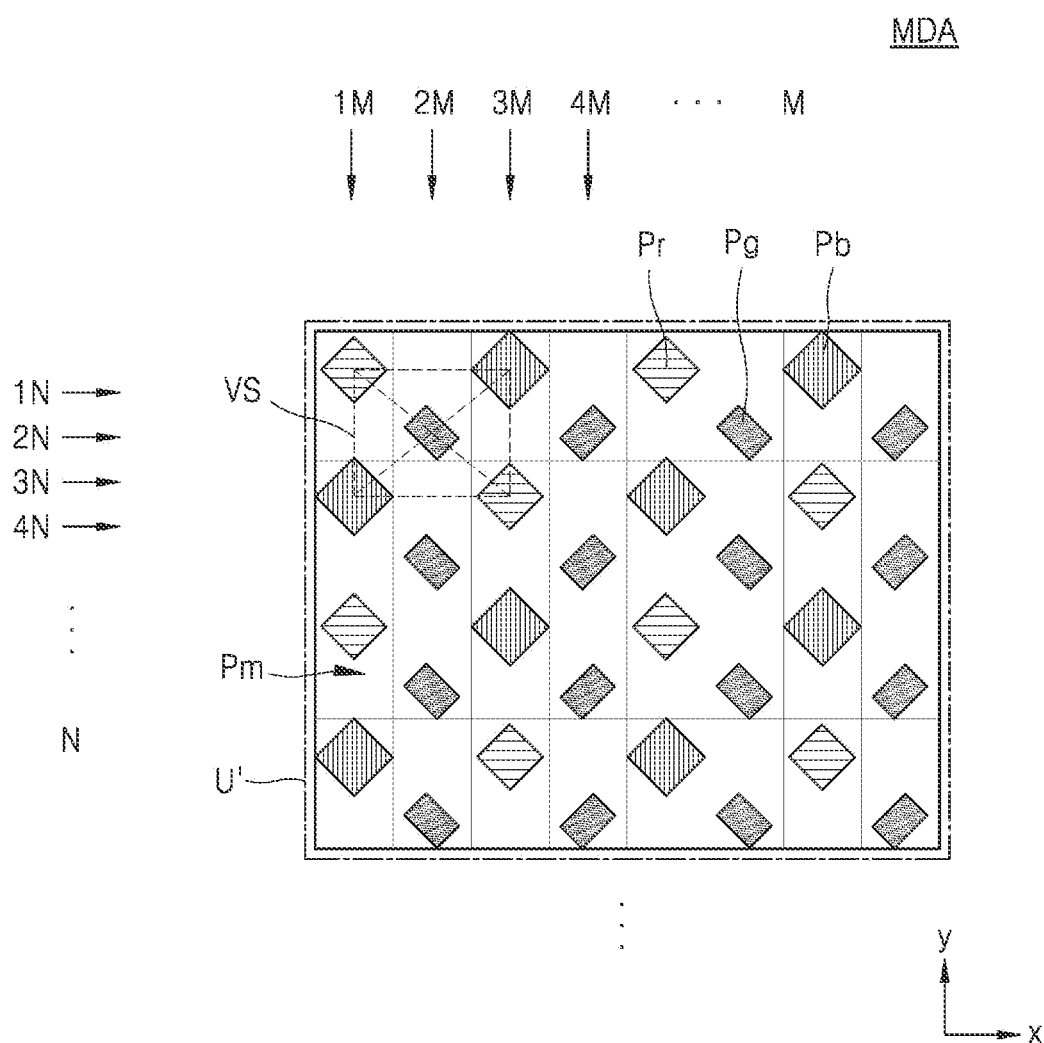
FIG. 10 is an arrangement view of a pixel arrangement structure in a main display area of a display panel according to an embodiment.

FIG. 10 is an arrangement view of a pixel arrangement structure in the main display area MDA of the display panel 10 according to an embodiment.

Referring to FIG. 10, the plurality of main sub-pixels Pm may be arranged in the main display area MDA. In the present specification, a sub-pixel is a minimum unit that displays an image and denotes an emission area. In the case where an organic light-emitting diode is employed as a display element, the emission area may be defined by an opening of a pixel-defining layer. This is described in more detail below.

As shown in FIG. 10, the main sub-pixels Pm arranged in the main display area MDA may be arranged in a Pentile® structure (PENTILE® is a registered trademark of Samsung Display Co., Ltd., Republic of Korea). A red sub-pixel Pr, a green sub-pixel Pg, and a blue sub-pixel Pb may respectively implement a red color, a green color, and a blue color.

A plurality of red sub-pixels Pr and a plurality of blue sub-pixels Pb are alternately arranged with each other on a first row 1N. A plurality of green sub-pixels Pg on a neighboring second row 2N are spaced from (e.g., spaced apart from) each other by a set or preset interval. Blue sub-pixels Pb and red sub-pixels Pr are alternately arranged with each other on a neighboring third row 3N. A plurality of green sub-pixels Pg on a neighboring fourth row 4N are spaced from (e.g., spaced apart from) each other by a set or preset interval from each other. This pixel arrangement is repeated to an N-th row. In this case, the blue sub-pixel Pb and the red sub-pixel Pr may be greater in size than the green sub-pixel Pg.

The plurality of red sub-pixels Pr and blue sub-pixels Pb on the first row 1N and the plurality of green sub-pixels Pg on the second row 2N may be alternately arranged with each other. Accordingly, red sub-pixels Pr and blue sub-pixels Pb are alternately arranged with each other on a first column 1M. A plurality of green sub-pixels Pg on a neighboring second column 2M are spaced from (e.g., spaced apart from) each other by a set or preset interval. Blue sub-pixels Pb and red sub-pixels Pr are alternately arranged with each other on a neighboring third column 3M. A plurality of green sub-pixels Pg on a neighboring fourth column 4M are space from (e.g., spaced apart from) each other by a set or preset interval. This pixel arrangement is repeated to an M-th column.

The pixel arrangement structure may be expressed in a different way in which: red sub-pixels Pr are respectively arranged on first and third vertexes among the vertexes of a virtual quadrangle VS with a green sub-pixel Pg centered at the center of the quadrangle, and blue sub-pixels Pb are respectively arranged on second and fourth vertexes, which are the rest of the vertexes. In this case, the virtual quadrangle VS may be variously changed in a suitable manner to a rectangle, a rhombus, a square, etc.

This pixel arrangement structure is referred to as a Pen-Tile® matrix structure or a PenTile® structure. By applying rendering, in which a color of a pixel is represented by sharing the colors of its adjacent pixels, a high resolution may be obtained via a small number of pixels.

Though it is shown in FIG. 10 that the plurality of main sub-pixels Pm are arranged in a PenTile® matrix structure, the present disclosure is not limited thereto. As an example, a plurality of main sub-pixels Pm may be arranged in various suitable configurations such as a stripe structure, a mosaic arrangement structure, and/or a delta arrangement structure.

FIGS. 11A-11D are arrangement views of a pixel arrangement structure in the component area CA of the display panel 10 according to embodiments.

Referring to FIGS. 11A-11D, a plurality of auxiliary sub-pixels Pa may be arranged in the component area CA. Each auxiliary sub-pixel Pa may emit red light, green light, blue light, or white light.

The component area CA may include a pixel group PG and a transmission area TA, the pixel group PG including at least one auxiliary sub-pixel Pa. Pixel groups PG and transmission areas TA are alternately arranged with each other in a y-direction and arranged, for example, in a lattice configuration. In this case, the component area CA may include a plurality of pixel groups PG and a plurality of transmission areas TA.

Figure 11A:
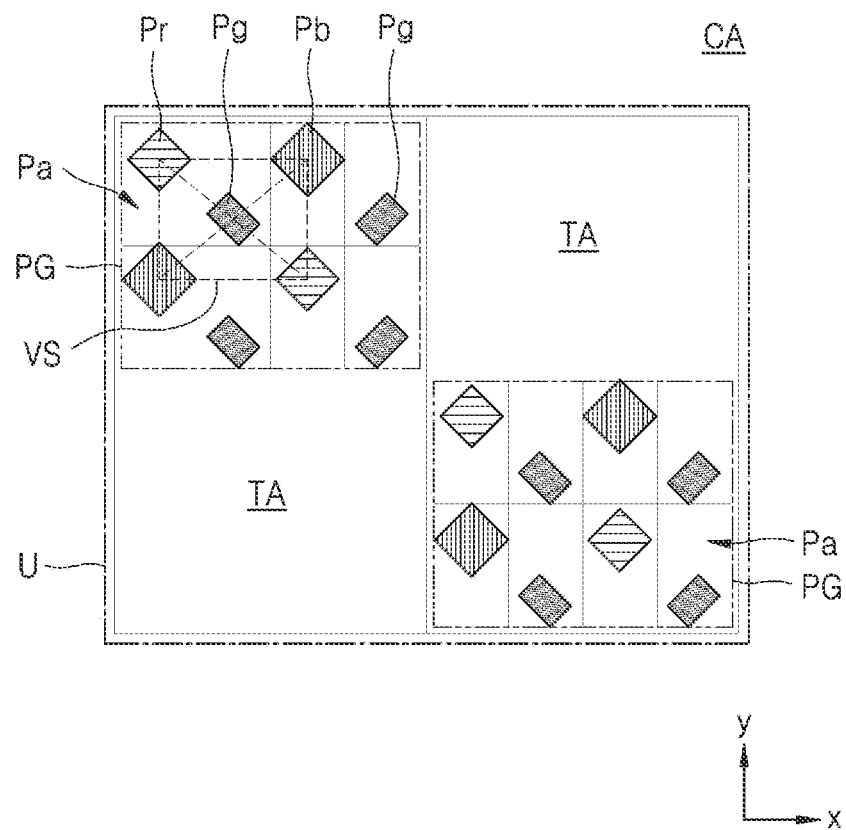

The pixel group PG may be defined as a sub-pixel set that binds a plurality of auxiliary sub-pixels Pa on a basis set in advance. As an example, as shown in FIG. 11A, one pixel group PG may include eight auxiliary sub-pixels Pa arranged in a Pentile® structure. That is, one pixel group PG may include two red sub-pixels Pr, four green sub-pixels Pg, and two blue sub-pixels Pb.

A basic unit U may be repeatedly arranged in the x-direction and the y-direction in the component area CA, a set or preset number of pixel groups PG and a set or preset number of transmission areas TA being bound in the basic unit U. In FIG. 11A, the basic unit U may have a shape in which two pixel groups PG and two transmission areas TA arranged therearound are bound in a quadrangular shape. The basic unit U denotes a repeated shape that is partitioned and does not refer to disconnection in the configuration.

A corresponding unit U' may be set in the main display area MDA and the corresponding unit U' may have an area that is the same as or equal to the area of the basic unit U (e.g., see FIG. 10). In this case, the number of main sub-pixels Pm included in the corresponding unit U' may be greater than the number of auxiliary sub-pixels Pa included in the basic unit U. That is, a ratio of the number of auxiliary sub-pixels Pa to the number of main sub-pixels Pm per same area may be 1:2, in which the number of auxiliary sub-pixels Pa included in the basic unit U is 16, and the number of main sub-pixels Pm included in the corresponding unit U' is 32.

The arrangement structure of the auxiliary sub-pixels Pa shown in FIG. 11A is a Pentile® structure, and a pixel arrangement structure of the component area CA having a resolution that is ½ of the resolution of the main display area MDA is referred to as a ½-Pentile® structure. The number of auxiliary sub-pixels Pa or the arrangement method of auxiliary sub-pixels Pa included in the pixel group PG may be changed depending on the resolution of the component area CA.

Referring to FIG. 11B, the pixel arrangement structure of the component area CA may be an S-stripe structure. In the illustrated embodiment, auxiliary sub-pixels included in one pixel group PG may include a total of three auxiliary sub-pixels Pa including a red sub-pixel Pr, a green sub-pixel Pg, and a blue sub-pixel Pb.

In the illustrated embodiment, a red sub-pixel Pr and a green sub-pixel Pg may be alternately arranged with each other on a first column 1I. A blue sub-pixel Pb may be arranged on a neighboring second column 2I. In this case, the red sub-pixel Pr and the green sub-pixel Pg may be provided in a quadrangular shape having a long side in the x-direction. The blue sub-pixel Pb may be arranged in a quadrangular shape having a long side in the y-direction. The length of the blue sub-pixel Pb may be equal to or greater than a sum of the length of the red sub-pixel Pr in the y-direction and the length of the green sub-pixel Pg in the y-direction. Accordingly, the size of the blue sub-pixel Pb may be greater than the sizes of the red sub-pixel Pr and the green sub-pixel Pg.

Figure 11C:
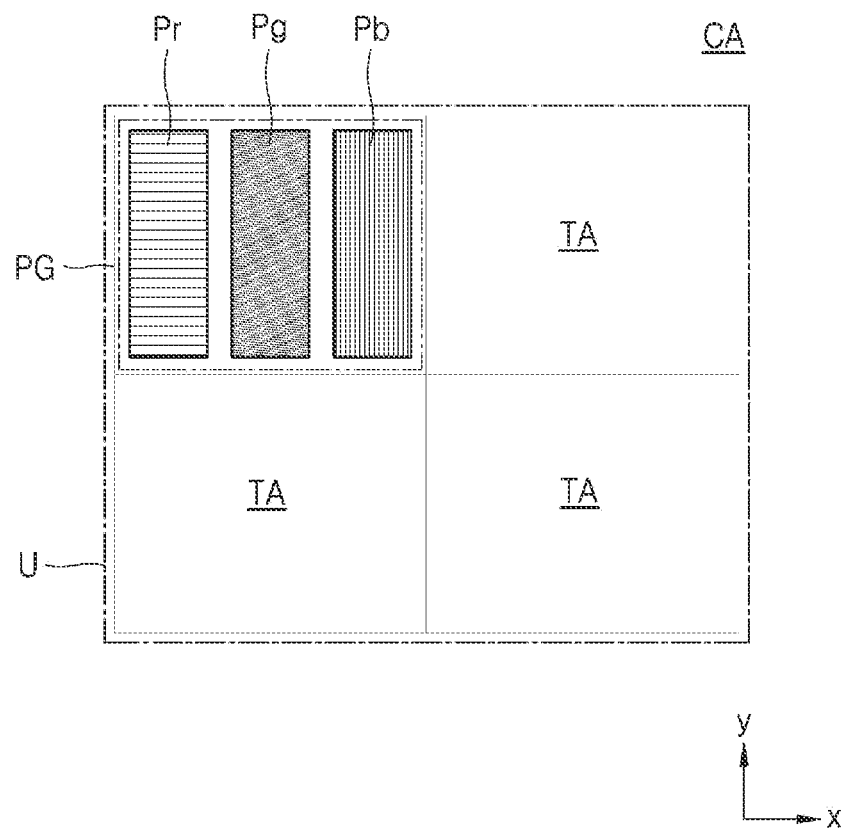

In the illustrated embodiment, the area of the basic unit U occupied by one pixel group PG may be about ¼ of the area of the basic unit U. Though it is shown in FIGS. 11B and 11C that the basic unit U includes only one pixel group PG, the basic unit U may include two or more pixel groups PG in another embodiment. In addition, the area of the auxiliary sub-pixels Pa included in the pixel group PG may be variously changed in a suitable manner.

Referring to FIG. 11C, the pixel arrangement structure of the component area CA may be a stripe structure. That is, a red sub-pixel Pr, a green sub-pixel Pg, and a blue sub-pixel Pb may be arranged side by side in the x-direction. In this case, the red sub-pixel Pr, the green sub-pixel Pg, and the blue sub-pixel Pb may each have a long side in the y-direction.

Alternatively, unlike the embodiment shown in FIG. 11C, the red sub-pixel Pr, the green sub-pixel Pg, and the blue sub-pixel Pb may be arranged side by side in the y-direction. In this case, the red sub-pixel Pr, the green sub-pixel Pg, and the blue sub-pixel Pb may each have a long side in the x-direction.

Figure 11D:
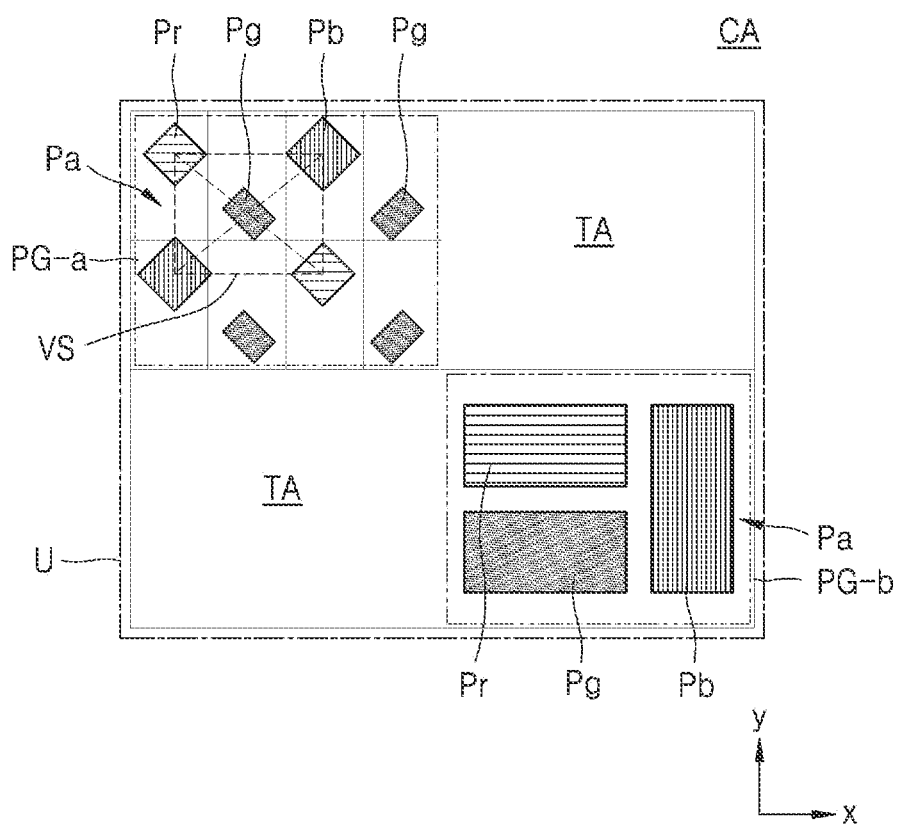

Referring to FIG. 11D, the component area CA may include at least two auxiliary pixel groups PG-a and PG-b having different pixel arrangements. The pixel arrangement structures described as an example in FIGS. 11A-11C are applicable to the at least two auxiliary pixel groups PG-a and PG-b. As an example, one of the at least two auxiliary pixel groups PG-a and PG-b may be arranged in a Pentile® structure, and the other one of the at least two auxiliary pixel groups PG-a and PG-b may be arranged in an S-stripe structure.

The arrangement of the auxiliary sub-pixels Pa in the component area CA is not limited thereto. As an example, the auxiliary sub-pixels Pa may be arranged in a circular shape, and/or the number of auxiliary sub-pixels may be any suitable number (e.g., less than the number of auxiliary sub-pixels described above).

In addition, the shapes of the transmission areas TA described above may be different from each other depending on the position of the component area CA. This is described below in more detail.

Figure 12A:
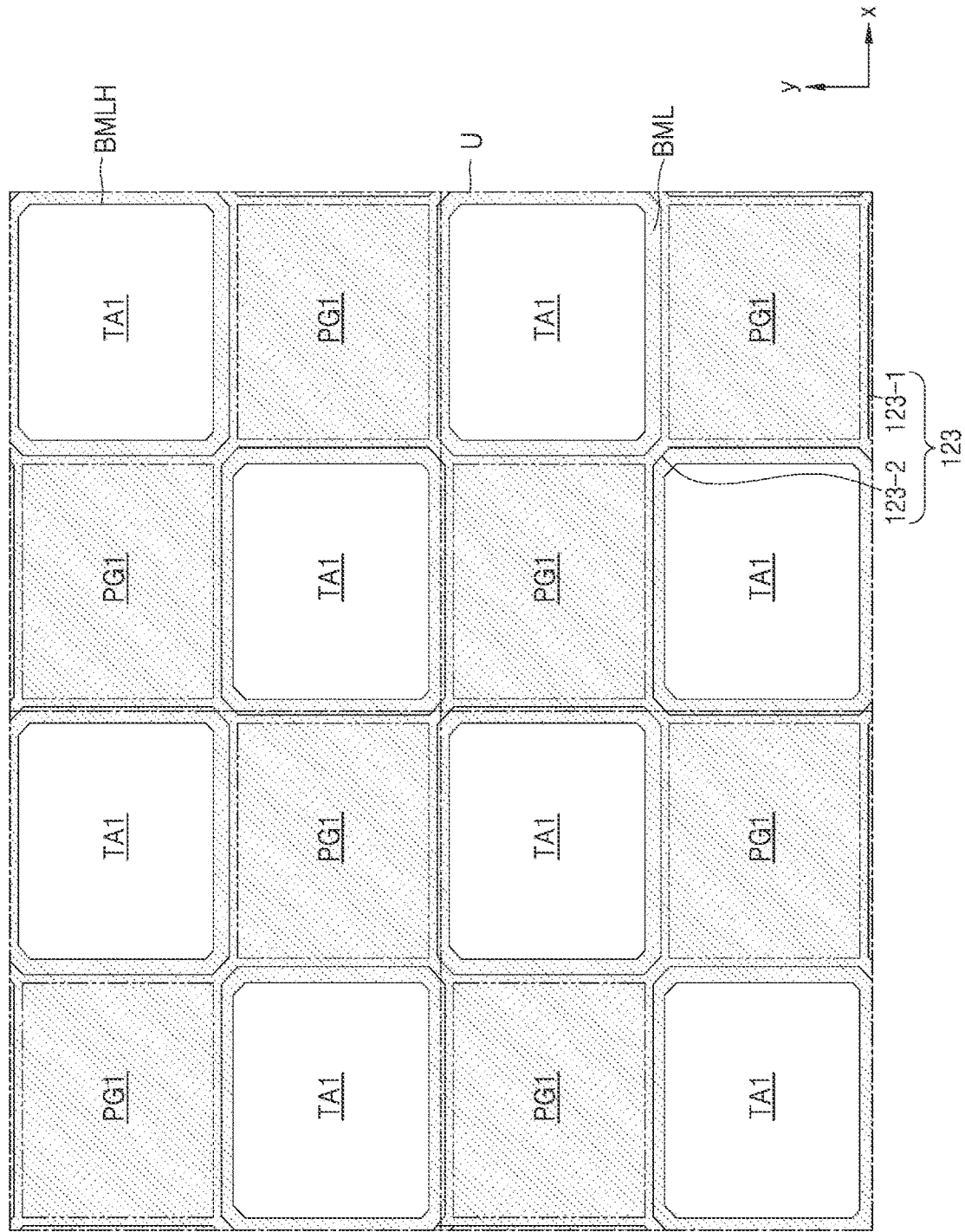
FIGS. 12A and 12B are plan views of the shape of a bottom metal layer in a first component area of a component area according to embodiments.
Figure 12B:
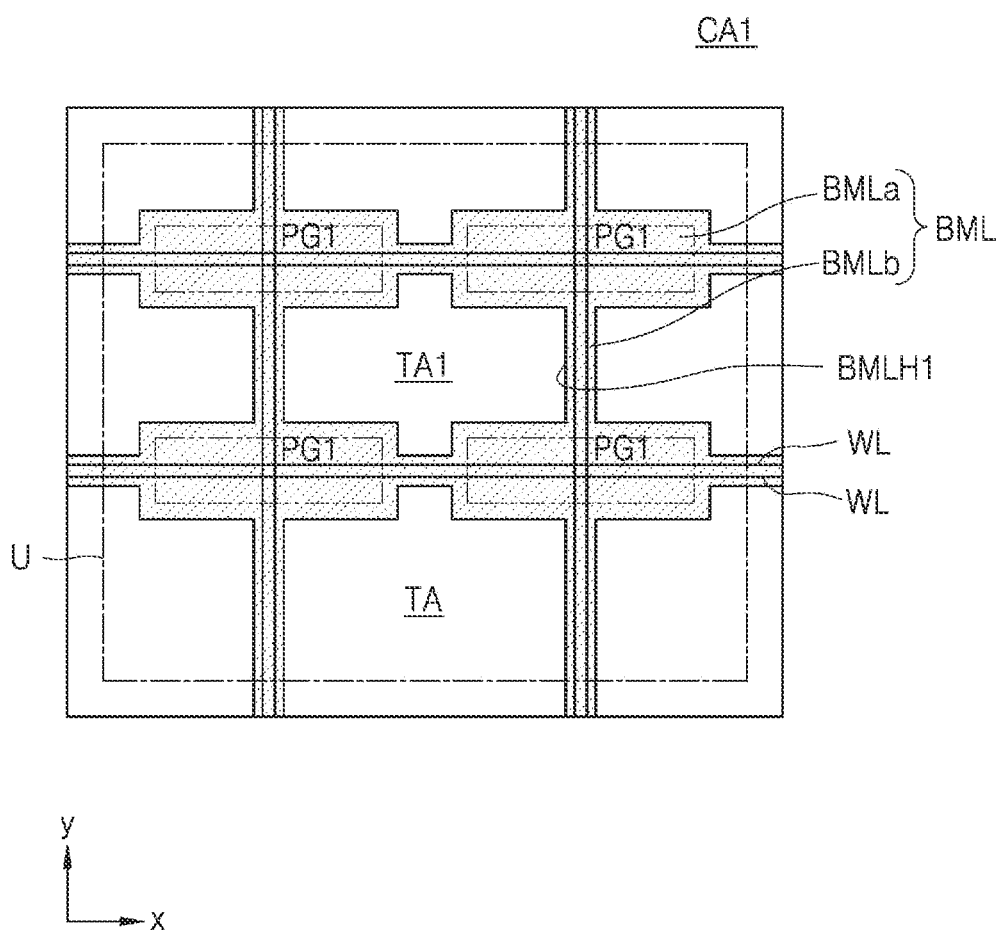

FIGS. 12A and 12B are plan views of the shape of the bottom metal layer BML in the first component area CA1 of the component area CA according to embodiments.

Referring to FIGS. 12A and 12B, the bottom metal layer BML may be arranged to correspond to the component area CA and may include a bottom-hole BMLH. The shapes and sizes of the bottom metal layer BML and the bottom-hole BMLH may be variously provided in a suitable manner.

In this case, the bottom metal layer BML may include a first bottom-hole BMLH1 arranged in the first component area CA1. In this case, the first bottom-hole BMLH1 may correspond to a first transmission area TA1 arranged in the first component area CA1. The first bottom-hole BMLH1 may have various suitable shapes. The first bottom-hole BMLH1 may have a shape including a corner that has a vertex. As an example, the planar shape of the first bottom-hole BMLH1 may be a cross shape, a polygonal shape, etc. Hereinafter, for convenience of description, the case where the first bottom-hole BMLH1 is polygonal is described in more detail below.

Referring to FIG. 12A, the first bottom-hole BMLH1 is provided in an octagon and may not correspond to the first pixel group PG1. In this case, the shape and size of the first transmission area TA1 may be defined by the shape and size of the first bottom-hole BMLH1. In a plan view, two first bottom-holes BMLH1 may be provided per basic unit U and alternately arranged with the first pixel groups PG1.

The bottom metal layer BML may be arranged in various suitable shapes. As an example, as shown in FIG. 12A, the bottom metal layer BML may be arranged to overlap (e.g., overlap in the z-direction or the thickness direction) the first pixel group PG1 and may not be arranged in the transmission area TA1 in a plan view. In another embodiment, the bottom metal layer BML may be arranged only in a region excluding the first pixel group PG1 and the first transmission area TA1 shown in FIG. 12A. In this case, in a plan view, the bottom metal layer BML may be arranged in a region between the opposite electrode 123 of the first pixel group PG1 and the first transmission area TA1 to define the first transmission area TA1. In this case, the periphery of the first transmission area TA1 may be defined by at least one of the opposite electrode 123 of the first pixel group PG1 or the bottom metal layer BML.

In this case, the opposite electrode 123 may include a first opposite electrode 123-1 and a second opposite electrode 123-2. The first opposite electrode 123-1 may be arranged in the first pixel group PG1, and the second opposite electrode 123-2 may connect the first opposite electrodes 123-1 spaced from (e.g., spaced apart from) each other. In this case, the second opposite electrode 123-2 may be arranged in an oblique direction with respect to a first direction (e.g., one of the x-direction and the y-direction) or the second direction (e.g., the other one of the x-direction and the y-direction) to connect neighboring first opposite electrodes 123-1.

In this case, as described above, the bottom metal layer BML may be arranged over the substrate 100 to overlap (e.g., overlap in the z-direction or the thickness direction) the first opposite electrode 123-1 and the second opposite electrode 123-2 in a plan view. In this case, in a plan view, the first opposite electrode 123-1 and the second opposite electrode 123-2 may be arranged inside the bottom metal layer BML.

In an embodiment, wirings may be arranged in a region in which the bottom metal layer BML is arranged. That is, the wirings may detour the first transmission area TA1 not to be arranged in the first transmission area TA1. In this case, at least one of the wirings may be bent or round in at least a portion thereof.

Referring to FIG. 12B, the bottom metal layer BML may include a first bottom metal layer BMLa and a second bottom metal layer BMLb. The first bottom metal layer BMLa may correspond to the first pixel group PG1, and the second bottom metal layer BMLb may be arranged between one of the first pixel group PG1 and another one of the first pixel group PG1 (e.g., between adjacent ones of the first pixel group PG1). The width of the second bottom metal layer BMLb may be less than the width of the first bottom metal layer BMLa. The first bottom metal layer BMLa and the second bottom metal layer BMLb may be provided as one body. In other words the first bottom metal layer BMLa and the second bottom metal layer BMLb may be integral with each other (e.g., form one monolithic structure). Accordingly, in this case, the shape of the first bottom-hole BMLH1 may be provided in a (+) shape.

In this case, wirings WL may be arranged in a region in which the bottom metal layer BML is arranged. In this case, diffraction of light due to a slit formed between the wirings WL may be blocked. In this case, the wirings WL may include various suitable wirings. As an example, the wirings WL may be various suitable lines such as a data line, a driving voltage line, and/or a scan line.

In a plan view, the wirings WL may overlap the region in which the bottom metal layer BML is arranged and pass through a region in which the first pixel group PG1 is arranged. In this case, the wirings WL may detour the first transmission area TA1. That is, the wirings WL may not overlap the first transmission area TA1 in a plan view. Accordingly, the wirings WL do not pass through the first transmission area TA1, and thus, may not influence a transmittance of the first transmission area TA1 and may prevent or substantially prevent diffraction from occurring at the first transmission area TA1 due to the wirings WL. The wirings WL may define the periphery of the first transmission area TA1. That is, the wirings WL may be arranged outside the periphery of the first transmission area TA1 to define the first transmission area TA1. Hereinafter, for convenience of description, the case where the bottom metal layer BML defines the first transmission area TA1 is described in more detail below.

With regard to the arrangement of the bottom metal layer BML, in an embodiment, in the case where the optical functional layer OFL shown in FIG. 7C is provided, instead of the bottom metal layer BML, the black matrix 183 of the optical functional layer OFL may have a shape that is the same as or similar to the shape of the bottom metal layer BML, and thus, define the first transmission area TA1. In this case, the bottom metal layer BML may have the same shape as the black matrix 183. That is, in this case, as shown in FIG. 12A, the black matrix 183 may include a hole 183-1 defining the first transmission area TA1.

Figure 13A:
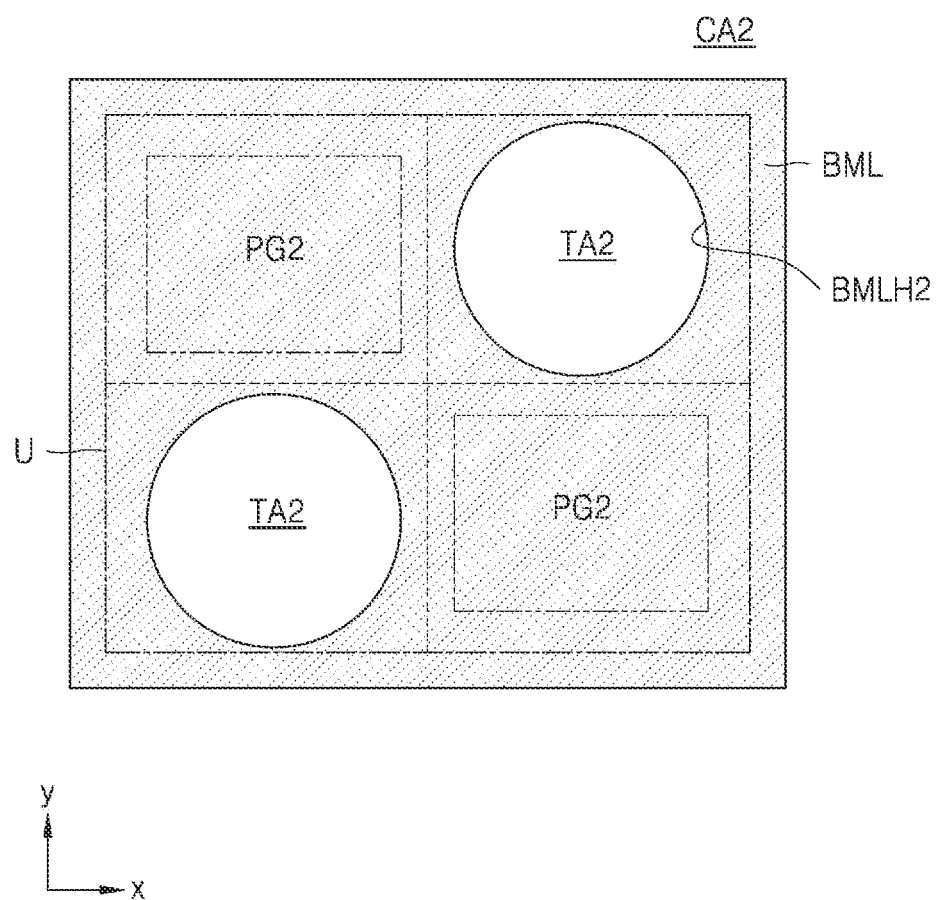
FIGS. 13A and 13B are plan views of the shape of a bottom metal layer in a second component area of a component area according to embodiments.
Figure 13B:
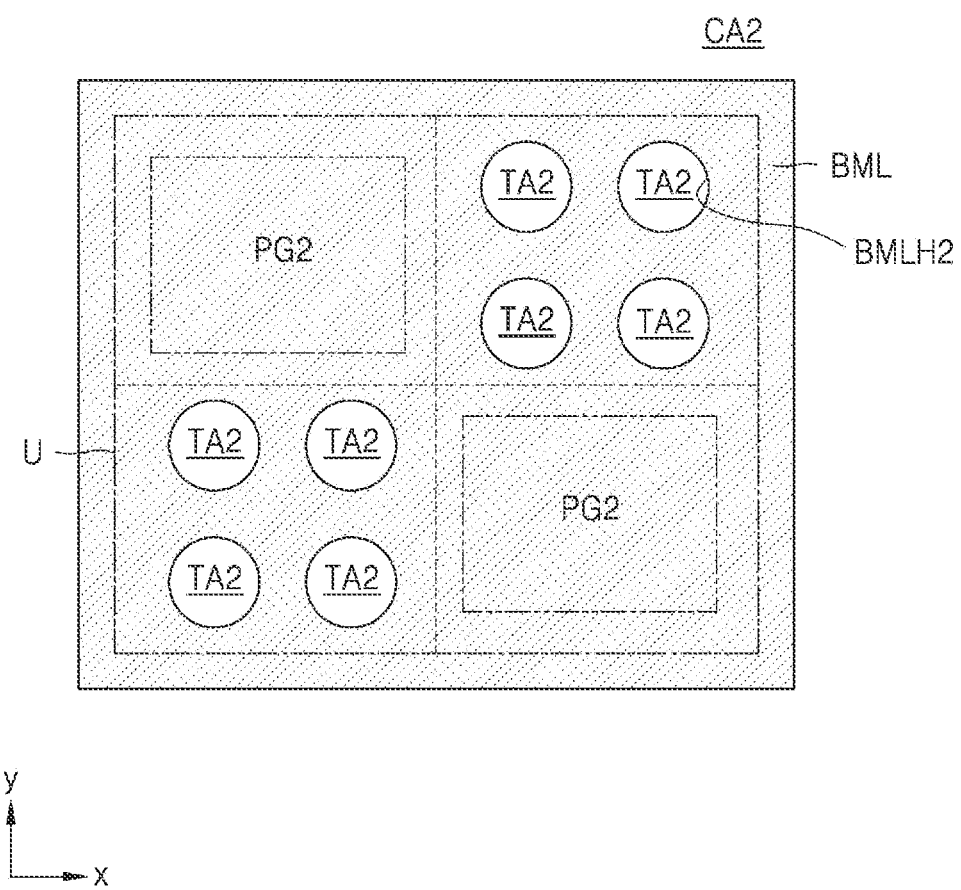

FIGS. 13A and 13B are plan views of the shape of the bottom metal layer BML in the second component area CA2 of the component area CA according to embodiments.

Referring to FIGS. 13A and 13B, the bottom metal layer BML may be arranged also in the second component area CA2 in addition to the first component area CA1. In this case, the bottom metal layer BML arranged in the second component area CA2 may include a second bottom-hole BMLH2 to correspond to a second transmission area TA2. The second bottom-hole BMLH2 may be different from the first bottom-hole BMLH1.

In an embodiment, the second bottom-hole BMLH2 may be provided in a circular shape. When the second transmission area TA2 is provided in an approximately circular shape (e.g., a circular shape), a diffraction characteristic of light is reduced, and thus, in the case where a component arranged below the second component area CA2 is a camera, the second transmission area TA2 may be provided in an approximately circular shape (e.g., a circular shape). The second bottom-hole BMLH2 may be substantially provided in a circular or elliptical shape. A single second bottom-hole BMLH2 may be provided or a plurality of second bottom-holes BMLH2 may be provided between second pixel groups PG2. Various suitable modifications may be made.

The second bottom-hole BMLH2 may define the second transmission area TA2 of the second component area CA2. In this case, the second transmission area TA2 may have a substantially circular or elliptical shape to correspond to the shape of the second bottom-hole BMLH2.

In this case, the first component area CA1 has a shape having an angled corner to increase a transmittance of the first component area CA1, and thus, may increase an amount of data sensed by the component 40 corresponding to the first component area CA1. Particularly, in the case where the component 40 is a camera, an amount of light incident through the first transmission area TA1 increases, and thus, the resolution may be improved.

In addition, in the case where the second component area CA2 has a shape having substantially no angled corner such as a circular or elliptical shape, diffraction is reduced, and thus, data sensed by the component 40 corresponding to the position of the second component area CA2 may not be distorted. Particularly, in the case where the component 40 is a camera, an issue that an image photographed by the camera corresponding to the position of the second component area CA2 is blurred may be resolved.

Accordingly, in this case, the display panel 10 may obtain data of maximum or improved accuracy and clearness at the central portion of the component 40 arranged in the component area CA and reduce the distortion of data at the outer portion of the component 40.

In an embodiment, the bottom metal layer BML may be applied to a black matrix to define a transmission area.

Figure 14:
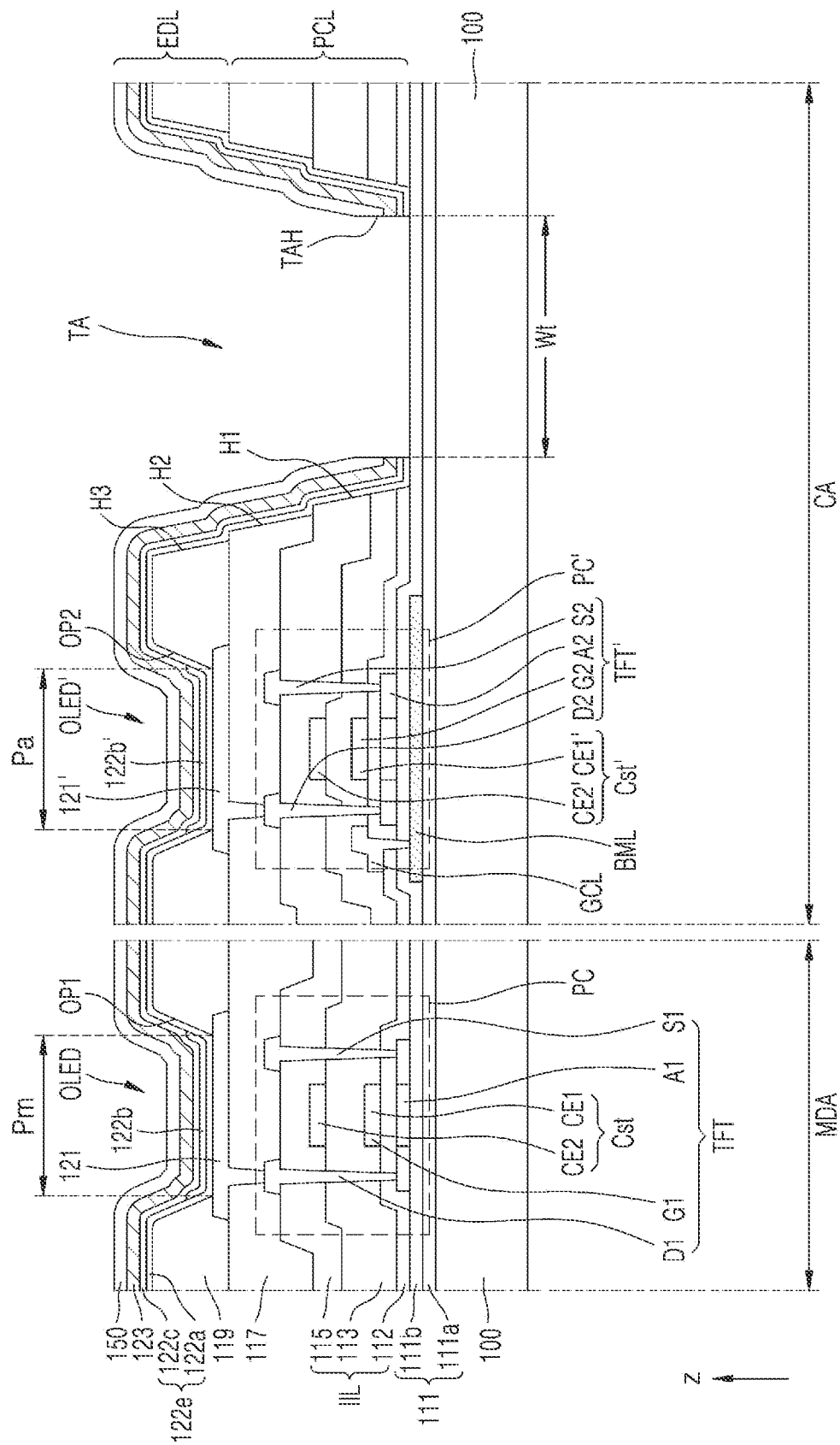
FIG. 14 is a cross-sectional view of a portion of a display panel according to an embodiment.

FIG. 14 is a cross-sectional view of a portion of the display panel 10 according to an embodiment. FIG. 14 is a cross-sectional view of the main display area MDA and the component area CA.

Referring to FIG. 14, the display panel 10 includes the main display area MDA and the component area CA. The main sub-pixels Pm are arranged in the main display area MDA. The auxiliary sub-pixels Pa and the transmission areas TA are arranged in the component area CA. A main pixel circuit PC and a main organic light-emitting diode OLED as a display element may be arranged in the main display area MDA. The main pixel circuit PC may include a main thin-film transistor TFT and a main storage capacitor Cst, and the main organic light-emitting diode OLED may be connected to the main pixel circuit PC. An auxiliary pixel circuit PC' and an auxiliary organic light-emitting diode OLED' as a display element may be arranged in the component area CA. The auxiliary pixel circuit PC' may include an auxiliary thin-film transistor TFT' and an auxiliary storage capacitor Cst', and the auxiliary organic light-emitting diode OLED' may be connected to the auxiliary pixel circuit PC'.

In this case, a first auxiliary pixel circuit and a first auxiliary organic light-emitting diode as a first display element may be arranged in the first component area. The first auxiliary pixel circuit may include a first auxiliary thin-film transistor and a first auxiliary storage capacitor, and the first auxiliary organic light-emitting diode may be connected to the first auxiliary pixel circuit. In addition, a second auxiliary pixel circuit and a second auxiliary organic light-emitting diode as a second display element may be arranged in the second component area. The second auxiliary pixel circuit may include a second auxiliary thin-film transistor and a second auxiliary storage capacitor, and the second auxiliary organic light-emitting diode may be connected to the second auxiliary pixel circuit. In this case, the first auxiliary pixel circuit including the first auxiliary thin-film transistor and the first auxiliary storage capacitor, and the first auxiliary organic light-emitting diode as the first display element connected to the first auxiliary pixel circuit are the same as or similar to the second auxiliary pixel circuit including the second auxiliary thin-film transistor and the second auxiliary storage capacitor, and the second auxiliary organic light-emitting diode as the second display element connected to the second auxiliary pixel circuit. Thus, hereinafter, for convenience of description, the component area CA shown in the FIG. 14 is described in more detail.

In the illustrated embodiment, the case where an organic light-emitting diode is employed as a display element is used as an example. In another embodiment, an inorganic light-emitting element or a quantum-dot light-emitting element may be employed as a display element.

Hereinafter, a structure in which elements included in the display panel 10 are stacked is described in more detail. The display panel 10 may include the substrate 100, a buffer layer 111, the circuit layer PCL, and the display element layer EDL that are stacked.

As described above, the substrate 100 may include an insulating material such as glass, quartz, and/or a polymer resin. The substrate 100 may be a rigid substrate and/or a flexible substrate that is bendable, foldable, and/or rollable.

The buffer layer 111 may be arranged on the substrate 100, may reduce or block the penetration of foreign substance, moisture, and/or external air from below the substrate 100, and provide a flat surface on the substrate 100. The buffer layer 111 may include an inorganic material such as oxide or nitride, an organic material, or an organic/inorganic composite material, and a single-layer or multi-layer structure including an inorganic material and/or an organic material. A barrier layer may be further arranged between the substrate 100 and the buffer layer 111. The barrier layer may reduce or block the penetration of external air. In an embodiment, the buffer layer 111 may include silicon oxide ($SiO_2$) or silicon nitride ($SiN_x$). The buffer layer 111 may include a first buffer layer 111a and a second buffer layer 111b that are stacked.

In the component area CA, the bottom metal layer BML may be arranged between the first buffer layer 111a and the second buffer layer 111b. In another embodiment, the bottom metal layer BML may be arranged between the substrate 100 and the first buffer layer 111a. The bottom metal layer BML may be arranged below the auxiliary pixel circuit PC' to prevent or substantially prevent the characteristic of the auxiliary thin-film transistor TFT' from being deteriorated due to light emitted from the component, etc. In addition, the bottom metal layer BML may prevent or substantially prevent light from being diffracted through a narrow gap between the wirings connected to the auxiliary pixel circuit PC', the light being emitted from the component, etc. or propagating toward the component. In an embodiment, there is no bottom metal layer BML in the transmission area TA.

In addition, the bottom metal layer BML may be connected to a line GCL arranged on a different layer through a contact hole. The bottom metal layer BML may receive a constant voltage or signal from the line GCL. As an example, the bottom metal layer BML may receive the driving voltage ELVDD or a scan signal. The bottom metal layer BML receives a constant voltage or signal, and thus, may reduce (e.g., remarkably reduce) a probability that electrostatic discharge occurs. The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML may include a single layer or a multi-layer structure including the above materials.

The circuit layer PCL may be arranged on the buffer layer 111 and may include the pixel circuits (e.g., the main pixel circuit PC and/or the auxiliary pixel circuit PC'), a first gate insulating layer 112, a second gate insulating layer 113, an interlayer insulating layer 115, and a planarization layer 117. The main pixel circuit PC may include the main thin-film transistor TFT and the main storage capacitor Cst. The auxiliary pixel circuit PC' may include the auxiliary thin-film transistor TFT' and the auxiliary storage capacitor Cst'.

The main thin-film transistor TFT and the auxiliary thin-film transistor TFT' may be arranged on the buffer layer 111. The main thin-film transistor TFT includes a first semiconductor layer A1, a first gate electrode G1, a first source electrode S1, and a first drain electrode D1. The auxiliary thin-film transistor TFT' includes a second semiconductor layer A1, a first gate electrode G1, a first source electrode S1, and a first drain electrode D1. The main thin-film transistor TFT may be connected to the main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'.

The first semiconductor layer A1 and the second semiconductor layer A2 may be arranged on the buffer layer 111 and may include polycrystalline silicon. In another embodiment, the first semiconductor layer A1 and the second semiconductor layer A2 may each include amorphous silicon. In another embodiment, the first semiconductor layer A1 and the second semiconductor layer A2 may each include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 and the second semiconductor layer A2 may each include a channel region, a source region, and a drain region. The source region and the drain region may be doped with impurities.

The second semiconductor layer A2 may overlap (e.g., overlap in the z-direction or the thickness direction) the bottom metal layer BML with the second buffer layer 111b therebetween. In an embodiment, the width of the second semiconductor layer A2 may be less than the width of the bottom metal layer BML. Accordingly, when projected in a direction perpendicular to the substrate 100, the second semiconductor layer A2 may entirely overlap (e.g., overlap in the z-direction or the thickness direction) the bottom metal layer BML.

The first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multi-layer structure including the above inorganic insulating materials.

The first gate electrode G1 and the second gate electrode G2 are arranged on the first gate insulating layer 112 to respectively overlap (e.g., overlap in the z-direction or the thickness direction) the first semiconductor layer A1 and the second semiconductor layer A2. The first gate electrode G1 and the second gate electrode G2 may include at least one of molybdenum (Mo), aluminum (Al), copper (Cu), or titanium (Ti) and include a single layer or a multi-layer structure. As an example, the first gate electrode G1 and the second gate electrode G2 may each include a single Mo layer.

The second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may include a single layer or a multi-layer structure including one or more of the above inorganic insulating materials.

A first top electrode CE2 of the main storage capacitor Cst and a second top electrode CE2' of the auxiliary storage capacitor Cst' may be arranged on the second gate insulating layer 113.

In the main display area MDA, the first top electrode CE2 may overlap the first gate electrode G1 therebelow. The first gate electrode G1 and the first top electrode CE2 overlapping each other with the second gate insulating layer 113 therebetween may constitute the main storage capacitor Cst. The first gate electrode G1 may serve as a first bottom electrode CE1 of the main storage capacitor Cst.

In the component area CA, the second top electrode CE2' may overlap the second gate electrode G2 therebelow. The second gate electrode G2 and the second top electrode CE2' overlapping each other with the second gate insulating layer 113 therebetween may constitute the auxiliary storage capacitor Cst'. The second gate electrode G2 may serve as a second bottom electrode CE1 of the auxiliary storage capacitor Cst'.

The first top electrode CE2 and the second top electrode CE2' may each include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer structure including the above materials.

The interlayer insulating layer 115 may cover the first top electrode CE2 and the second top electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The interlayer insulating layer 115 may include a single layer or a multi-layer structure including the above inorganic insulating materials.

Assuming that the first gate insulating layer 112, the second gate insulating layer 113, and the interlayer insulating layer 115 are collectively referred as an inorganic insulating layer IIL, the inorganic insulating layer IIL may have a first hole H1 corresponding to the transmission area TA. The first hole H1 may expose the buffer layer 111 or a portion of the top surface of the substrate 100. The first hole H1 may include an opening of the first gate insulating layer 112, an opening of the second gate insulating layer 113, and an opening of the interlayer insulating layer 115 that overlap one another (e.g., overlap one another in the z-direction or the thickness direction) and correspond to the transmission area TA. These openings may be respectively formed through separate processes or concurrently (e.g., simultaneously) formed through the same process. In the case where these openings are formed separate processes, the inner surface of the first hole H1 may not be smooth and may have a step difference such as a step shape.

In another embodiment, the inorganic insulating layer IIL may include a groove instead of the first hole H1 exposing the buffer layer 111. Alternatively, the inorganic insulating layer IIL may not include the first hole H1 or groove corresponding to the transmission area TA. The inorganic insulating layer IIL may have an inorganic insulating material having an excellent light transmittance, and thus, even though the inorganic insulating layer IIL does not include a hole or groove corresponding to the transmission area TA, the inorganic insulating layer IIL may have a sufficient light transmittance to allow the component 40 (e.g., see FIG. 2) to transmit and/or receive a sufficient amount of light.

The source electrodes (e.g., the first and second source electrodes S1 and S2) and the drain electrodes (e.g., the first and second drain electrodes D1 and D2) may be arranged on the interlayer insulating layer 115. The source electrodes (e.g., the first and second source electrodes S1 and S2) and the drain electrodes (e.g., the first and second drain electrodes D1 and D2) may include a conductive material including molybdenum (Mo), aluminum (Al), copper (Cu), and/or titanium (Ti) and include a single layer or a multi-layer structure including the above materials. As an example, the source electrodes (e.g., the first and second source electrodes S1 and S2) and the drain electrodes (e.g., the first and second drain electrodes D1 and D2) may have a multi-layer structure of Ti/Al/Ti.

The planarization layer 117 may cover the source electrodes (e.g., the first and second source electrodes S1 and S2) and the drain electrodes (e.g., the first and second drain electrodes D1 and D2). The planarization layer 117 may include a flat top surface such that a first pixel electrode 121 and a second pixel electrode 121' arranged thereon may be formed flat.

The planarization layer 117 may include an organic material or an inorganic material and include a single-layer or multi-layer structure. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, and/or a vinyl alcohol-based polymer. The planarization layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). When forming the planarization layer 117, to provide the flat top surface after forming the planarization layer 117, chemical and mechanical polishing may be performed on the top surface of the planarization layer 117.

The planarization layer 117 may have a second hole H2 corresponding to the transmission area TA. The second hole H2 may overlap (e.g., overlap in the z-direction or the thickness direction) the first hole H1. In an embodiment, as shown in FIG. 14, the second hole H2 is greater in size (e.g., breadth or area) than the first hole H1. In another embodiment, the planarization layer 117 may be provided to cover the edge of the first hole H1 of the inorganic insulating layer IIL, and thus, the area of the second hole H2 may be less than the area of the first hole H1.

The planarization layer 117 includes a via hole exposing one of the first source electrode S1 and the first drain electrode D1 of the main thin-film transistor TFT. The first pixel electrode 121 may be connected (e.g., electrically connected) to of the main thin-film transistor TFT by contacting the first source electrode S1 or the first drain electrode D1 through the via hole. In addition, the planarization layer 117 includes a via hole exposing one of the second source electrode S2 and the second drain electrode D2 of the auxiliary thin-film transistor TFT'. The second pixel electrode 121' may be connected (e.g., electrically connected) to of the auxiliary thin-film transistor TFT' by contacting the second source electrode S2 or the second drain electrode D2 through the via hole.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As an example, the first pixel electrode 121 and the second pixel electrode 121' may each have a structure including ITO, IZO, ZnO, or $In_2O_3$ on/under the reflective layer. In this case, the first pixel electrode 121 and the second pixel electrode 121' may each have a stacked structure of ITO/Ag/ITO.

The pixel-defining layer 119 on the planarization layer 117 may cover the edges of each of the first pixel electrode 121 and the second pixel electrode 121', and include a first opening OP1 and a second opening OP2 respectively exposing the central portions of the first pixel electrode 121 and the second pixel electrode 121'. The emission areas of the organic light-emitting diodes (e.g., the main organic light-emitting diode OLED and the auxiliary organic light-emitting diode OLED) and the sizes and shapes of the sub-pixels (e.g., the main sub-pixel Pm and the auxiliary sub-pixel Pa) are defined by the first opening OP1 and the second opening OP2.

The pixel-defining layer 119 may prevent or substantially prevent an arc, etc. from occurring at the edges of the first pixel electrode 121 and the second pixel electrode 121' by increasing a distance between the edges of the first pixel electrode 121 and the second pixel electrode 121' and the opposite electrode 123 over the first pixel electrode 121 and the second pixel electrode 121'. The pixel-defining layer 119 may include an organic insulating material such as polyimide, polyamide, an acrylic resin, BCB, HMDSO, and/or a phenolic resin, and be formed through spin coating, etc.

The pixel-defining layer 119 may include a third hole H3 arranged in the transmission area TA. The third hole H3 may overlap (e.g., overlap in the z-direction or the thickness direction) the first hole H1 and the second hole H2. A light transmittance of the transmission area TA may be improved by the first hole H1 to the third hole H3 (i.e., the first hole H1, the second hole H2, and the third hole H3). Though it is shown in FIG. 14 that the buffer layer 111 is continuously arranged to correspond to the transmission area TA, the buffer layer 111 may include a hole arranged in the transmission area TA. A portion of the opposite electrode 123 may be arranged on the inner surfaces of the first hole H1 to the third hole H3.

A first emission layer 122b and a second emission layer 122b' may be arranged inside the first opening OP1 and the second opening OP2 of the pixel-defining layer 119, the first emission layer 122b and the second emission layer 122b' respectively corresponding to the first pixel electrode 121 and the second pixel electrode 121'. The first emission layer 122b and the second emission layer 122b' may include a polymer material or a low-molecular weight material and emit red light, green light, blue light, or white light.

An organic functional layer 122e may be arranged on and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged under the first emission layer 122b and the second emission layer 122b'. The first functional layer 122a may include a single layer or a multi-layer structure including organic materials. The first functional layer 122a may be a hole transport layer (HTL), which has a single-layer structure. Alternatively, the first functional layer 122a may include a hole injection layer (HIL) and a hole transport layer (HTL). The first functional layer 122a may be formed as one body to correspond to the organic light-emitting diodes (e.g., the main organic light-emitting diode OLED in the main display area MDA and the auxiliary organic light-emitting diode OLED' in the component area CA).

The second functional layer 122c may be arranged on the first emission layer 122b and the second emission layer 122b'. The second functional layer 122c may include a single layer or a multi-layer structure including organic materials. The second functional layer 122c may include an electron transport layer (ETL) and/or an electron injection layer (EIL). The second functional layer 122c may be formed as one body to correspond to the organic light-emitting diodes (e.g., the main organic light-emitting diode OLED in the main display area MDA and the auxiliary organic light-emitting diode OLED' in the component area CA).

The opposite electrode 123 is arranged on the second functional layer 122c. The opposite electrode 123 may include a conductive material having a low work function. As an example, the opposite electrode 123 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 123 may further include a layer on the (semi) transparent layer including the above materials, the layer including ITO, IZO, ZnO, or $In_2O_3$. The opposite electrode 123 may be formed as one body to correspond to the organic light-emitting diodes (e.g., the main organic light-emitting diode OLED in the main display area MDA and the auxiliary organic light-emitting diode OLED' in the component area CA).

The layers from the first pixel electrode 121 to the opposite electrode 123 in the main display area MDA may constitute the main organic light-emitting diode OLED. The layers from the second pixel electrode 121' to the opposite electrode 123 in the component area CA may constitute the auxiliary organic light-emitting diode OLED'.

An upper layer 150 may be formed on the opposite electrode 123. The upper layer 150 may include an organic material. The upper layer 150 may be a layer prepared or located to protect the opposite electrode 123 and increase a light-extraction efficiency. The upper layer 150 may include an organic material having a higher refractive index than the opposite electrode 123. Alternatively, the upper layer 150 may include layers having different refractive indexes that are stacked. As an example, the upper layer 150 may include a high refractive index layer/a low-refractive index layer/a high refractive index layer that are stacked. In this case, the refractive index of the high refractive index layer may be about 1.7 or more (e.g., be at least 1.7), and the refractive index of the low refractive index layer may be about 1.3 or less (e.g., be at most 1.3).

The upper layer 150 may additionally include LiF. Alternatively, the upper layer 150 may additionally include an inorganic insulating material such as silicon oxide ($SiO_2$) and/or silicon nitride ($SiN_x$).

The first functional layer 122a, the second functional layer 122c, the opposite electrode 123, and the upper layer 150 may each include a transmission hole TAH corresponding to the transmission area TA. That is, the first functional layer 122a, the second functional layer 122c, the opposite electrode 123, and the upper layer 150 may respectively include openings each corresponding to the transmission area TA. The areas of the openings may be substantially the same. As an example, the area of the opening of the opposite electrode 123 may be substantially the same as or equal to the area of the transmission hole TAH.

When the transmission hole TAH corresponds to the transmission area TA, it may be understood that the transmission hole TAH overlaps the transmission area TA. In this case, the area of the transmission hole TAH may be less than the area of the first hole H1 formed in the inorganic insulating layer IIL. For this purpose, as shown in FIG. 14, a width Wt of the transmission hole TAH is less than a width of the first hole H1. Here, the area of the transmission hole TAH may be defined as the area of an opening having a smallest area from among the openings constituting the transmission hole TAH. The area of the first hole H1 may be defined as the area of an opening having a smallest area from among openings constituting the first hole H1.

A portion of the opposite electrode 123 is removed from the transmission area TA by the transmission hole TAH, and thus, a light transmittance of the transmission area TA may be increased (e.g., remarkably increased). The opposite electrode 123 including the transmission hole TAH may be formed through various suitable methods. In an embodiment, the opposite electrode 123 including the transmission hole TAH may be formed by forming a material that constitutes the opposite electrode 123 on the entire surface of the substrate 100 and then removing a portion of the opposite electrode 123 corresponding the transmission area TA through laser-off. In another embodiment, the opposite electrode 123 having the transmission hole TAH may be formed through metal-self patterning. In another embodiment, the opposite electrode 123 having the transmission hole TAH may be formed through depositing the opposite electrode 123 by using a fine metal mask (FMM).

Figure 15:
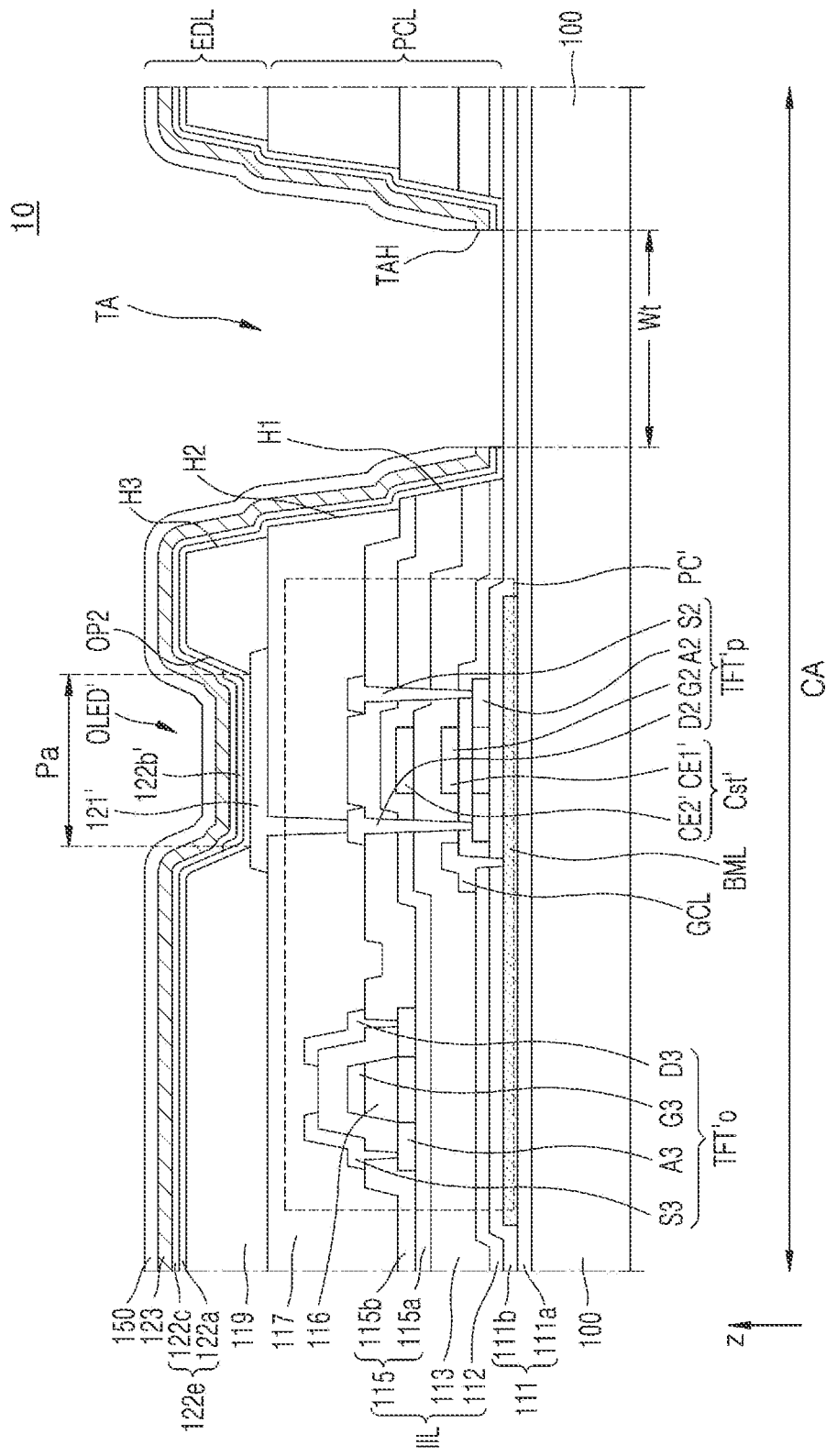
FIG. 15 is a cross-sectional view of a portion of a display panel according to another embodiment.

FIG. 15 is a cross-sectional view of a portion of the display panel 10 according to another embodiment. In FIG. 15, the same reference numerals as those of FIG. 14 denote the same elements, and thus, descriptions thereof may not be repeated.

Referring to FIG. 15, the embodiment of FIG. 15 is different from the embodiment of FIG. 14 in that the auxiliary pixel circuit PC' of the display panel 10 includes a thin-film transistor including an oxide semiconductor and a thin-film transistor including polycrystalline silicon. Though FIG. 15 shows only the component area CA, the characteristic of the auxiliary pixel circuit PC' in the component area CA is equally applicable to the main pixel circuit PC in the main display area MDA.

In this case, the first auxiliary pixel circuit and the first auxiliary organic light-emitting diode as the first display element may be arranged in the first component area. The first auxiliary pixel circuit may include the first auxiliary thin-film transistor and the first auxiliary storage capacitor, and the first auxiliary organic light-emitting diode may be connected to the first auxiliary pixel circuit. In addition, the second auxiliary pixel circuit and the second auxiliary organic light-emitting diode as the second display element may be arranged in the second component area. The second auxiliary pixel circuit may include the second thin-film transistor and the second auxiliary storage capacitor, and the second auxiliary organic light-emitting diode may be connected to the second auxiliary pixel circuit. In this case, the first auxiliary pixel circuit including the first auxiliary thin-film transistor and the first auxiliary storage capacitor, and the first auxiliary organic light-emitting diode as the first display element connected to the first auxiliary pixel circuit are the same as or similar to the second auxiliary pixel circuit including the second thin-film transistor and the second auxiliary storage capacitor, and the second auxiliary organic light-emitting diode as the second display element connected to the second auxiliary pixel circuit. Accordingly, thereinafter, for convenience of description, the component area CA shown in FIG. 15 is described in more detail.

Referring to FIG. 15, the pixel circuit PC' of the display panel 10 may include a first thin-film transistor TFT'p and a second thin-film transistor TFT'o, the first thin-film transistor TFT'p including the second semiconductor layer A2 that includes polycrystalline silicon, and the second thin-film transistor TFT'o including a third semiconductor layer A3 that includes an oxide semiconductor.

The first thin-film transistor TFT'p includes the second semiconductor layer A2, the second gate electrode G2, the second source electrode S2, and the second drain electrode D2. The first thin-film transistor TFT'p is substantially the same as the auxiliary thin-film transistor TFT' described with reference to FIG. 14. The second semiconductor layer A2 of the first thin-film transistor TFT'p may include polycrystalline silicon.

The circuit layer PCL of the illustrated embodiment is different from the circuit layer PCL of FIG. 14 in that the interlayer insulating layer 115 includes a first interlayer insulating layer 115a and a second interlayer insulating layer 115b.

The second thin-film transistor TFT'o may include the third semiconductor layer A3, a third gate electrode G3, a third source electrode S3, and a third drain electrode D3. The third semiconductor layer A3 may be arranged on the first interlayer insulating layer 115a. That is, the second semiconductor layer A3 may be arranged on a layer different from the second semiconductor layer A2. The third semiconductor layer A3 may include a channel region, a source region, and a drain region. The source region and the drain region may be arranged at respective sides (e.g., opposite sides) of the channel region. In an embodiment, the third semiconductor layer A3 may include an oxide semiconductor. For example, the third semiconductor layer A3 may include Zn-oxide-based material and include Zn-oxide, In—Zn oxide, and Ga—In—Zn oxide. Alternatively, the third semiconductor layer A3 may include In—Ga—Zn—O (IGZO), In—Sn—Zn—O (ITZO), or In—Ga—Sn—Zn—O (IGTZO) semiconductor containing metal, such as indium (In), gallium (Ga), and/or stannum (Sn), in ZnO.

The source region and the drain region of the third semiconductor layer A3 may be formed by adjusting carrier concentration of an oxide semiconductor and making the source region and the drain region conductive. For example, the source region and the drain region of the third semiconductor layer A3 may be formed by increasing carrier concentration through plasma treatment that uses a hydrogen (H)-based gas, a fluorine (F)-based gas, or a combination of these performed on the oxide semiconductor.

A third gate electrode G3 overlaps a channel region of the third semiconductor layer A3. A third gate insulating layer 116 may be arranged between the third semiconductor layer A3 and the third gate electrode G3. That is, the third gate electrode G3 may be insulated from the third semiconductor layer A3 by the third gate insulating layer 116. The third gate insulting layer 116 may be patterned along the shape of the third gate electrode G3.

The third gate insulating layer 116 may include an inorganic material including oxide or nitride. As an example, the third gate insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third gate electrode G3 may be arranged on the third gate insulating layer 116, may include at least one of molybdenum (Mo), copper (Cu), or titanium (Ti) and include a single layer or a multi-layer structure.

The second interlayer insulating layer 115b may cover the third gate electrode G3 of a third thin-film transistor TFT3 and be arranged over the top surface of the substrate 100. The third source electrode S3 and the third drain electrode D3 may be arranged on the second interlayer insulating layer 115b.

The third source electrode S3 and the third drain electrode D3 may respectively contact the source region and the drain region of the third semiconductor layer A3 through contact holes passing through the second interlayer insulating layer 115b. The third source electrode S3 and the third drain electrode D3 may include a conductive material including molybdenum (Mo), aluminum (Al), copper (Cu), and titanium (Ti) and include a single layer or a multi-layer structure including the above materials.

A thin-film transistor including a semiconductor layer including polycrystalline silicon has high reliability, and thus, a high-quality display panel may be implemented by employing a thin-film transistor including a semiconductor layer including polycrystalline silicon as a driving thin-film transistor.

An oxide semiconductor has high carrier mobility and a low leakage current, and thus, a voltage drop is not large even though a driving time is long. That is, a color change of an image according to a voltage drop is not large even during low-frequency driving, and thus, low-frequency driving may be performed. The oxide semiconductor has an advantage of a small leakage current, and thus, a leakage current may be prevented or substantially prevented and power consumption may be reduced by employing an oxide semiconductor as at least one of other thin-film transistors in addition to the driving thin-film transistor.

Figure 16:
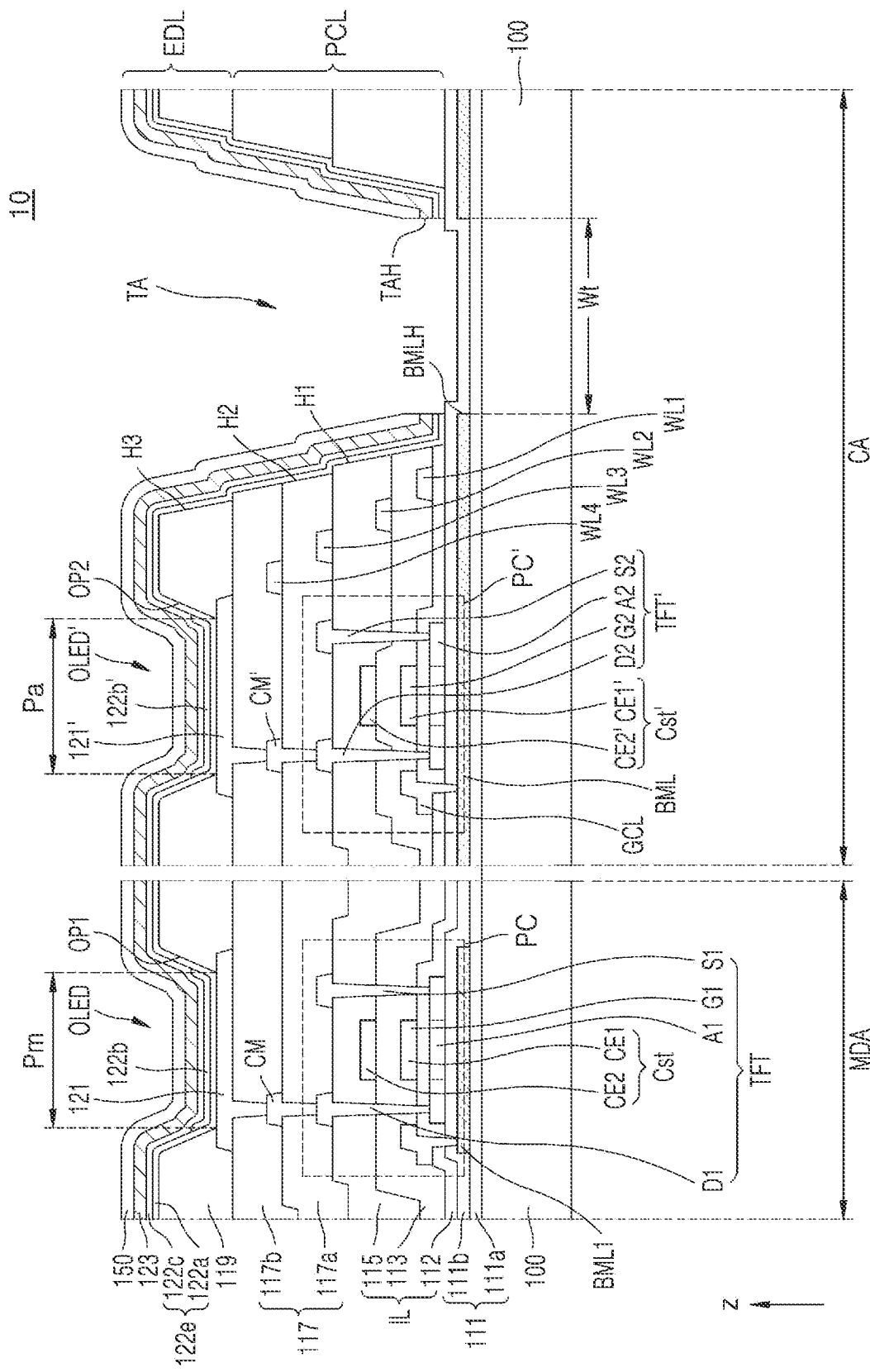
FIG. 16 is a cross-sectional view of a portion of a display panel according to another embodiment.

FIG. 16 is a cross-sectional view of a portion of the display panel 10 according to another embodiment. In FIG. 16, the same reference numerals as those of FIG. 14 denote the same elements, and thus, descriptions thereof may not be repeated.

The embodiment of FIG. 16 is different from the embodiment of FIG. 14 in that the planarization layer 117 includes a first planarization layer 117a and a second planarization layer 117b, a first metal layer BML1 is arranged in the main display area MDA, and the transmission area TA is defined by the bottom-hole BMLH of the bottom metal layer BML.

In this case, the first auxiliary pixel circuit and the first auxiliary organic light-emitting diode as the first display element may be arranged in the first component area. The first auxiliary pixel circuit may include the first auxiliary thin-film transistor and the first auxiliary storage capacitor, and the first auxiliary organic light-emitting diode may be connected to the first auxiliary pixel circuit. In addition, the second auxiliary pixel circuit and the second auxiliary organic light-emitting diode as the second display element may be arranged in the second component area. The second auxiliary pixel circuit may include the second thin-film transistor and the second auxiliary storage capacitor, and the second auxiliary organic light-emitting diode may be connected to the second auxiliary pixel circuit. In this case, the first auxiliary pixel circuit including the first auxiliary thin-film transistor and the first auxiliary storage capacitor, and the first auxiliary organic light-emitting diode as the first display element connected to the first auxiliary pixel circuit are the same as or similar to the second auxiliary pixel circuit including the second thin-film transistor and the second auxiliary storage capacitor, and the second auxiliary organic light-emitting diode as the second display element connected to the second auxiliary pixel circuit. Accordingly, thereinafter, for convenience of description, the component area CA shown in FIG. 16 is described in more detail.

Referring to FIG. 16, the circuit layer PCL of the display panel 10 may include the first planarization layer 117a and the second planarization layer 117b. Accordingly, a conductive pattern such as a wiring may be formed between the first planarization layer 117a and the second planarization layer 117b, and thus, it enhances (or is advantageous in) high integration.

The first planarization layer 117a may be arranged to cover the pixel circuits (e.g., the main pixel circuit PC and the auxiliary pixel circuit PC'). The second planarization layer 117b may be arranged on the first planarization layer 117a and may have a flat top surface such that the pixel electrodes (e.g., the first pixel electrode 121 and the second pixel electrode 121') are formed flat. The first planarization layer 117a and the second planarization layer 117b may each include an organic material or an inorganic material and include a single-layer or multi-layer structure. The first planarization layer 117a and the second planarization layer 117b may each include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. The first planarization layer 117a and the second planarization layer 117b may each include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When forming the first planarization layer 117a and the second planarization layer 117b, to provide the flat top surface after forming the first planarization layer 117a and the second planarization layer 117b, chemical and mechanical polishing may be performed on the top surface of the first planarization layer 117a and the second planarization layer 117b.

The organic light-emitting diodes (e.g., the main organic light-emitting diode OLED and the auxiliary organic light-emitting diode OLED) may be arranged on the second planarization layer 117b. The pixel electrodes (e.g., the first pixel electrode 121 and the second pixel electrode 121') of the organic light-emitting diodes (e.g., the main organic light-emitting diode OLED and the auxiliary organic light-emitting diode OLED') may be connected to the pixel circuits (e.g., the main pixel circuit PC and the auxiliary pixel circuit PC') through connection metals CM and CM'.

The connection metals CM and CM' may be arranged between the first planarization layer 117a and the second planarization layer 117b. The connection metals CM and CM' may include a conductive material including molybdenum (Mo), copper (Cu), and/or titanium (Ti) and include a single layer or a multi-layer structure including the above materials. As an example, the connection metals CM and CM' may have a multi-layer structure of Ti/Al/Ti.

The display panel 10 may include the first metal layer BML1 arranged in the main display area MDA. The first metal layer BML1 may be arranged to correspond to the main thin-film transistor TFT of the main display area MDA between the substrate 100 and the main pixel circuit PC. In an embodiment, the first metal layer BML1 may be arranged to correspond to a portion of the main display area MDA. Alternatively, the first metal layer BML1 may be arranged to correspond to the entire main display area MDA. Alternatively, the first metal layer BML1 may be formed as one body with the bottom metal layer BML of the component area CA. A constant voltage or signal may be applied to the first metal layer BML1, and thus, damage to the main pixel circuit PC due to electrostatic discharge may be prevented or substantially prevent.

The first metal layer BML1 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The first metal layer BML1 may include a single layer or a multi-layer structure including the above materials.

The bottom metal layer BML of the component area CA may correspond to the entire component area CA. In this case, the bottom metal layer BML may include the bottom-hole BMLH overlapping the transmission area TA. In an embodiment, the shape and size of the transmission area TA may be defined by the shape and size of the bottom-hole BMLH.

The display panel 10 may include first to fourth wirings (i.e., a first wiring WL1, a second wiring WL2, a third wiring WL3, and a fourth wiring WL4) arranged on different layers.

The first wiring WL1 may be arranged in a layer on the first gate insulating layer 112 to serve as a scan line configured to transfer a scan signal to the pixel circuits PC and PC'. The first wiring WL1 may be formed or arranged on or at the same layer as the gate electrodes G1 and G2. Alternatively, the first wiring WL1 may serve as an emission control line.

The second wiring WL2 may be arranged in a layer on the second gate insulating layer 113 to serve as a scan line SL and/or an emission control line EL. The second wiring WL2 may be arranged may be formed or arranged on or at the same layer as the top electrodes CE2 and CE2' of the storage capacitors Cst and Cst'.

The third wiring WL3 may be arranged on the interlayer insulating layer 115 to serve as a data line DL configured to transfer a data signal to the pixel circuits PC and PC'. Alternatively, the third wiring WL3 may serve as a driving voltage line configured to transfer a driving voltage to the pixel circuit.

The fourth wiring WL4 may be arranged in a layer on the first planarization layer 117a (e.g., the fourth wiring WL4 may be arranged between the first planarization layer 117a and the second planarization layer 117b) to serve as a driving voltage line configured to transfer the driving voltage to the pixel circuit or the data line configured to transfer a data signal to the pixel circuit. The fourth wiring WL4 may be arranged at or on the same layer as the connection metals CM and CM'.

The first to fourth wirings WL1, WL2, WL3, and WL4 may include a conductive material including molybdenum (Mo), aluminum (Al), copper (Cu), and/or titanium (Ti) and include a single layer or a multi-layer structure including the above materials. Alternatively, the first to fourth wirings WL1, WL2, WL3, and WL4 may include a transparent conductive material. The first to fourth wirings WL1, WL2, WL3, and WL4 may include the same material as each other or include different materials from each other.

Figure 17:
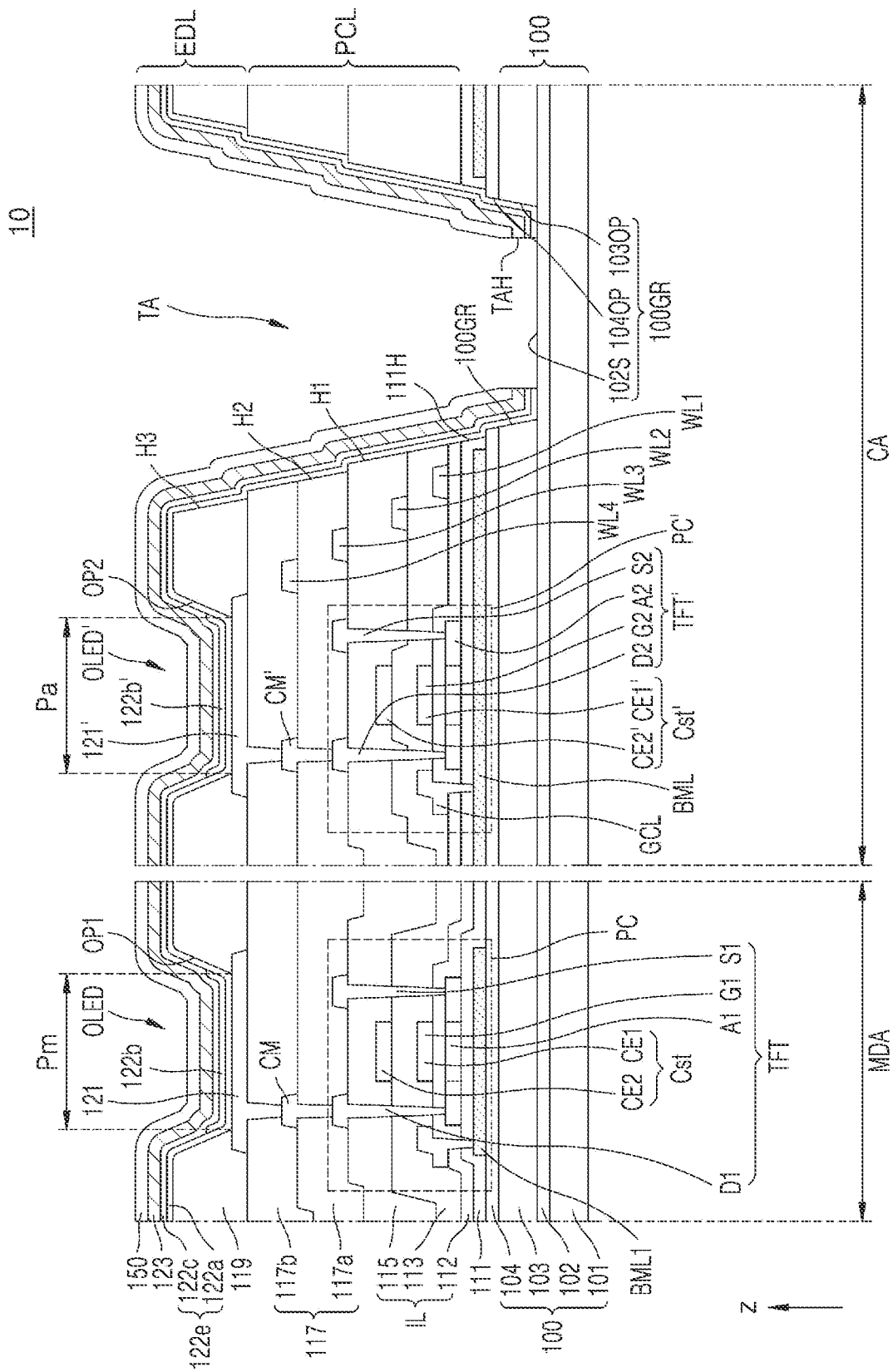
FIG. 17 is a cross-sectional view of a portion of a display panel according to another embodiment.

FIG. 17 is a cross-sectional view of a portion of the display panel 10 according to another embodiment.

Referring to FIG. 17, the substrate 100 of the display panel 10 may include a first barrier layer 101, a first inorganic barrier layer 102, a second base layer 103, and a second inorganic barrier layer 104. The first base layer 101 and the second base layer 103 may each include the above polymer resin. The first inorganic barrier layer 102 and the second inorganic barrier layer 104 may each be barrier layers configured to prevent or substantially prevent the penetration of impurities from the outside. In an embodiment, the first inorganic barrier layer 102 and the second inorganic barrier layer 104 may each include an inorganic material such as silicon oxide ($SiO_2$), silicon nitride ($SiN_x$), and/or silicon oxynitride (SiON) and include a single-layer or multi-layer structure.

In the illustrated embodiment, the substrate 100 may include a groove 100GR corresponding to the transmission area TA. The groove 100GR may denote a region in which a portion of the substrate 100 is removed in a downward direction (e.g., a (−) z-direction) and a portion of the substrate 100 remains. As an example, the first base layer 101 and the first inorganic barrier layer 102 may be continuous over the transmission area TA. In addition, the second base layer 103 and the second inorganic barrier layer 104 may respectively include openings 1030P and 1040P each corresponding to the transmission area TA. With this configuration, the substrate 100 may include the groove 100GR. That is, the groove 100GR of the substrate 100 may include an opening 1040P of the second inorganic barrier layer 104, an opening 1030P of the second base layer 103, and a top surface 102S of the first inorganic barrier layer 102 exposed by the openings 1040P and 1030P.

The substrate 100 may include the groove 100GR in various suitable shapes. As an example, a portion (the (+) z-direction) of the top surface of the first inorganic barrier layer 102 may be removed. Unlike this, the bottom (the (−) z-direction) of the second base layer 103 may remain without being removed. The thickness of the substrate 100 in the transmission area TA may be reduced by the groove 100GR (e.g., the depth of the groove 100GR in the thickness direction) of the substrate 100. Through this configuration, a light transmittance of the transmission area TA may be increased (e.g., remarkably increased). In addition, in the illustrated embodiment, the buffer layer 111 may also include a buffer hole 111H corresponding to the transmission area TA.

In the above embodiments, the buffer hole 111H, the first to third holes (i.e., a first hole H1, a second hole H2, and a third hole H3), and/or the groove formed in the substrate 100 may increase the light transmittance of the transmission area TA. Though the buffer hole 111H and the first to third holes H1, H2, and H3 are respectively formed in the buffer layer 111, the inorganic insulating layer IIL, the planarization layer 117, and the pixel-defining layer 119 corresponding to the transmission area TA as an example, the present disclosure is not limited thereto.

For example, the substrate 100, the buffer layer 111, the inorganic insulating layer IIL, the planarization layer 117, and the pixel-defining layer 119 of the display panel 10 may each include a material having high light-transmittance, and thus, the buffer hole 111H and the first to third holes H1, H2, and H3 may not be provided depending on the kind of the component 40 (e.g., see FIG. 2) arranged below the component area CA.

The display panel 10 may include the main display area MDA and the component area CA. In this case, the component area CA may be the same as or similar to that described above.

FIGS. 18A-18D are cross-sectional views of a portion of the display panel 10 according to another embodiment. FIGS. 18A-18D shows a portion of the component area CA of the display panel 10.

Figure 18A:
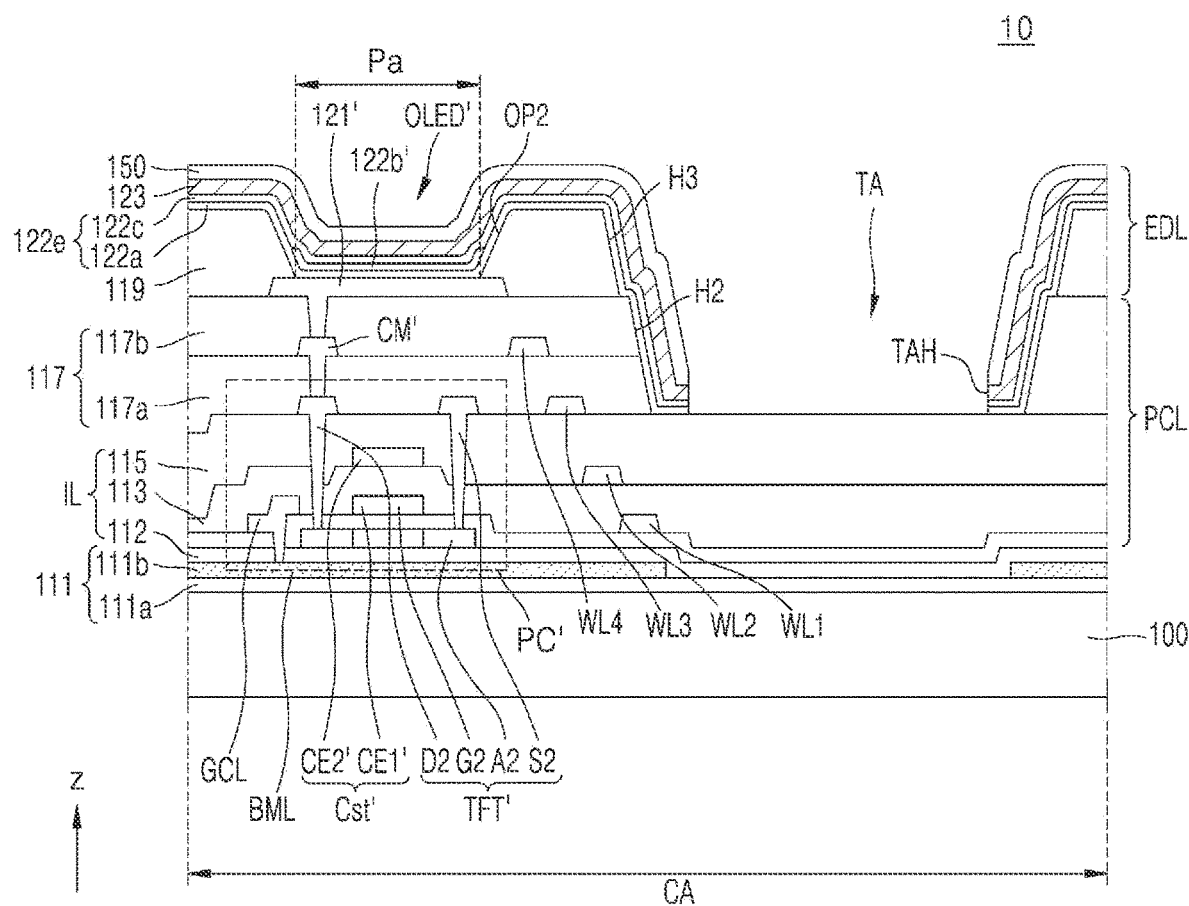
FIG. 18A is a cross-sectional view of a portion of a display panel according to another embodiment.

Referring to FIG. 18A, the inorganic insulating layer IIL may be continuously arranged to correspond to the transmission area TA. Alternatively, at least one of the first gate insulating layer 112, the second gate insulating layer 113, or the interlayer insulating layer 115 of the inorganic insulating layer IIL may be continuously arranged to correspond to the transmission area TA. The planarization layer 117 and the pixel-defining layer 119 may respectively include the second hole H2 and the third hole H3 each exposing the top surface of the inorganic insulating layer IIL corresponding to the transmission area TA.

Figure 18B:
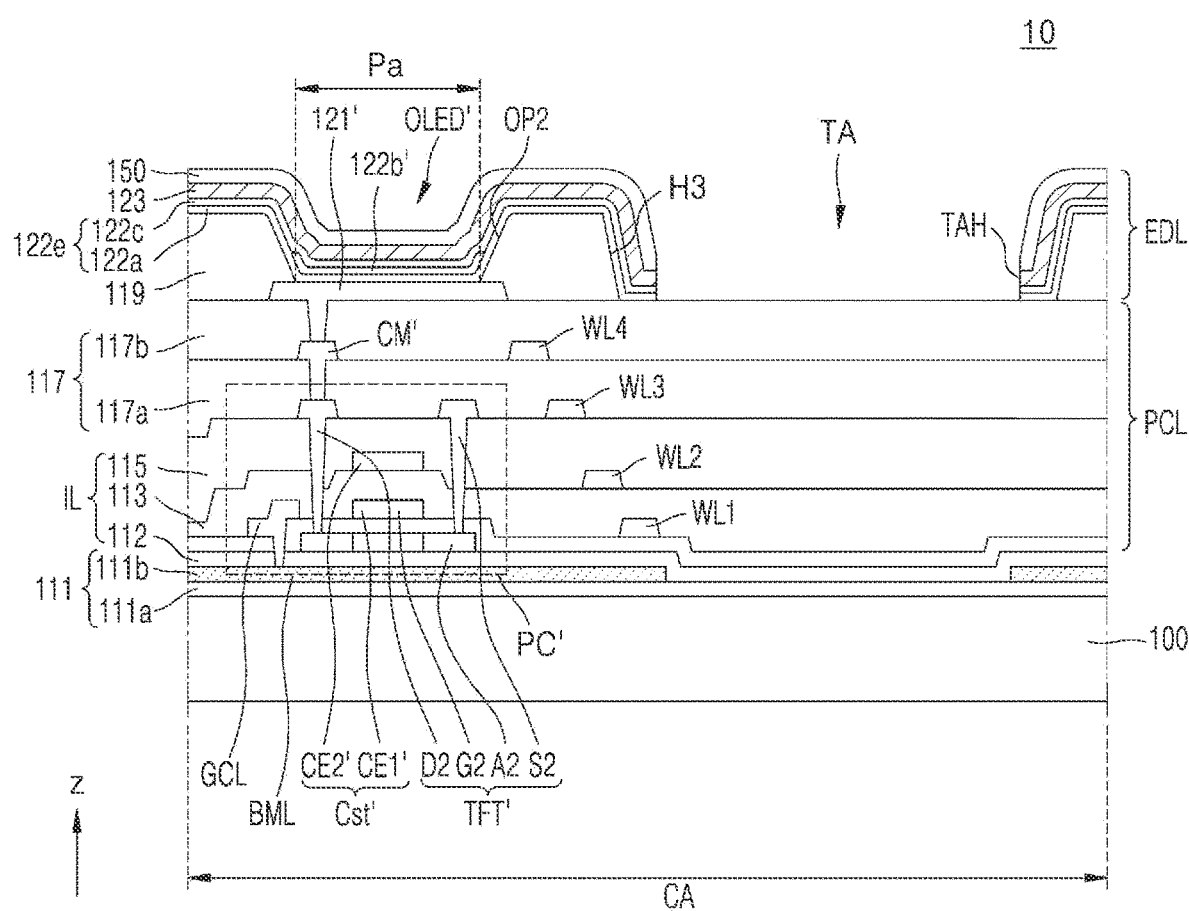
FIG. 18B is a cross-sectional view of a portion of a display panel according to another embodiment.

Referring to FIG. 18B, the inorganic insulating layer IL and the planarization layer 117 may be continuously arranged to correspond to the transmission area TA. The pixel-defining layer 119 may include the third hole H3 that exposes the top surface of the inorganic insulating layer IIL corresponding to the transmission area TA. In an embodiment, the pixel-defining layer 119 may be also continuously arranged to correspond to the transmission area TA.

Figure 18C:
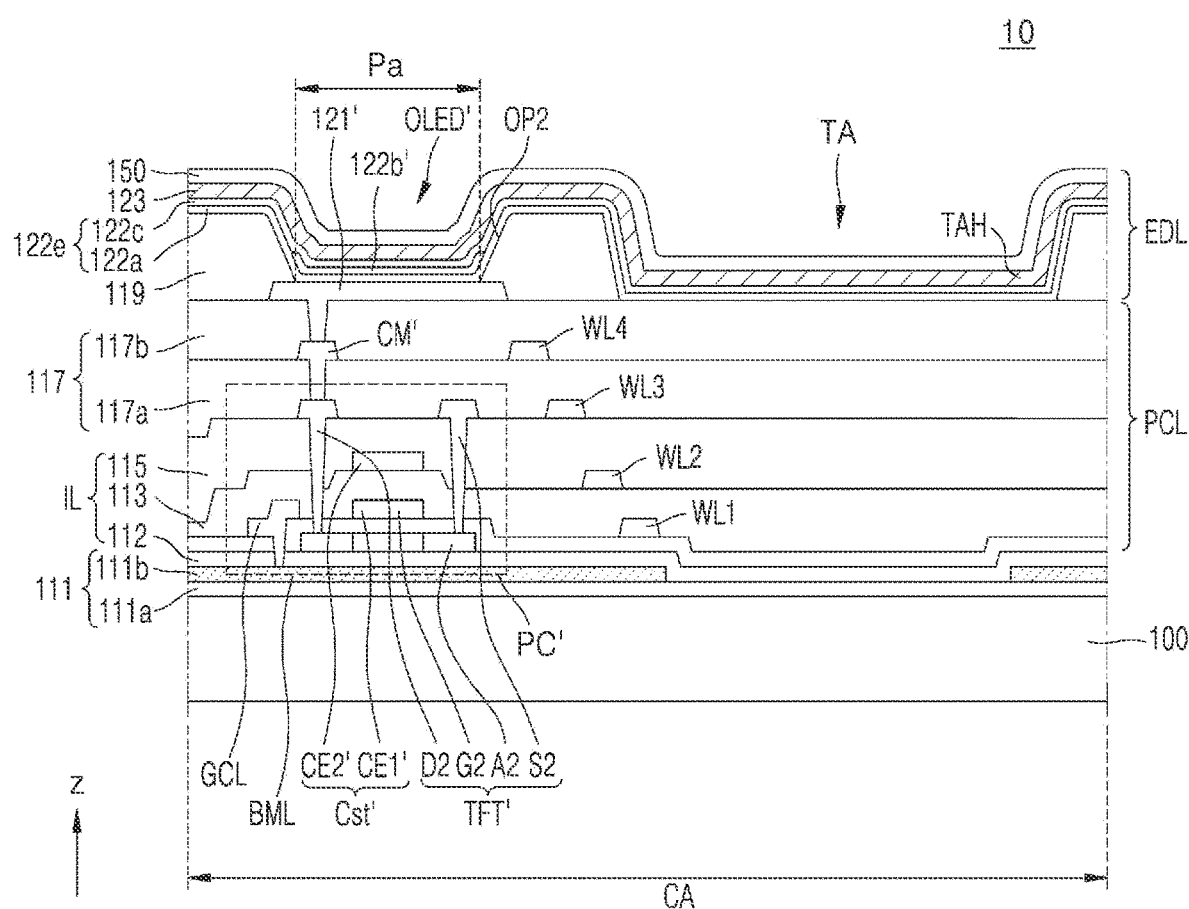
FIG. 18C is a cross-sectional view of a portion of a display panel according to another embodiment.

Referring to FIG. 18C, the opposite electrode 123 may be continuously arranged to correspond to the transmission area TA. In addition, the opposite electrode 123 may include a material having a high light-transmittance, and thus, even though the opposite electrode 123 does not include a transmission hole corresponding to the transmission area TA, the transmission area TA may have a set or preset light transmittance.

Figure 18D:
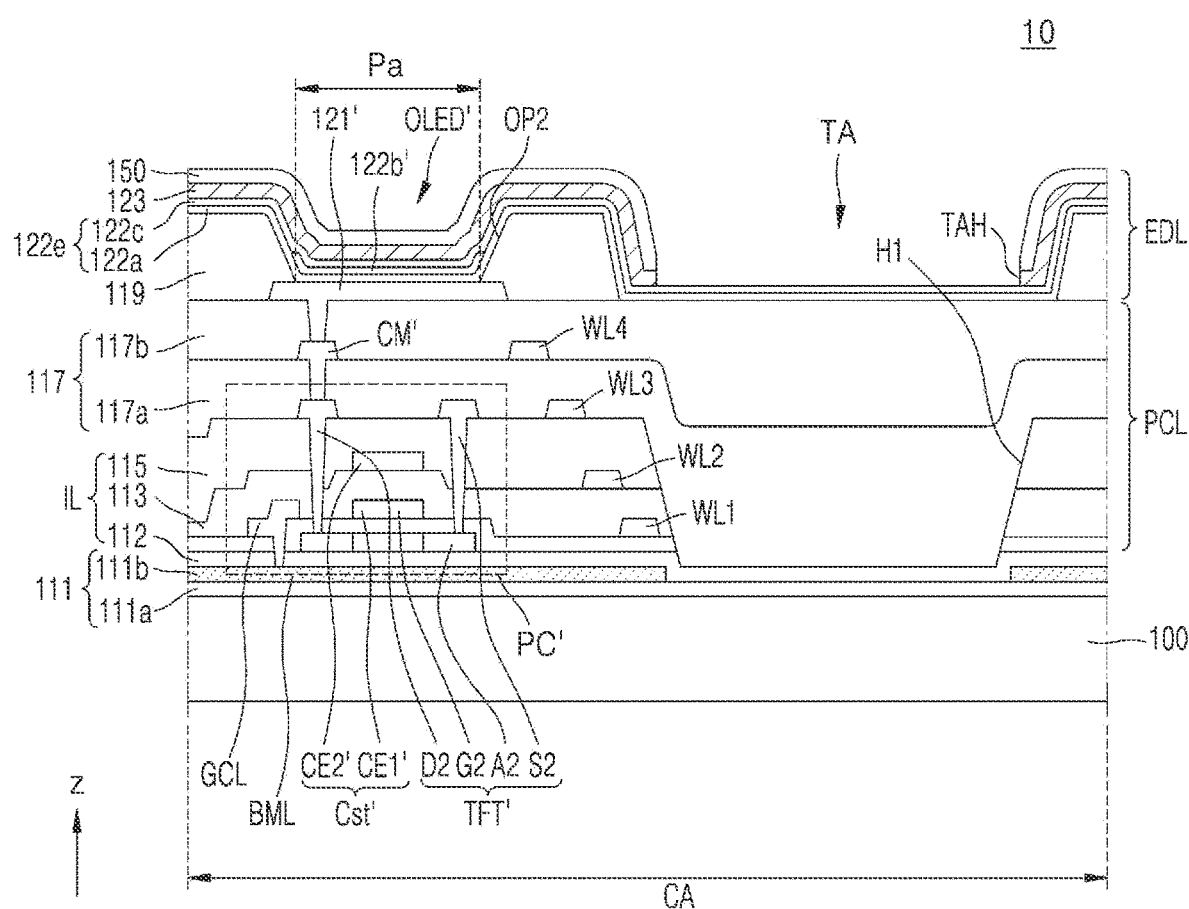
FIG. 18D is a cross-sectional view of a portion of a display panel according to another embodiment.

Referring to FIG. 18D, the inorganic insulating layer IIL may include the first hole H1 corresponding to the transmission area TA. The first planarization layer 117a and the second planarization layer 117b may fill the inside of the first hole H1. In an embodiment, the first planarization layer 117a and the second planarization layer 117b may include a transparent organic material having a refractive index similar to the refractive index of the substrate 100 and the buffer layer 111. As an example, the first planarization layer 117a and the second planarization layer 117b may include a siloxane-based organic material having a high light-transmittance. The siloxane-based organic material may include hexamethyldisiloxane, octamethyltrisiloxane, decamethyltetrasiloxane, dodecamethylpentasiloxane, and/or polydimethylsiloxanes.

The planarization layer 117 having a refractive index similar to the refractive index of the substrate 100 and the buffer layer 111 is arranged to correspond to the transmission area TA, and thus, a loss of a light transmittance due to a refractive index difference may be reduced.

The display panel 10 may include the main display area and the component area CA. In this case, the main display area may be the same as or similar to that described above. In addition, the component area CA may be the same as or similar to that described above.

Figure 19:
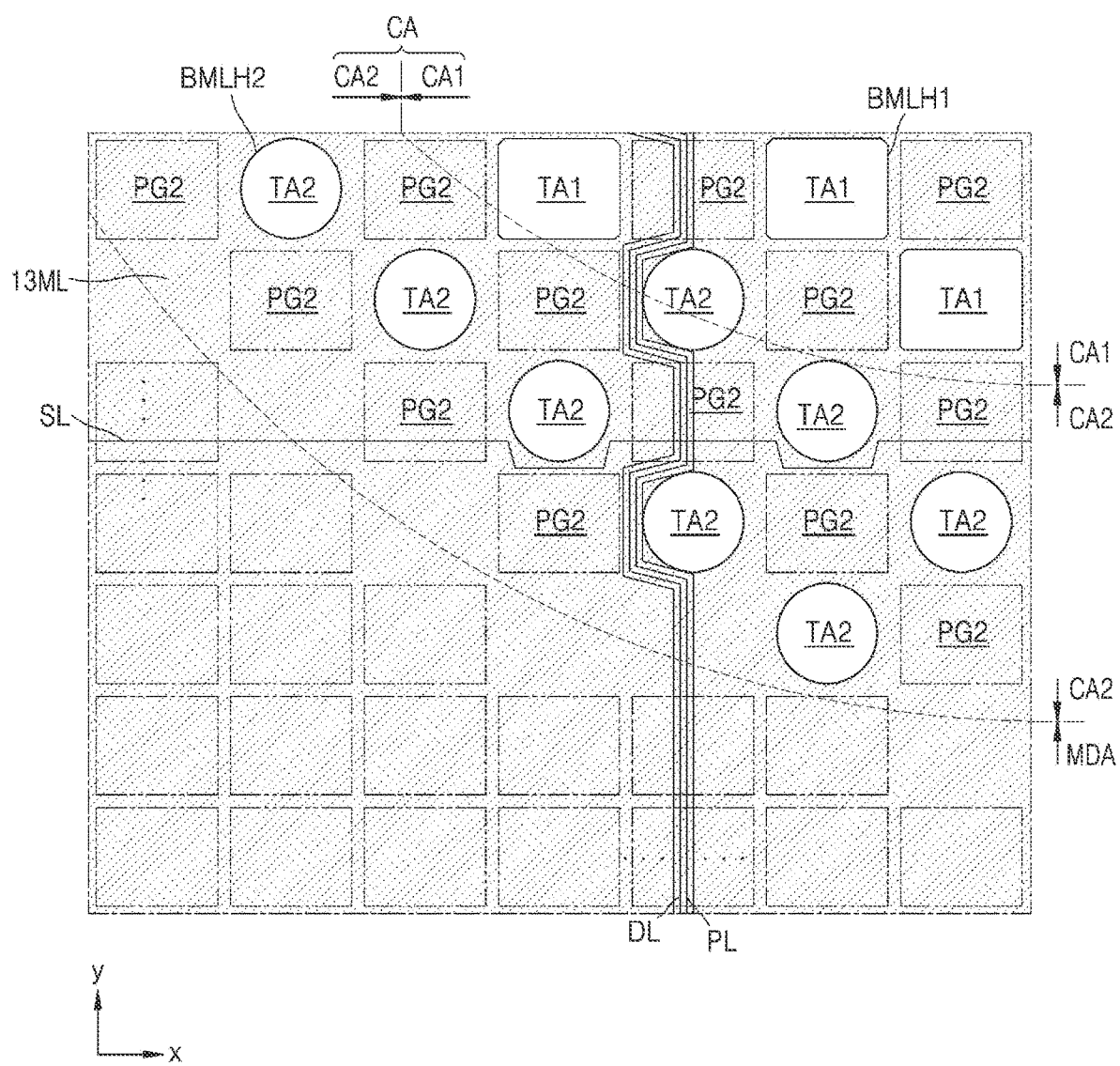
FIG. 19 is a plan view of an arrangement relationship of sub-pixels and wirings of a display panel according to an embodiment.

FIG. 19 is a plan view of an arrangement relationship of sub-pixels and wirings of the display panel 10 according to an embodiment.

Referring to FIG. 19, the scan line SL may extend in the x-direction to transfer scan signals to the pixel circuits of the main sub-pixels in a main pixel group PGM, first pixel circuits of the first auxiliary sub-pixels in the first pixel group PG1, and second pixel circuits of the second auxiliary sub-pixels in the second pixel group PG2. The data line may extend in the y-direction to transfer data signals to the pixel circuits of the main sub-pixels, the first pixel circuits of the first auxiliary sub-pixels, and the second pixel circuits of the second auxiliary sub-pixels.

The scan line may include a plurality of scan lines. In this case, some of the plurality of scan lines may extend in the x-direction, connect (e.g., electrically connect) the pixel circuits of the main sub-pixels arranged on the same row inside the main display area MDA, may not be connected to the first pixel circuits of the first auxiliary sub-pixels and the second pixel circuits of the second auxiliary sub-pixels, and may avoid the first transmission area TA1 of the first component area CA1 and the second transmission area TA2 of the second component area CA2. Other ones of the plurality of scan lines may extend in the x-direction to connect (e.g., electrically connect) the pixel circuits of the main sub-pixels and the pixel circuits of the auxiliary sub-pixels arranged on the same row in the main display area MDA and the component area CA.

The display panel may include a plurality of wirings crossing in the y-direction. In this case, the plurality of wirings may be various suitable kinds. As an example, the plurality of wirings may all be data lines. In another embodiment, some of the plurality of wirings may be data lines, and others may be driving voltage lines. Hereinafter, for convenience of description, the case where the plurality of wirings are all data lines is described in more detail below.

The data line DL may include a first data line DL1 and a second data line DL2. The first data line DL1 extends in the approximately y-direction to connect (e.g., electrically connect) the pixel circuits of the main sub-pixels Pm arranged on the same column in the main display area MDA, avoids the transmission area TA of the component area CA, and extends to the peripheral area DPA. The end of the first data line DL1 may be arranged in the edge of the upper end of the component area CA or the peripheral area.

The second data lines DL2 may extend in the y-direction to connect (e.g., electrically connect) the pixel circuits of the main sub-pixels Pm arranged on the same column to the pixel circuits of the auxiliary sub-pixels Pa in the main display area MDA and the component area CA.

The data line DL may be arranged on a layer different from the scan line. In an embodiment, the scan line may be arranged on the same layer as the first wiring WL1 (e.g., see FIG. 16) or the second wiring WL2. The data line D may be arranged on the same layer as the third wiring WL3 or the fourth wiring WL4.

In the illustrated embodiment, the end of the second data line DL2 may be arranged on the same line as the end of the first data line DL1. As an example, the second data lines DL2 may be arranged on the edge of the component area CA or the peripheral area DPA. This is intended to make an electric load of the second data line DL2 be at the same level as an electric load of the first data line DL1.

In the illustrated embodiment, the scan lines and the data lines may each include a transparent conductive material. As an example, the scan line and the data lines DL may each include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The wirings arranged in the transmission area TA include a transparent conductive material, and thus, a light transmittance of the transmission area TA may be maintained (e.g., maintained high).

In another embodiment, the scan lines and the data lines DL may include an opaque metal.

Figure 20:
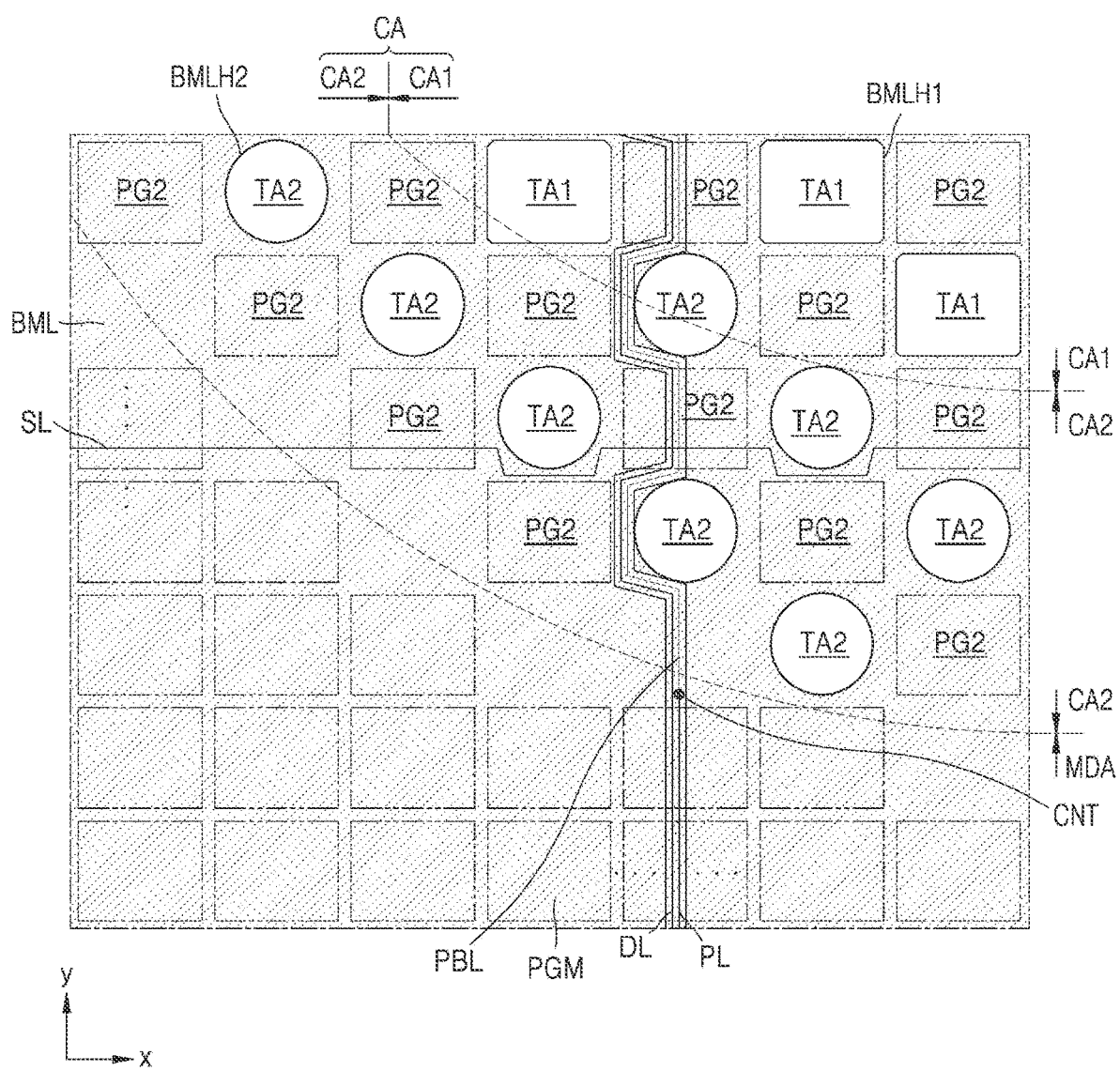
FIG. 20 is a plan view of an arrangement relationship of sub-pixels and wirings of a display panel according to an embodiment.

Though it is shown in FIG. 19 that the scan lines and the data lines DL are arranged continuously in the main display area MDA and the component area CA, the scan lines and the data lines may be connected to a scan bridge line and a data bridge line arranged on different layers through contact holes in a partial region as shown in FIG. 20.

The scan lines and the data lines DL arranged in the component area CA may avoid the transmission area TA and be biased on one side to increase a light transmittance of the component area CA. For this purpose, the scan lines and the data lines DL arranged in the component area CA may be appropriately or suitably bent.

In the case where an interval between wirings arranged in the component area CA narrows, diffraction of light may occur depending on the case. Accordingly, the bottom metal layer BML may overlap the wirings arranged in the component area CA as in FIG. 19. In an embodiment, the bottom metal layer BML may be arranged to correspond to the entire main display area MDA and the entire component area CA and may include the first bottom-hole BMLH1 and the second bottom-hole BMLH2 respectively corresponding to the first transmission area TA1 and the second transmission area TA2. The first bottom-hole BMLH1 and the second bottom-hole BMLH2 may be variously provided in a suitable manner as described above.

In the case where a black matrix is provided, the first transmission area TA1 and the second transmission area TA2 may be defined by using the black matrix instead of the bottom metal layer BML. Alternatively, in the case where both the black matrix and the bottom metal layer BML are provided, the first transmission area TA1 and the second transmission area TA2 may be defined through the black matrix and the bottom metal layer BML.

Figure 21:
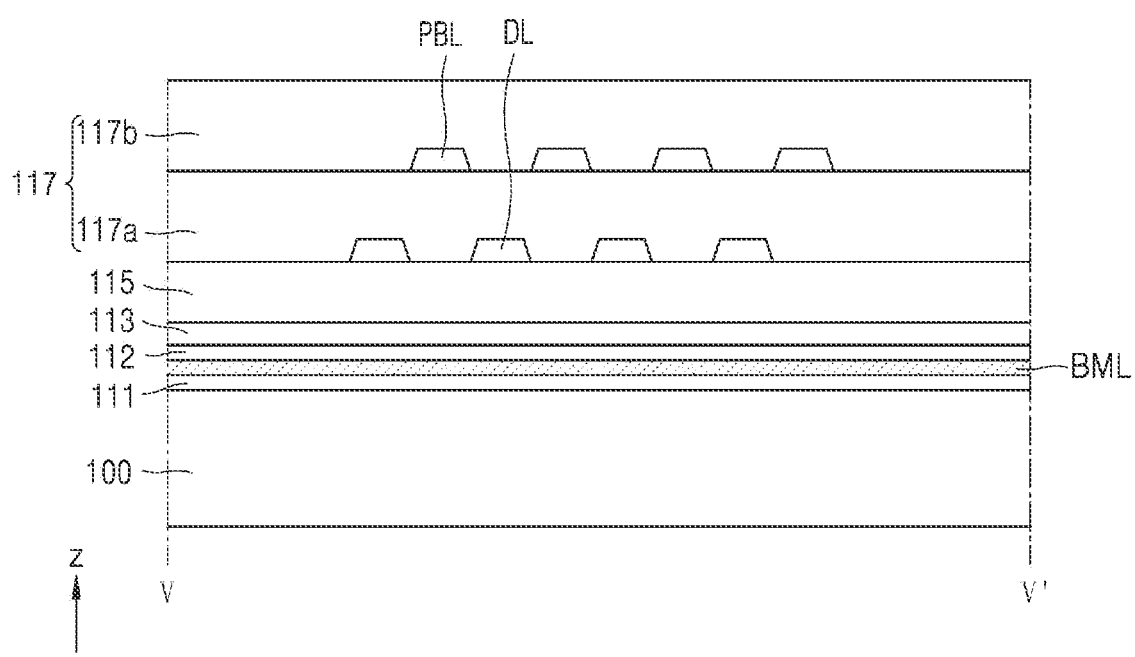
FIG. 21 is a cross-sectional view of sub-pixels and wirings, taken along the line V-V of FIG. 20.

FIG. 20 is a plan view of an arrangement relationship of sub-pixels and wirings of the display panel 10 according to an embodiment. FIG. 21 is a cross-sectional view of sub-pixels and wirings, taken along the line V-V of FIG. 20. In FIG. 20, the same reference numerals as those of FIG. 19 denote the same elements, and thus, descriptions thereof may not be repeated.

Referring to FIGS. 20 and 21, the display panel 10 may include a plurality of wirings crossing in the y-direction. In this case, the case where some of the plurality of wirings are data lines and a portion of the plurality of wirings is a driving voltage line is described in more detail below. The data lines DL may be continuously arranged from the main display area MDA to the component area CA, but the driving voltage line PL may be connected to a bridge line PBL through a contact hole CNT. The bridge line PBL may be arranged on a layer different from the driving voltage line PL in or at the edge of the component area CA. The data line DL may be arranged on the same layer as the driving voltage line PL.

The bridge lines PBL are arranged on a layer different from the data line DL, and thus, the bridge lines PBL may be adjacent to the data line DL or overlap the data line DL. As an example, as in FIG. 21, the bridge lines PBL and the data lines DL may be alternately arranged with each other in one direction. Alternatively, the bridge lines PBL may at least partially overlap the data lines DL.

With this configuration, the area occupied by the wirings in the component area CA may be reduced, and thus, the area of at least one of the first transmission area TA1, the second transmission area TA2, or the third transmission area TA3 may be relatively extended. Accordingly, a light transmittance of the component area CA may be improved.

In this case, the bottom metal layer BML may include the first bottom-hole BMLH1, the second bottom-hole BMLH2, and the third bottom-hole BMLH3 to define the first transmission area TA1, the second transmission area TA2, and the third transmission area TA3. In this case, the first bottom-hole BMLH1, the second bottom-hole BMLH2, and the third bottom-hole BMLH3 may be formed to respectively correspond to the first transmission area TA1, the second transmission area TA2, and the third transmission area TA3.

In the case where a black matrix is provided, the first transmission area TA1 and the second transmission area TA2 may be defined by using the black matrix instead of the bottom metal layer BML. Alternatively, in the case where both the black matrix and the bottom metal layer BML are provided, the first transmission area TA1 and the second transmission area TA2 may be defined through the black matrix and the bottom metal layer BML.

Figure 22:
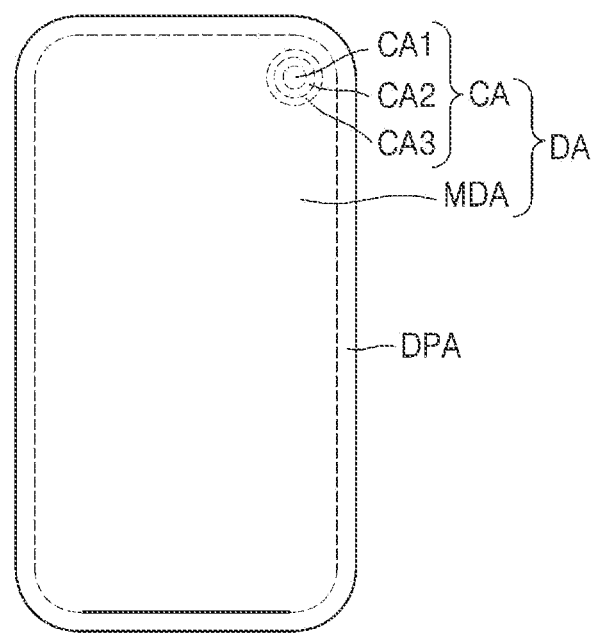
FIG. 22 is a plan view of a display panel according to another embodiment.
Figure 23:
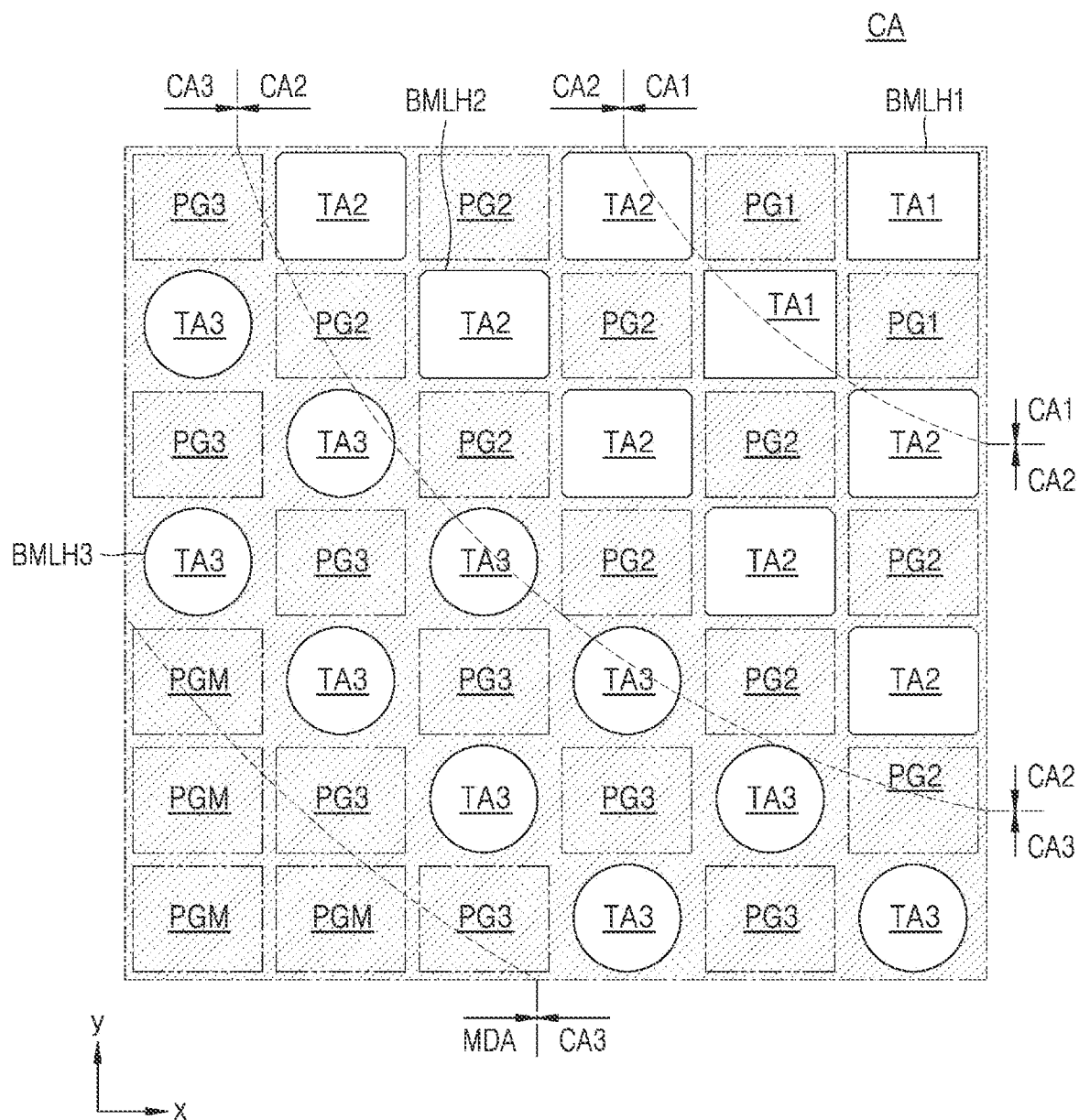
FIG. 23 is a plan view of a planar shape of transmission areas arranged in a first component area, a second component area, and a third component area shown in FIG. 22.

FIG. 22 is a plan view of the display panel 10 according to another embodiment. FIG. 23 is a plan view of a planar shape of transmission areas TA arranged in the first component area CA1, the second component area CA2, and the third component area CA3 shown in FIG. 22.

Referring to FIGS. 22 and 23, the display panel 10 includes the main display area MDA and the component area CA. In this case, the component area CA may include a plurality of component areas. As an example, the component area CA may include two or more component areas. In this case, one of the plurality of component areas CA may be arranged on the central portion of a component, another one of the plurality of component areas CA may be arranged outside one of the plurality of component areas CA, and another one of the plurality of component areas CA may be arranged outside the other one of the plurality of component areas CA. That is, one of the plurality of component areas CA may be arranged outside the other one of the plurality of component areas CA, and in a plan view, one of the plurality of component areas CA may be arranged inside the other one of the plurality of component areas CA. Hereinafter, for convenience of description, the case where the component area CA includes the first component area CA1, the second component area CA2, and the third component area CA3 is described in more detail below.

In this case, the first component area CA1 may be arranged on the central portion of the component area CA, the second component area CA2 may be arranged outside the first component area CA1, and the third component area CA3 may be arranged outside the second component area CA2. In this case, the peripheral area DPA or the main display area MDA may be arranged outside the third component area CA3.

A pixel group and a transmission group may be arranged in each of the first component area CA1 to the third component area CA3. Auxiliary sub-pixels that are same as or similar to those described with reference to FIGS. 11A-11D may be arranged in the first pixel group PG1, the second pixel group PG2, and the third pixel group PG3.

The planar shapes of the first transmission area TA1, the second transmission area TA2, and the third transmission area TA3 may be different from one another. As an example, the planar shape of the first transmission area TA1 may include an angled edge (or corner).

In this case, the planar shape of the first transmission area TA1 may be various suitable shapes. As an example, the planar shape of the first transmission area TA1 may include a cross shape, a polygonal shape, etc., and a shape in which a portion thereof is concave and a portion thereof protrudes.

The planar shape of the second transmission area TA2 may include more angled edges compared to the planar shape of the first transmission area TA1, or include an elliptical shape. The second transmission area TA2 is variable in a shape closer to a circle than the first transmission area TA1. As an example, in the case where the planar shape of the first transmission area TA1 is a polygon having N vertexes (N is a natural number equal to or greater than 3), the planar shape of the second transmission area TA2 may be a polygon having (N+1) or more vertexes. In addition, in the case where the planar shape of the first transmission area TA1 includes a protruding portion and an indented portion, a planar shape of the second transmission area TA2 corresponding to the protruding portion of the planar shape of the transmission area TA1 may be indented, and a planar shape of the second transmission area TA2 corresponding to the indented portion of the planar shape of the transmission area TA1 may include a protruding shape. That is, the planar shape of the second transmission area TA2 may have a shape in which a periphery thereof approaches the periphery of an inscribed circle or circumscribed circle of the virtual first transmission area TA1 having the planar shape.

The planar shape of the third transmission area TA3 may be substantially circular. In the case where the second transmission area TA2 is a polygonal or has a shape having angled edges, the third transmission area TA3 may have an elliptical shape.

In the case where a plurality of transmission areas TA are provided, the planar shape of the transmission areas TA may be close to a circle toward the outer side of the component area CA from a portion of the component area CA corresponding to the center of the component. Particularly, the shape of the transmission area TA arranged in the portion of the component area CA corresponding to the center of the component may have angled edges from among the plurality of transmission areas TA. The planar shape of the transmission area TA arranged in the outermost portion of the component area CA may be substantially close to a circle or be a circle from among the plurality of transmission areas TA. In this case, the planar shape of the transmission area TA arranged between a portion of the component area CA corresponding to the center of the component and the outermost portion of the component area CA may gradually vary from the planar shape of the transmission area TA arranged in the portion of the component area CA corresponding to the center of the component, to the planar shape of the transmission area TA arranged the outermost portion of the component area CA. That is, the second transmission area TA2 may have a planar shape in which the planar shape of the first transmission area TA1 is mixed with the planar shape of the third transmission area TA3. In this case, the planar area of the first transmission area TA1, the planar area of the second transmission area TA2, and the planar area of the third transmission area TA3 may be different from one another. As an example, the planar area of the first transmission area TA1 may be less than the planar area of the second transmission area TA2. In addition, the planar area of the second transmission area TA2 may be less than the planar area of the third transmission area TA3. In another embodiment, the planar area of the first transmission area TA1 may be greater than the planar area of the second transmission area TA2. In addition, the planar area of the second transmission area TA2 may be greater than the planar area of the third transmission area TA3.

In this case, drastic distortion of data may be prevented or substantially prevent between the first component area CA1 and the third component area CA3 compared to the case where there is no second component area CA2.

Particularly, in the case where the component is a camera, a drastic difference in the image qualities of images corresponding to the first component area CA1 and the third component area CA3 may be prevented or substantially prevent, and thus, a natural image quality may be secured.

The display apparatus according to embodiments may collect data (e.g., accurate data) through a component.

In the case where a component is a camera, the display apparatus according to embodiments may obtain a distortion-free image with clearness.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
   a substrate;
   a component area arranged over the substrate, the component area comprising a first component area and a second component area, the first component area comprising a plurality of first pixel groups and a first transmission area arranged between the first pixel groups, the second component area comprising a plurality of second pixel groups and a second transmission area arranged between the second pixel groups, wherein the plurality of first pixel groups comprise first auxiliary display elements and first auxiliary pixel circuits respectively connected to the first auxiliary display elements, and wherein the plurality of second pixel groups comprise second auxiliary display elements and second auxiliary pixel circuits respectively connected to the second auxiliary display elements;
   a main display area arranged over the substrate, the main display area comprising main display elements and main pixel circuits respectively connected to the main display elements; and
   a component arranged in the component area,
   wherein a planar shape of the first transmission area is different from a planar shape of the second transmission area.

2. The display apparatus of claim 1, wherein the planar shape of the first transmission area comprises a corner.

3. The display apparatus of claim 1, wherein the planar shape of the second transmission area is circular or elliptical.

4. The display apparatus of claim 1, further comprising:
   a bottom metal layer arranged over the substrate, the bottom metal layer defining the first transmission area and the second transmission area.

5. The display apparatus of claim 4, wherein the bottom metal layer comprises holes corresponding to the first transmission area and the second transmission area.

6. The display apparatus of claim 1, wherein the first component area is arranged inside the second component area.

7. The display apparatus of claim 1, further comprising a wiring electrically connected to at least one of the first auxiliary pixel circuit or the second auxiliary pixel circuit.

8. The display apparatus of claim 7, wherein the wiring is arranged to avoid the first transmission area and the second transmission area.

9. The display apparatus of claim 1, further comprising an optical functional layer arranged over the substrate, the optical functional layer defining the plurality of first pixel groups, the plurality of second pixel groups, the first transmission area, and the second transmission area.

10. A display apparatus comprising:
    a substrate;
    a component area arranged over the substrate, the component area comprising a plurality of pixel groups and a plurality of areas, the plurality of pixel groups comprising auxiliary display elements and auxiliary pixel circuits respectively connected to the auxiliary display elements, wherein the plurality of areas comprise a plurality of transmission areas arranged between the pixel groups;

a main display area arranged over the substrate, the main display area comprising main display elements and main pixel circuits respectively connected to the main display elements; and a component arranged in the component area, wherein a shape of a transmission area from among the plurality of transmission areas is different from a shape of another transmission area from among the plurality of transmission areas.

11. The display apparatus of claim 10, wherein a planar shape of each transmission area from among the plurality of transmission areas is different depending on a distance from a center of the component.

12. The display apparatus of claim 11, wherein a planar shape of a transmission area arranged at the center of the component from among the plurality of transmission areas comprises a corner.

13. The display apparatus of claim 11, wherein a planar shape of a transmission area from among the plurality of transmission areas is polygonal, and wherein a planar shape of a transmission area arranged at an outermost portion of the component area from among the plurality of transmission areas is circular or elliptical.

14. The display apparatus of claim 13, wherein an edge of a planar shape of each transmission area increases toward an outermost portion of the component area from the center of the component.

15. The display apparatus of claim 10, further comprising a wiring electrically connected to the auxiliary pixel circuits.

16. The display apparatus of claim 15, wherein the wiring is arranged to avoid the plurality of transmission areas.

17. The display apparatus of claim 10, further comprising an optical functional layer arranged over the substrate, the optical functional layer defining the plurality of pixel groups and the plurality of transmission areas.

18. The display apparatus of claim 17, wherein the optical functional layer comprises:

a base layer;

a color filter arranged on the base layer; and a black matrix arranged in the color filter, the black matrix corresponding to a region between the plurality of pixel groups and the plurality of transmission areas.

19. The display apparatus of claim 10, wherein the plurality of transmission areas are different in area from each other at respective positions of the component area.

20. The display apparatus of claim 10, wherein the component comprises a camera.

* * * * *